(12) United States Patent
Pagnanelli

(10) Patent No.: US 9,209,829 B2
(45) Date of Patent: *Dec. 8, 2015

(54) SAMPLING/QUANTIZATION CONVERTERS

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/567,496

(22) Filed: Dec. 11, 2014

(65) Prior Publication Data

US 2015/0091745 A1    Apr. 2, 2015

Related U.S. Application Data

(63) Continuation-in-part of application No. 13/363,517, filed on Feb. 1, 2012, now Pat. No. 8,943,112, which is a continuation-in-part of application No. 12/985,214, filed on Jan. 5, 2011, now Pat. No. 8,416,111, and a (Continued)

(51) Int. Cl.
*H03M 3/00* (2006.01)

(52) U.S. Cl.
CPC .............. *H03M 3/468* (2013.01); *H03M 3/422* (2013.01); *H03M 3/436* (2013.01)

(58) Field of Classification Search
CPC ....... H03M 3/30; H03M 3/454; H03M 3/458; H03M 3/424; H03M 3/43; H03M 1/12; H03M 3/344; H03M 3/368; H03M 3/39; H03M 3/422; H03M 3/496; H03M 1/00; H03M 1/06; H03M 3/322; H03M 3/38; H03M 3/326

USPC ................................... 341/118, 120, 143, 155
See application file for complete search history.

(56) References Cited

U.S. PATENT DOCUMENTS 5,075,679 A * 12/1991 Gazsi ............................ 341/143
5,369,404 A * 11/1994 Galton ......................... 341/143

(Continued)

OTHER PUBLICATIONS

Ortmans and Gerfers, "Continuous-Time Sigma-Delta A/D Conversion: Fundamentals, Performance Limits and Robust Implementations", ch. 3, Springer Berlin Heidelberg 2006.

(Continued)

*Primary Examiner* — Linh Nguyen
(74) *Attorney, Agent, or Firm* — Joseph G. Swan, P.C.

(57) ABSTRACT

Provided are, among other things, systems, apparatuses, methods and techniques for converting a continuous-time, continuously variable signal into a sampled and quantized signal. One such apparatus includes an input line for accepting an input signal that is continuous in time and continuously variable, multiple processing branches coupled to the input line, and an adder coupled to outputs of the processing branches. Each of the processing branches includes a continuous-time quantization-noise-shaping circuit, a sampling/quantization circuit coupled to an output of the continuous-time quantization-noise-shaping circuit, a digital bandpass filter coupled to an output of the sampling/quantization circuit, and a line coupling an output of the digital-to-analog converter circuit back into the continuous-time quantization-noise-shaping circuit. A center frequency of the digital bandpass filter in each the processing branch corresponds to a minimum in a quantization noise transfer function for the continuous-time quantization-noise-shaping circuit in the same processing branch.

45 Claims, 53 Drawing Sheets

Related U.S. Application Data continuation-in-part of application No. 12/985,238, filed on Jan. 5, 2011, now Pat. No. 8,299,947, which is a continuation-in-part of application No. 12/824,171, filed on Jun. 26, 2010, now Pat. No. 8,089,382, said application No. 13/363,517 is a continuation-in-part of application No. 13/227,668, filed on Sep. 8, 2011, now Pat. No. 8,819,101.

(60) Provisional application No. 61/292,428, filed on Jan. 5, 2010, provisional application No. 61/554,918, filed on Nov. 2, 2011, provisional application No. 61/549,739, filed on Oct. 20, 2011, provisional application No. 61/501,284, filed on Jun. 27, 2011, provisional application No. 61/439,733, filed on Feb. 4, 2011, provisional application No. 61/381,055, filed on Sep. 8, 2010, provisional application No. 61/414,413, filed on Nov. 16, 2010, provisional application No. 61/221,009, filed on Jun. 26, 2009, provisional application No. 61/290,817, filed on Dec. 29, 2009.

(56) References Cited

U.S. PATENT DOCUMENTS

| | | | |
|---|---|---|---|
| 5,568,142 | A | 10/1996 | Velazquez et al. |
| 5,659,546 | A * | 8/1997 | Elder .................... 370/343 |
| 6,177,893 | B1 | 1/2001 | Velazquez et al. |
| 6,249,238 | B1 | 6/2001 | Steinlechner |
| 6,359,576 | B1 | 3/2002 | Petrofsky |
| 6,473,013 | B1 | 10/2002 | Velazquez et al. |
| 6,518,905 | B2 | 2/2003 | Siferd |
| 6,538,588 | B1 | 3/2003 | Bazarjani |
| 6,577,259 | B1 * | 6/2003 | Jelonnek ................. 341/143 |
| 6,683,550 | B2 | 1/2004 | Al-Awadhi |
| 6,771,198 | B2 | 8/2004 | Azadet |
| 6,873,280 | B2 | 3/2005 | Robinson et al. |
| 6,930,625 | B1 | 8/2005 | Lin |
| 6,980,147 | B2 | 12/2005 | Mathis et al. |
| 7,176,820 | B1 * | 2/2007 | Fuller et al. ............. 341/143 |
| 7,193,544 | B1 | 3/2007 | Fitelson et al. |
| 7,259,704 | B2 * | 8/2007 | Mallinson et al. ......... 341/143 |
| 7,289,054 | B1 * | 10/2007 | Watanabe ................ 341/156 |
| 7,298,305 | B2 * | 11/2007 | Melanson ................ 341/143 |
| 7,308,032 | B2 | 12/2007 | Capofreddi |
| 7,324,036 | B2 | 1/2008 | Petre et al. |
| 7,519,513 | B2 | 4/2009 | Pupalaikis et al. |
| 7,535,394 | B2 | 5/2009 | Pupalaikis |
| 7,548,179 | B2 | 6/2009 | Jalan |
| 7,554,472 | B2 | 6/2009 | Puma |
| 8,299,947 | B2 * | 10/2012 | Pagnanelli ............... 341/143 |
| 2004/0252044 | A1 * | 12/2004 | Mathis et al. ............. 341/155 |
| 2005/0093726 | A1 * | 5/2005 | Hezar et al. .............. 341/143 |
| 2006/0152396 | A1 * | 7/2006 | Wegner et al. ............ 341/143 |
| 2007/0008200 | A1 * | 1/2007 | Hsieh et al. .............. 341/120 |
| 2008/0310200 | A1 | 12/2008 | Maksimovic et al. |
| 2009/0066549 | A1 | 3/2009 | Thomsen et al. |
| 2009/0135038 | A1 | 5/2009 | Das |
| 2010/0328125 | A1 | 12/2010 | Pagnanelli |
| 2011/0156940 | A1 * | 6/2011 | Le Guillou et al. ........ 341/143 |
| 2011/0199246 | A1 | 8/2011 | Kinyua |
| 2011/0199247 | A1 * | 8/2011 | van Veldhoven et al. ..... 341/143 |

OTHER PUBLICATIONS

I. Galton and H. Jensen, "Delta Sigma Modulator Based A/D Conversion without Oversampling", IEEE Transactions on Circuits and Systems, vol. 42, 1995.
I. Galton and T Jensen, "Oversampling Parallel Delta-Sigma Modulator A/D Conversion", IEEE Transactions on Circuits and Systems, vol. 43, 1996).
Aziz, P., "Multi-band Oversampled Noise Shaping Analog to Digital Conversion" (PhD Thesis), University of Pennsylvania, 1996.
A. Beydoun and P. Benabes, "Bandpass/Wideband ADC Architecture Using Parallel Delta Sigma Modulators", 14th European Signal Processing Conference, 2006.
O. Shoaei, W. M. Snelgrove, "A Multi-Feedback Design for LC Bandpass Delta-Sigma Modulators", Proceedings—International Symposium on Circuits and Systems, vol. 1, 1995.
D. Anastassiou, "Error Diffusion Coding in A/D Conversion," IEEE Transactions on Circuits and Systems, vol. 36, pp. 1175-1186, 1989.
Hoyos, Sebastian et al., "Analog to digital conversion of ultra-wideband signals in orthogonal spaces", IEEE Conference on Ultra Wideband Systems and Technologies, 2003, pp. 47-51.
Printout from http://www.eecg.toronto.edu/~kphang/ece1371/chap14_slides.pdf on Jul. 27, 2009.
Scott R. Velazquez, "High-Performance Advanced Filter Bank Analog-to-Digital Converter for Universal RF Receivers", Proceedings of the IEEE-SP International Symposium on Time-Frequency and Time-Scale Analysis, 1998. pp. 229-232.
Scott R. Velazquez et al., "Design of Hybrid Filter Banks for Analog/Digital Conversion", IEEE Transactions on Signal Processing, vol. 46, No. 4, Apr. 1998; pp. 956-967.
Scott R. Velazquez et al., "A hybrid filter bank approach to analog-to-digital conversion", Proceedings of the IEEE-SP International Symposium on Time-Frequency and Time-Scale Analysis (1994) pp. 116-119.
G. Ding et al., "Frequency-Interleaving Technique for High-Speed A/D Conversion", Proceedings of the 2003 International Symposium on Circuits and Systems, 2003, pp. 1-857-1-860.
P.P Vaidyanathan, "Analog/Digital Hybrid QMF Banks in A/D Conversion," Multirate Systems and Filter Banks, Englewood Cliffs, New Jersey: Prentice-Hall, 1993, pp. 163-164.
A. Petraglia and S.K. Mitra, "High-Speed A/D Conversion Using QMF Filter Banks," Proceeding IEEE International Symposium on Circuits and Systems, pp. 2797-2800, New Orleans, May 1990).
S.A. Jantzi, W.M. Snelgrove, and P.F. Ferguson Jr. "A Fourth-Order Bandpass Delta Sigma Modulator," IEEE Journal of Solid State Circuits, vol. 28, pp. 282-291, Mar. 1993.
Y. Matsuya, et. al. "A 16-bit Oversampling A-to-D Conversion Technology Using Triple-Integration Noise Shaping," IEEE Journal of Solid-State Circuits, vol. 22, pp. 921-929, Dec. 1987.
International Search Report and Written Opinion in corresponding PCT Application No. PCT/US2010/040115.
Eshraghi, A., et al., "A Comparative Analysis of Parallel Delta-Sigma ADC Architectures", IEEE Transactions on Circuits and Systems Part I: Regular Papers, vol. 51, No. 3, Mar. 1, 2004, pp. 450-458.
International Search Report and Written Opinion in corresponding PCT Application No. PCT/US2011/020274.
Philippe Benabes et al: "Extended frequency-band-decomposition sigma delta A/D converter", Analog Integrated Circuits and Signal Processing, Kluwer Academic Publishers, BO, vol. 61, No. 1, Jan. 9, 2009, pp. 75-85, XP019727213, ISSN: 1573-1979, DOI: D01:10. 1007/S10470-008-9274-6.
Philippe Benabes et al: "A self-calibration scheme for extended frequency-band-decomposition sigma-delta ADC", Analog Integrated Circuits and Signal Processing, Kluwer Academic Publishers, BO, vol. 62, No. 3, Aug. 26, 2009, pp. 269-280, XP019766234, ISSN: 1573-1979.
Johns, D. and Martin, K., "Analog Integrated Circuit Design", John Wiley & Sons 1997, pp. 538-572.
Aziz, PM, et al., "Multi Band Sigma Delta Analog to Digital Conversion", IEEE International Conference on Acoustics, Speech, and Signal Processing, 1994. ICASSP-94, 1994.
Aziz, PM, et al., "An Overview of Sigma-Delta Converters: How a 1-bit ADC achieves more than 16-bit resolution", IEEE Signal Processing Magazine, vol. 13, Issue 1, Sep. 1996, pp. 61-84.
International Search Report and Written Opinion in PCT Application No. PCT/US2011/020268.
International Search Report and Written Opinion for corresponding PCT Application No. PCT/US2012/023434.
T. Cataltepe et al., "Digitally corrected multi-bit sigma-Delta data converters", Proc. IEEE Internat. Symp. on Circuits and Systems Conf., pp. 647-650, Portland, Oregon May 1989, 19890508; 19890508-19890511, May 8, 1989, pp. 647-650, XP010084892.

(56) References Cited

OTHER PUBLICATIONS

Bjorn Thorsten Thiel et al: "Digital asynchronous signal interpolation and clock domain crossing", Microwave Conference Proceedings (APMC), 2010 Asia-Pacific, IEEE, Dec. 7, 2010, pp. 1420-1423, XP031928922, ISBN: 978-1-4244-7590-2.

Jennifer L H Webb: "Transposed FIR Filter Structure with Time-Varying Coefficients for Digital Data Resampling", IEEE Transactions on Signal Processing, IEEE Service Center, New York, NY, US, vol. 48, No. 9, Sep. 1, 2000, XP011059108, ISSN: 1053-587X.

Turner, Clay S., "Recursive Discrete-Time Sinusoidal Oscillators," IEEE Signal Processing Magazine, pp. 103-111, May 2003.

Prosecution history of parent U.S. Appl. No. 12/824,171 (now U.S. Pat. No. 8,089,382).

Prosecution history of U.S. Appl. No. 13/304,588 (now U.S. Pat. No. 8,604,957).

Prosecution history of parent U.S. Appl. No. 12/985,238 (now U.S. Pat. No. 8,299,947).

Prosecution history of parent U.S. Appl. No. 13/363,517 (now U.S. Pat. No. 8,943,112).

Prosecution history of parent U.S. Appl. No. 12/985,214 (now U.S. Pat. No. 8,416,111).

Prosecution history of U.S. Appl. No. 13/844,948 (now U.S. Pat. No. 8,917,198).

Prosecution history of U.S. Appl. No. 14/558,640.

Prosecution history of parent U.S. Appl. No. 13/227,668 (now U.S. Pat. No. 8,819,101).

\* cited by examiner

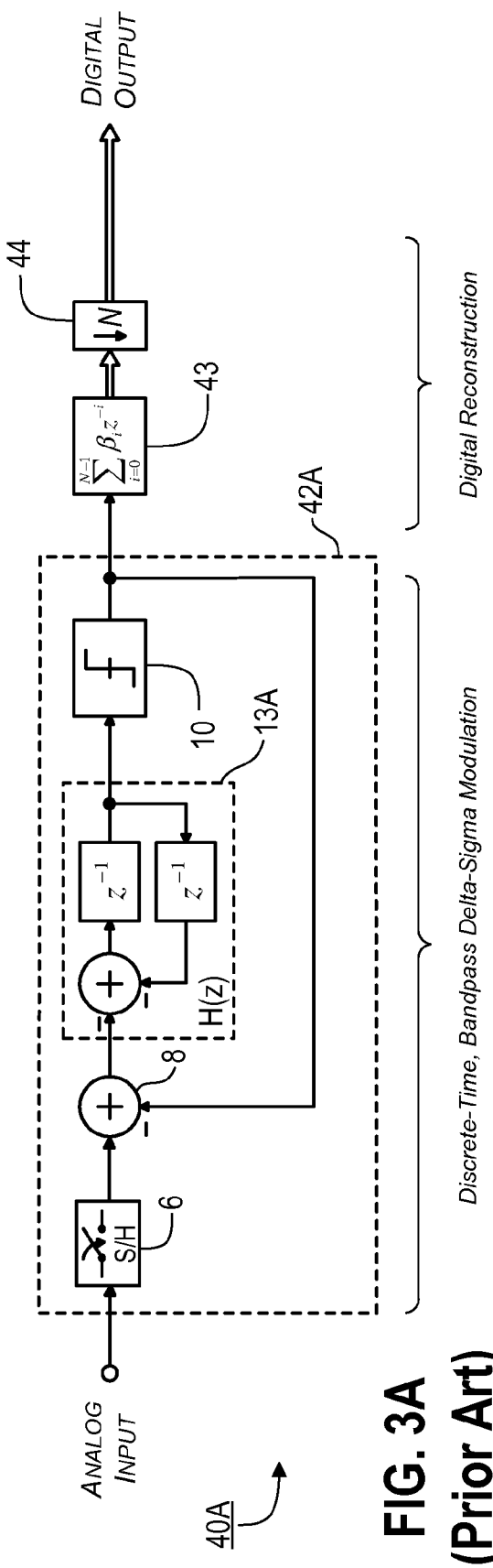
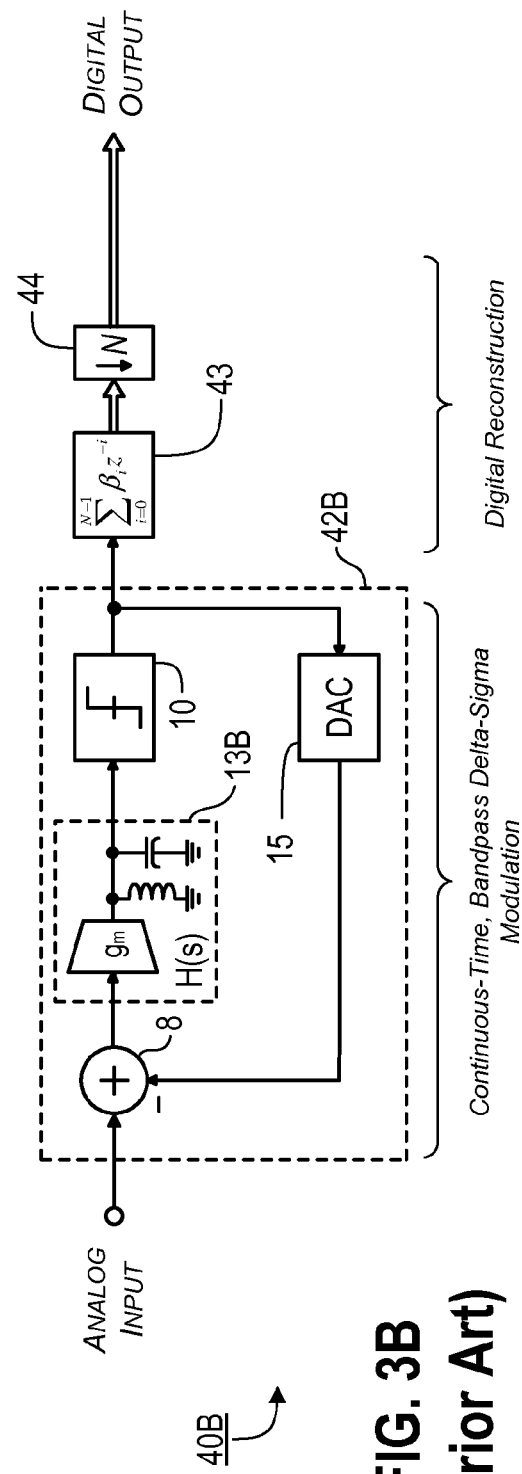
FIG. 3A (Prior Art)
FIG. 3B (Prior Art)

SAMPLING/QUANTIZATION CONVERTERS

This application is a continuation in part of U.S. patent application Ser. No. 13/363,517 (the '517 application), filed on Feb. 1, 2012, which is a continuation in part of U.S. patent application Ser. No. 12/985,238, filed on Jan. 5, 2011 (now U.S. Pat. No. 8,299,947), which claimed the benefit of: U.S. Provisional Patent Application Ser. No. 61/414,413, filed on Nov. 16, 2010, and titled "Sampling/Quantization Converters"; U.S. Provisional Patent Application Ser. No. 61/381,055 (the '055 Application), filed on Sep. 8, 2010, and titled "Multi-Bit Sampling and Quantizing Circuit"; and U.S. Provisional Patent Application Ser. No. 61/292,428, filed on Jan. 5, 2010, and titled "Method and Apparatus for Multi-Mode Continuous-Time to Discrete-Time Transformation" (the '428 Application), and which was a continuation in part of U.S. patent application Ser. No. 12/824,171, filed on Jun. 26, 2010 and titled "Sampling/Quantization Converters" (now U.S. Pat. No. 8,089,382) which, in turn, claimed the benefit of U.S. Provisional Patent Application Ser. No. 61/221,009, filed on Jun. 26, 2009, and titled "Method of Linear to Discrete Signal Transformation using Orthogonal Bandpass Oversampling (OBO)" and U.S. Provisional Patent Application Ser. No. 61/290,817, filed on Dec. 29, 2009, and titled "Sampling/Quantization Converters". The '517 application also is a continuation in part of U.S. patent application Ser. No. 13/227,668, filed on Sep. 8, 2011, and titled "Multi-Bit Sampling and Quantizing Circuit" (the '668 application), which also claimed the benefit of the '055 Application. The '517 application also is a continuation in part of U.S. patent application Ser. No. 12/985,214, filed on Jan. 5, 2011, and titled "Multimode Sampling/Quantization Converters", which claimed the benefit of the '428 Application. The '517 application also claims the benefit of U.S. Provisional Patent Application Ser. No. 61/554,918, filed on Nov. 2, 2011, and titled "Sampling/Quantization Converters"; U.S. Provisional Patent Application Ser. No. 61/549,739, filed on Oct. 20, 2011, and titled "Linear to Discrete Quantization Conversion with Reduced Sampling Variation Errors"; U.S. Provisional Patent Application Ser. No. 61/501,284, filed on Jun. 27, 2011; and U.S. Provisional Patent Application Ser. No. 61/439,733, filed on Feb. 4, 2011. The foregoing applications are incorporated by reference herein as though set forth herein in full.

FIELD OF THE INVENTION

The present invention pertains to systems, methods and techniques for converting a continuous-time continuously variable signal into a sampled, quantized discrete-time signal, and it is particularly applicable to very high sample-rate data converters with high instantaneous bandwidth.

BACKGROUND

Many applications in modern electronics require that continuous-time signals be converted to discrete signals for processing using digital computers and signal processors. Typically, this transformation is made using a conventional analog-to-digital converter (ADC). However, the present inventor has discovered that each of the presently existing ADC approaches exhibits shortcomings that limit overall performance at very high sample rates.

Due to parallel processing and other innovations, the digital information processing bandwidth of computers and signal processors has advanced beyond the capabilities of state-of-the art ADCs. Converters with higher instantaneous bandwidth are desirable in certain circumstances. However, existing solutions are limited by instantaneous bandwidth (effective sample rate), effective conversion resolution (number of effective bits), or both.

The resolution of an ADC is a measure of the precision with which a continuous-time continuously variable signal can be transformed into a quantized signal, and typically is specified in units of effective bits (B). When a continuous-time continuously variable signal is converted into a discrete-time discretely variable signal through sampling and quantization, the quality of the signal degrades because the conversion process introduces quantization, or rounding, noise. High-resolution converters introduce less quantization noise because they transform continuously variable signals into discrete signals using a rounding operation with finer granularity. Instantaneous conversion bandwidth is limited by the Nyquist criterion to a theoretical maximum of one-half the converter sample rate (the Nyquist limit). High-resolution conversion (of ≥10 bits) conventionally has been limited to instantaneous bandwidths of about a few gigahertz (GHz) or less.

Converters that quantize signals at a sample rate ($f_S$) that is at or slightly above a frequency equal to twice the signal bandwidth ($f_B$) with several or many bits of resolution are conventionally known as Nyquist-rate, or baud-sampled, converters. Prior-art Nyquist-rate converter architectures include conventional flash and conventional pipelined analog-to-digital converters (ADCs). Conventional flash converters potentially can achieve very high instantaneous bandwidths. However, the resolution of flash converters can be limited by practical implementation impairments that introduce quantization errors, such as clock jitter, thermal noise, and rounding/gain inaccuracies caused by component tolerances. Although flash converters potentially could realize high resolution at instantaneous bandwidths greater than 10 GHz, this potential has been unrealized in commercial offerings. Conventional pipelined converters generally have better resolution than conventional flash converters, because they employ complex calibration schemes and feedback loops to reduce the quantization/rounding errors caused by these practical implementation impairments. However, pipelined converters typically can provide less than about 1 GHz of instantaneous bandwidth.

Another conventional approach that attempts to reduce quantization noise and errors uses an oversampling technique. Oversampling converters sample and digitize continuous-time, continuously variable signals at a rate much higher than twice the analog signal's bandwidth (i.e., $f_S \gg f_B$). Due to operation at very high sample rates, the raw high-speed converters used in oversampling approaches ordinarily are capable of only low-resolution conversion, often only a single bit. Conventional oversampling converters realize high resolution by using a noise shaping operation that ideally attenuates quantization noise and errors in the signal bandwidth, without also attenuating the signal itself. Through shaping of quantization noise and subsequent filtering (digital signal reconstruction), oversampling converters transform a high-rate, low-resolution output into a low-rate, high-resolution output.

FIGS. 1A-C illustrate block diagrams of conventional, lowpass oversampling converters. A typical conventional oversampling converter uses a delta-sigma (ΔΣ) modulator 7A-C to shape or color quantization noise. As the name implies, a delta-sigma modulator 7A-C shapes the noise that will be introduced by quantizer 10 by performing a difference operation 8 (i.e., delta) and an integration operation 13A-C (i.e., sigma), e.g., $$I(z) = \frac{1}{1-z^{-1}}$$

or $$I(s) = \frac{1}{s \cdot RC}.$$

Generally speaking, the delta-sigma modulator processes the signal with one transfer function (STF) and the quantization noise with a different transfer function (NTF). Conventional transfer functions are of the form $STF(z)=z^{-1}$ and $NTF(z)=(1-z^{-1})^P$, where $z^{-1}$ represents a unit delay equal to $T_S=1/f_S$, and P is called the order of the modulator or noise-shaped response. The STF frequency response 30 and NTF frequency response 32 for a delta sigma modulator with P=1 are shown in FIG. 2.

There exist various types of conventional delta-sigma modulators that produce comparable signal and noise transfer functions. A delta-sigma modulator that employs an auxiliary sample-and-hold operation, either explicitly as in sample-and-hold circuit 6 in converters 5A&C shown in FIGS. 1A&C, respectively, or implicitly using switched-capacitor circuits (e.g., integrators), for example, is commonly referred to as a discrete-time, delta-sigma (DT ΔΣ) modulator. A delta-sigma modulator, such as circuit 7B shown in FIG. 1B, that does not employ an auxiliary sample-and-hold operation is commonly referred to as a continuous-time, delta-sigma (CT ΔΣ) modulator. Discrete-time modulators have been the preferred method in conventional converters because DT ΔΣ modulators are more reliable in terms of stable (i.e., insensitivity to timing variations) and predictable (i.e., linearity) performance. See Ortmans and Gerfers, "Continuous-Time Sigma-Delta A/D Conversion: Fundamentals, Performance Limits and Robust Implementations", Springer Berlin Heidelberg 2006. The converters 5A&B, shown in FIGS. 1A&B, respectively, employ delta-sigma modulators with filtering 13A&B in the feed-forward path from the output of the modulator subtractor 8 to the input of the quantizer 10, in an arrangement known as an interpolative structure. An alternative DT ΔΣ modulator is the error-feedback structure of converter 5C shown in FIG. 1C, which has no feed-forward filtering and a single feedback filter. See D. Anastassiou "Error Diffusion Coding in A/D Conversion," IEEE Transactions on Circuits and Systems, Vol. 36, 1989. The error-feedback structure is conventionally considered suitable for digital implementations (i.e., digital-to-analog conversion), but not for analog implementations due to its increased sensitivity to component mismatches compared to the interpolative structure. See Johns, D. and Martin, K., "Analog Integrated Circuit Design", John Wiley & Sons 1997.

As illustrated in FIGS. 1A-C, conventional oversampling converters employ a $comb^{P+1}$ or $sinc^{P+1}$ filter 12 (also referred to in the prior art as a cascaded integrator-comb filter) for output filtering and signal reconstruction. Conventional oversampling converters with a first-order noise-shaped response realize the $comb^{P+1}$ filter 12 in three steps: second-order integration 12A, e.g., with a transfer function of $$T_{INT} = \frac{1}{(1-z^{-1})^2}$$

at the converter sample rate ($f_S$), followed by downsampling 12B by the converter excess-rate oversampling ratio (i.e., $$N = \frac{1}{2} \cdot f_S/f_B),$$

followed by second-order differentiation 12C, e.g., with a transfer function of $$T_{DIFF}=(1-z^{-1})^2$$

at the converter output data rate (i.e., conversion rate of $f_{CLK}$). A generalized $comb^{P+1}$ filter transfer function of $$T_{COMB} = \left(\frac{1-z^{-N}}{1-z^{-1}}\right)^{P+1},$$

where P is the order of the modulator, produces frequency response minima at multiples of the conversion rate ($f_{CLK}$), and conventionally has been considered optimal for oversampling converters. Thus, in the specific example given above, it is assumed that a modulator with first-order response (i.e., P=1) is used.

The delta-sigma converters 5A-C illustrated in FIGS. 1A-C are conventionally known as lowpass, delta-sigma converters. A variation on the conventional lowpass converter, employs bandpass delta-sigma modulators to allow conversion of narrowband signals that are centered at frequencies above zero. Exemplary bandpass oversampling converters 40A&B, illustrated in FIGS. 3A&B, respectively, include a bandpass delta-sigma modulator 42A or 42B, respectively, that provides, as shown in FIG. 4, a signal response 50 and a quantization noise response 51 with a minimum 52 at the center of the converter Nyquist bandwidth (i.e., ¼·$f_S$). After single-bit high-speed quantization/sampling 10 (or, with respect to converter 40A shown in FIG. 3A, just quantization, sampling having been performed in sample-and-hold circuit 6), filtering 43 of shaped quantization noise, similar to that performed in the standard conventional lowpass oversampling converter (e.g., any of converters 5A-C), is performed, followed by downsampling 44.

Bandpass delta-sigma modulators are similar to the more-common lowpass variety in several respects: The conventional bandpass delta-sigma modulator has both discrete-time (converter 40A shown in FIG. 3A) and continuous-time (converter 40B shown in FIG. 3B) forms. Like the lowpass version, the bandpass delta-sigma modulator 42A&B shapes noise from quantizer 10 by performing a difference operation 8 (i.e., delta) and an integration operation 13A&B (i.e., sigma), respectively, where $$H(z) = -\frac{z^{-1}}{1+z^{-2}}$$

and $$H(s) = \frac{\sqrt{LC} \cdot s}{LC \cdot s^2 + 1} = \frac{\omega_0 \cdot s}{s^2 + \omega_0^2}\Big|_{\omega_0 = \pi \cdot f_S/2}.$$

Also, the bandpass modulator processes the signal with one transfer function (STF) and the quantization noise with a different transfer function (NTF). The conventional bandpass DT ΔΣ modulator, shown in FIG. 3A, is considered second-order (i.e., P=2) and has a $STF(z)=z^{-1}$ and a $NTF(z)=1+z^{-2}$, where $z^{-1}$ represents a unit delay equal to $T_S$. Linearized, continuous-time transfer functions for the second-order CT ΔΣ modulator, shown in FIG. 3B, are of the form $$STF(s) = \frac{\omega \cdot s}{s^2 + \omega \cdot s + \omega^2}$$

and $$NTF(s) = \frac{s^2 + \omega^2}{s^2 + \omega \cdot s + \omega^2}.$$

It should be noted that discrete-time modulators have a signal transfer function (STF) that generally is all-pass, whereas continuous-time modulators have a linearized signal transfer function (STF) that generally is not all-pass (e.g., bandpass for the above example). Also, the noise transfer function (NTF) of a real bandpass delta-sigma modulator is at minimum a second-order response.

Conventional oversampling converters can offer very high resolution, but the noise shaping and signal reconstruction process generally limits the utility of oversampling converters to applications requiring only low instantaneous bandwidth. To improve the instantaneous bandwidth of oversampling converters, multiple oversampling converters can be operated in parallel using the time-interleaving (time-slicing) and/or frequency-interleaving (frequency-slicing) techniques developed originally for Nyquist converters (i.e., flash, pipelined, etc.). In time-interleaving, a high-speed sample clock is decomposed into lower-speed sample clocks at different phases. Each converter in the time-interleaving array is clocked with a different clock phase, such that the conversion operation is distributed in time across multiple converters (i.e., polyphase decomposition). While converter #1 is processing the first sample, converter #2 is processing the next sample, and so on.

For interleaving in frequency, the total bandwidth of the continuous-time signal is uniformly decomposed (i.e., divided) into multiple, narrowband segments (i.e., sub-bands). Each parallel processing branch converts one narrowband segment, and all the converter processing branches operate from a single, common sampling clock. Conventional frequency-interleaving converters include frequency-translating hybrid (FTH) converters and hybrid filter bank (HFB) converters. In representative implementations of the FTH converter, such as circuit 70A shown in FIG. 5A, individual frequency bands are downconverted to baseband and separated out using lowpass filters. More specifically, the input signal 71 is provided to a set of multipliers 72 together with the band's central frequencies 74A-76A. The resulting baseband signals are then provided to identical lowpass filters 78 that are designed to spectrally decompose (i.e., slice) the input signal (i.e., a process referred to as signal analysis), in addition to minimizing aliasing. Each such filtered baseband signal is then digitized 80A, digitally upconverted 82A using digitized sinusoids 83A-C (or alternatively simply upsampled) and then bandpass filtered 84A-86A in order to restore the input signal to its previous frequency band (i.e., a process referred to as signal synthesis). Finally, the individual bands are recombined in one or more adders 88. Each converter 80A in the interleaved array is able to operate at a lower sampling frequency equal to twice the bandwidth of each subdivided, downcoverted band (i.e., the portion of the input signal intended to be converted by the respective processing branch). Similar processing occurs in HFB converter, except that the individual frequency bands are separated out using analog (frequency decomposition) bandpass filters before downconversion to baseband (see Petraglia, A., "High Speed A/D Conversion using QMF Filter Banks", Proceedings: IEEE International Symposium on Circuits and Systems, 1990).

The conventional parallel delta-sigma analog-to-digital converter (ΠΔΣ ADC) 70B, shown in FIG. 5B, is similar in design and operation to the conventional frequency-interleaved converter 70A shown in FIG. 5A, except that oversampling converters 80B are used in place of multi-bit digitizers 80A and anti-aliasing filters 78. See I. Galton and H. Jensen, "Delta Sigma Modulator Based A/D Conversion without Oversampling", IEEE Transactions on Circuits and Systems, Vol. 42, 1995 and I. Galton and T Jensen, "Oversampling Parallel Delta-Sigma Modulator A/D Conversion", IEEE Transactions on Circuits and Systems, Vol. 43, 1996). As shown in FIG. 5B, the primary advantage of the prior-art ΠΔΣ converter 70B is that the oversampling operation of the delta-sigma modulators 89 eliminates the need for the anti-aliasing function provided by the analog frequency decomposition filters. The conventional ΠΔΣ ADC generally employs discrete-time, lowpass delta-sigma modulators 89 and uses continuous-time Hadamard sequences ($v_i(t)$) 74B-76B and discrete-time Hadamard sequences ($u_i[n]$) 89A-C, instead of sinusoidal waveforms, to reduce the circuit complexity associated with the downconversion 72B and upconversion 82B operations. In some instances, bandpass delta-sigma modulators are used to eliminate the need for analog downconversion completely, in a process sometimes called Direct Multiband Delta-Sigma Conversion (MBΔΣ). See Aziz, P., "Multi Band Sigma Delta Analog to Digital Conversion", IEEE International Conference on Acoustics, Speech, and Signal Processing, 1994 and A. Beydoun and P. Benabes, "Bandpass/Wideband ADC Architecture Using Parallel Delta Sigma Modulators", 14$^{th}$ European Signal Processing Conference, 2006. In addition to multiband delta-sigma modulation, conventional oversampling frequency-interleaving converters (i.e., ΠΔΣ ADC and MBΔΣ) employ conventional, decimating comb$^{P+1}$ (sinc$^{P+1}$) lowpass filters (ΠΔΣ ADC) or a conventional, transversal finite impulse response (FIR) filter bank (MBΔΣ) for signal reconstruction.

The present inventor has discovered that conventional ΠΔΣ converters, as shown in FIG. 5B, and conventional MBΔΣ converters have several disadvantages that limit their utility in applications requiring very high instantaneous bandwidth and high resolution. These disadvantages, which are discussed in greater detail in the Description of the Preferred Embodiment(s) section, include: 1) use of delta-sigma modulation (Galton, Aziz, and Beydoun) impairs high-frequency operation because the sample-and-hold function limits the performance of DT ΔΣ modulators and non-ideal circuit behavior can degrade the noise-shaped response and stability of CT ΔΣ modulators; 2) use of decimating comb$^{P+1}$ filters for signal reconstruction in ΠΔΣ converters (Galton) introduces amplitude and phase distortion that is not completely mitigated by the relatively complex output equalizer (i.e., equalizer 90 having transfer function F'(z) in FIG. 5B); 3) use of Hadamard sequences for downconversion and upconversion in ΠΔΣ converters introduces conversion errors related to signal-level mismatches and harmonic intermodulation products (i.e., intermodulation distortion); 4) use of conventional FIR filter-bank technology (as in Aziz) or Hann window function filters (as in Beydoun) for signal reconstruction in MBΔΣ converters limits the practical number of parallel processing branches due to signal-processing complexities (i.e., number of multiply/accumulate operations), particularly for high-frequency, multirate (i.e., polyphase) filter topologies; and 5) absence of feedback from the signal-reconstruction filter outputs to the ΔΣ modulator, means that ΔΣ modulator component tolerances can degrade converter performance by creating mismatches between the notch frequency ($f_{notch}$) in the NTF and notch, the center frequency of the narrowband reconstruction filter response. Possibly due to these disadvantages, the instantaneous bandwidth and resolution performance of conventional ΠΔΣ and MBΔΣ converters have not been able to surpass that of conventional pipelined converters.

In addition to ΠΔΣ and MBΔΣ, parallel arrangements of delta-sigma modulators are the subject of several United States patents, such as U.S. Pat. Nos. 7,289,054, 6,873,280, and 6,683,550. However, these patents generally fail to adequately address the primary issues associated with the high-resolution, high-sample-rate conversion of continuous-time signals to discrete-time signals. One technique, described in U.S. Pat. No. 7,289,054, uses digitization of noise shaping circuit residues for increasing converter precision, rather than using reconstruction filter banks for quantization noise reduction. Another technique, described in U.S. Pat. No. 6,873,280, addresses conversion of digital (discrete-time, discretely variable) signals to other forms, rather than the conversion of analog (continuous-time, continuously variable) signals to digital signals. A third technique, described in U.S. Pat. No. 6,683,550, employs multi-bit, first-order modulators which are not suitable for high-precision, bandpass oversampling applications since these application require modulators that are at least second order.

SUMMARY OF THE INVENTION

The present invention provides an improved ADC, particularly for use at very high sample rates and instantaneous bandwidths approaching the Nyquist limit.

Thus, one specific embodiment of the invention is directed to an apparatus for converting a continuous-time, continuously variable signal into a sampled and quantized signal. The apparatus includes: an input line for accepting an input signal that is continuous in time and continuously variable; a plurality of processing branches coupled to the input line; and an adder coupled to outputs of the plurality of processing branches, with each of the processing branches including: (a) a continuous-time filter, preferably a Diplexing Feedback Loop (DFL), for shaping quantization and other noise, (b) a sampling/quantization circuit coupled to the output of the quantization-noise-shaping continuous-time filter, (c) a digital bandpass filter, preferably a Bandpass Moving Average filter, coupled to an output of the sampling/quantization circuit, and (d) one or more lines coupling the input and output of the sampling/quantization circuit back into the quantization-noise-shaping continuous-time filter. Each of the quantization-noise-shaping continuous-time filters has an adder that includes multiple inputs and an output, with: 1) the input signal being coupled to one of the inputs of the adder, 2) the output of the adder being coupled to a sampling/quantization circuit input and to one of the inputs of the adder through a first filter, and 3) the output of the sampling/quantization circuit in the same processing branch being coupled to one of the inputs of the adder through a second filter that has a different transfer function than the first filter. The quantization-noise-shaping continuous-time filters in different ones of the processing branches produce quantization noise minima at different frequencies, and the quantization noise minimum for each of the quantization-noise-shaping continuous-time filters corresponds to a frequency band selected by the digital bandpass filter in the same processing branch.

Another embodiment is directed to an apparatus for converting a continuous-time, continuously variable signal into a sampled and quantized signal. The apparatus includes: an input line for accepting an input signal that is continuous in time and continuously variable, multiple processing branches coupled to the input line, and an adder coupled to outputs of the processing branches. Each of the processing branches includes: (a) a continuous-time quantization-noise-shaping circuit, (b) a sampling/quantization circuit coupled to an output of the continuous-time quantization-noise-shaping circuit, (c) a digital bandpass filter coupled to an output of the sampling/quantization circuit, and (d) a line coupling the output of the sampling/quantization circuit back into the continuous-time quantization-noise-shaping circuit. A center frequency of the digital bandpass filter in each processing branch corresponds to a minimum in a quantization noise transfer function for the continuous-time quantization-noise-shaping circuit in the same processing branch. Each of the digital bandpass filters includes: (a) a quadrature frequency downconverter that has in-phase and quadrature outputs, (b) a first moving-average filter coupled to the in-phase output of the quadrature frequency downconverter, (c) a second moving-average filter coupled to the quadrature output of the quadrature frequency downconverter, and (d) a quadrature frequency upconverter coupled to outputs of the first and second moving-average filters.

In a somewhat more generalized embodiment, the invention is directed to an apparatus for converting a continuous-time, continuously variable signal into a sampled and quantized signal, and includes: an input line for accepting an input signal that is continuous in time and continuously variable; a plurality of processing branches coupled to the input line; and a combining circuit, coupled to outputs of a plurality of the processing branches, that combines signals on such outputs into a final output signal. Each of such processing branches includes: (a) a bandpass quantization-noise-shaping circuit, (b) a sampling/quantization circuit coupled to an output of the bandpass noise-shaping circuit, (c) a digital bandpass filter coupled to an output of the sampling/quantization circuit, and (d) a line coupling the output of the sampling/quantization circuit back into the bandpass noise-shaping circuit. A center frequency of the digital bandpass filter in each processing branch corresponds to a minimum or a stopband region in a quantization noise transfer function for the bandpass noise-shaping circuit in the same processing branch. Each of the digital bandpass filters includes: (a) a quadrature frequency downconverter that has in-phase and quadrature outputs, (b) a first moving-average filter coupled to the in-phase output of the quadrature frequency downconverter, (c) a second moving-average filter coupled to the quadrature output of the quadrature frequency downconverter, and (d) a quadrature frequency upconverter coupled to outputs of the first and second moving-average filters.

A further embodiment is directed to an apparatus for converting a continuous-time, continuously variable signal into a sampled and quantized signal. The apparatus includes: an input line for accepting an input signal that is continuous in time and continuously variable, multiple processing branches coupled to the input line, and an adder coupled to outputs of the plurality of processing branches Each of the processing branches includes: (a) a continuous-time quantization-noise-shaping circuit, (b) a multi-bit sampling/quantization circuit coupled to an output of the continuous-time quantization-noise-shaping circuit, (c) a nonlinear bit-mapping circuit coupled to an output of the multi-bit sampling/quantization circuit, (d) a digital bandpass filter coupled to an output of the nonlinear bit-mapping circuit, (e) a digital-to-analog converter (DAC) circuit coupled to the output of the multi-bit sampling/quantization circuit, and (f) a line coupling an output of the digital-to-analog converter circuit back into the continuous-time quantization-noise-shaping circuit. A center frequency of the digital bandpass filter in each processing branch corresponds to a minimum in a quantization noise transfer function for the continuous-time quantization-noise-shaping circuit in the same processing branch. The nonlinear bit-mapping circuit in each of the processing branches performs a scaling operation, on a bit-by-bit basis, that matches imperfections in a binary scaling response of the digital-to-analog converter in the same processing branch.

Such apparatuses typically can provide a better combination of high resolution and wide bandwidth than is possible with conventional converters and can be used for various commercial, industrial and military applications, e.g., in various direct conversion sensors, software-defined or cognitive radios, multi-channel communication receivers, all-digital RADAR systems, high-speed industrial data acquisition systems, ultra-wideband (UWB) communication systems.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 3A is a block diagram of a single-band bandpass oversampling converter having a discrete-time, interpolative delta-sigma modulator with second-order response; and FIG. 3B is a block diagram of a single-band bandpass oversampling converter having a continuous-time, interpolative delta-sigma modulator with second-order response.

DESCRIPTION OF THE PREFERRED EMBODIMENT(S)

Figure 1A:
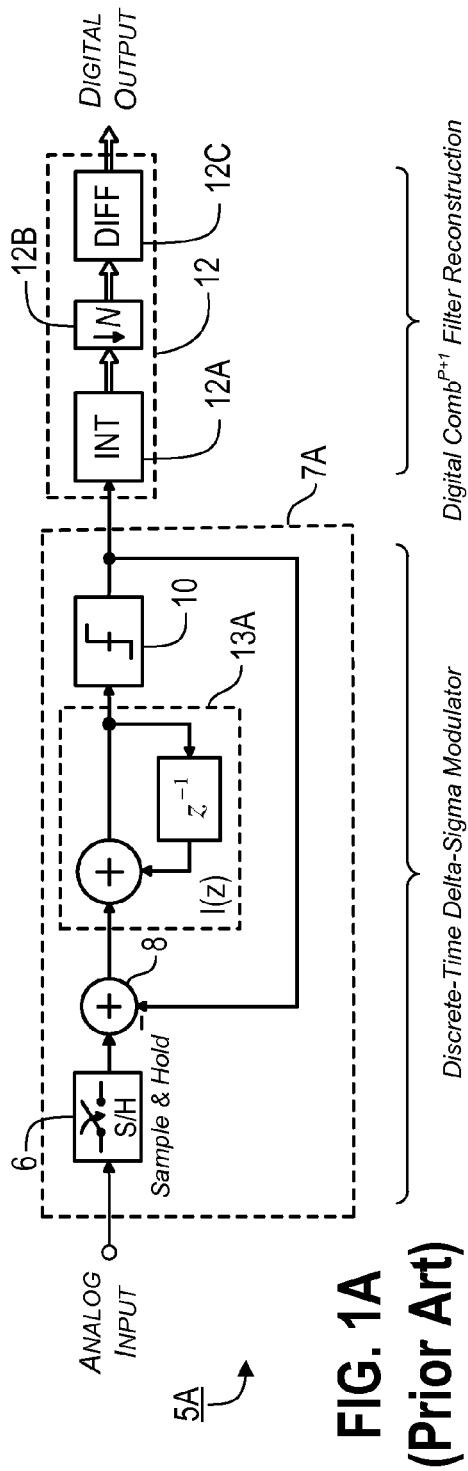
FIG. 1A is a block diagram of a conventional lowpass oversampling converter having a discrete-time, interpolative delta-sigma modulator with first-order response.
Figure 2:
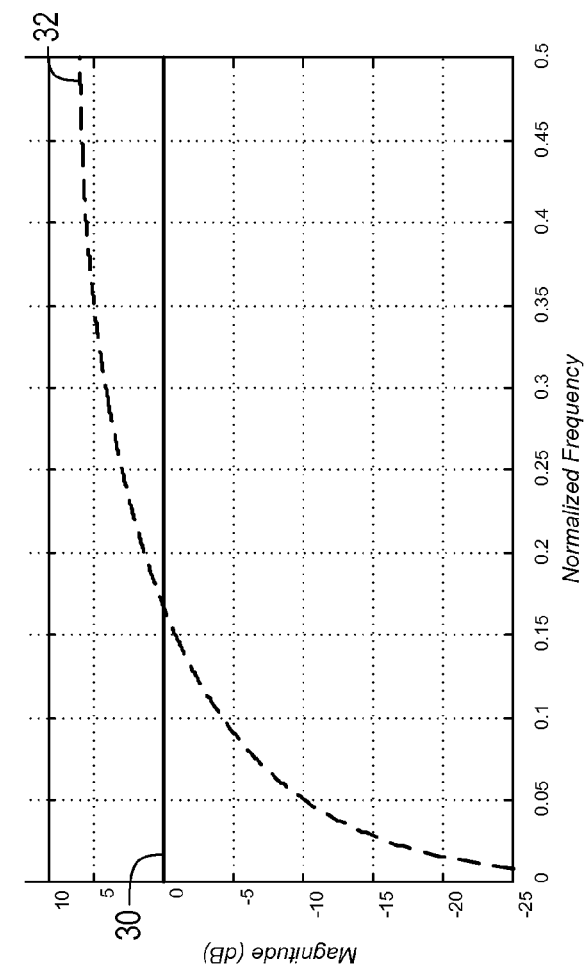
FIG. 2 illustrates the input signal transfer function (STF) and quantization-noise transfer function (NTF) for a conventional, first-order, lowpass delta-sigma modulator.
Figure 1B:
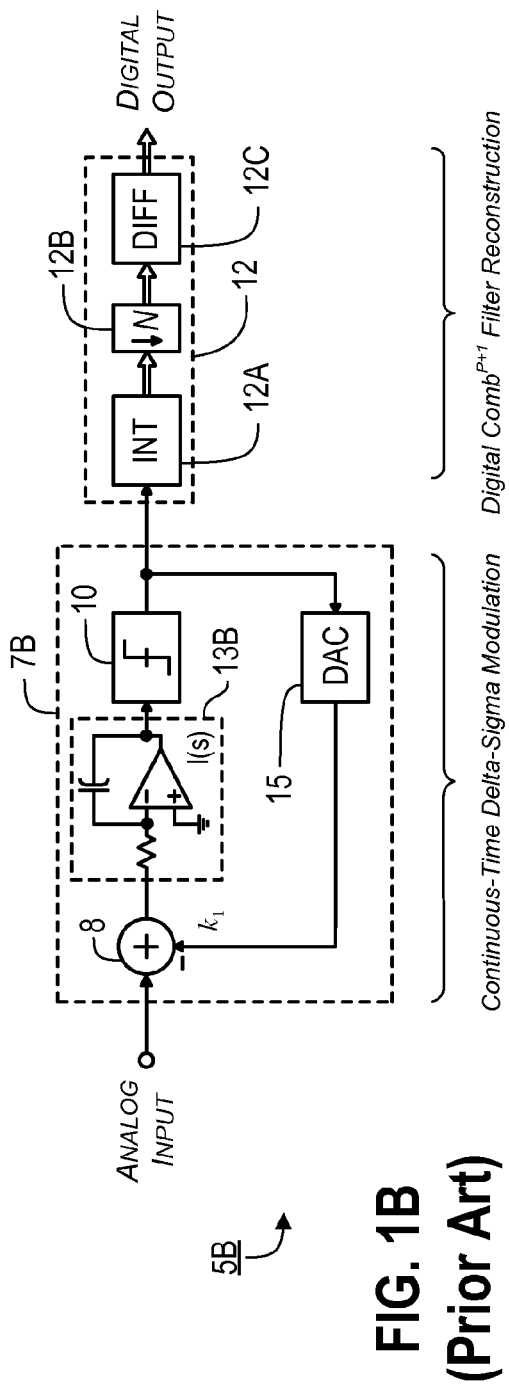
FIG. 1B is a block diagram of a conventional lowpass oversampling converter having a continuous-time, interpolative delta-sigma modulator with first-order response.
Figure 1C:
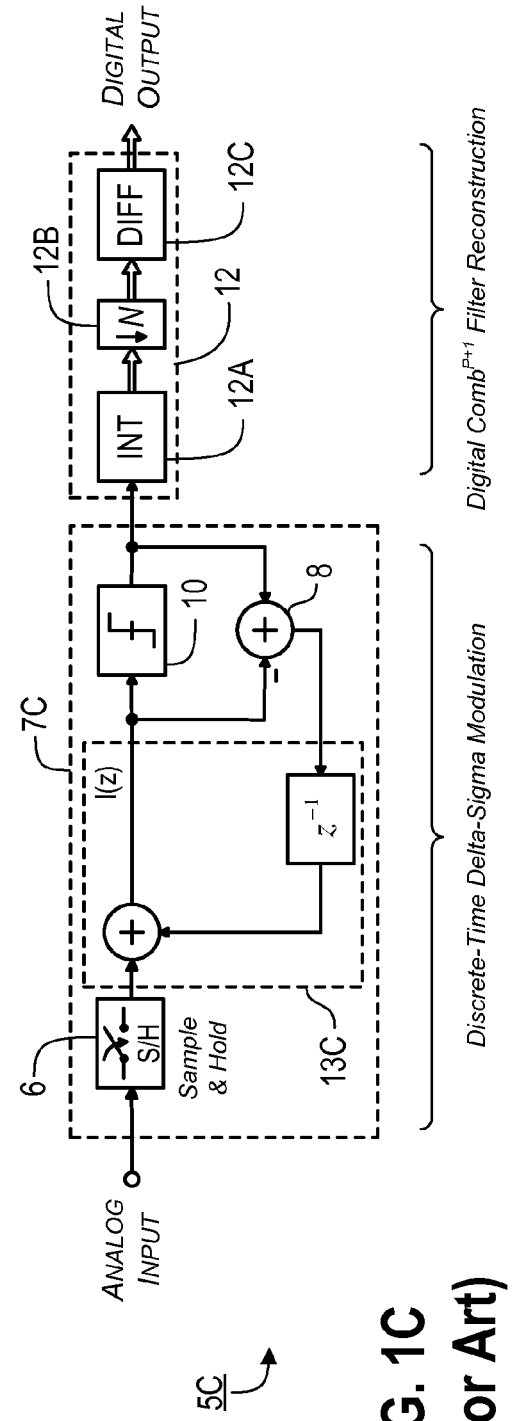
FIG. 1C is a block diagram of a conventional oversampling lowpass converter having a discrete-time, error-feedback delta-sigma modulator with first-order response.
Figure 4:
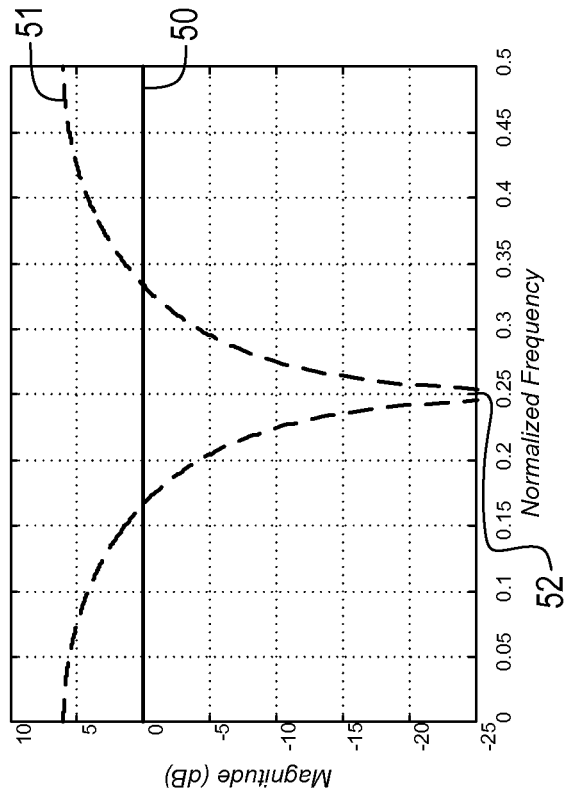
FIG. 4 illustrates the input signal transfer function (STF) and quantization-noise transfer function (NTF) for the delta-sigma modulator of the single-band bandpass converters shown in FIGS. 3A&B.
Figure 5A:
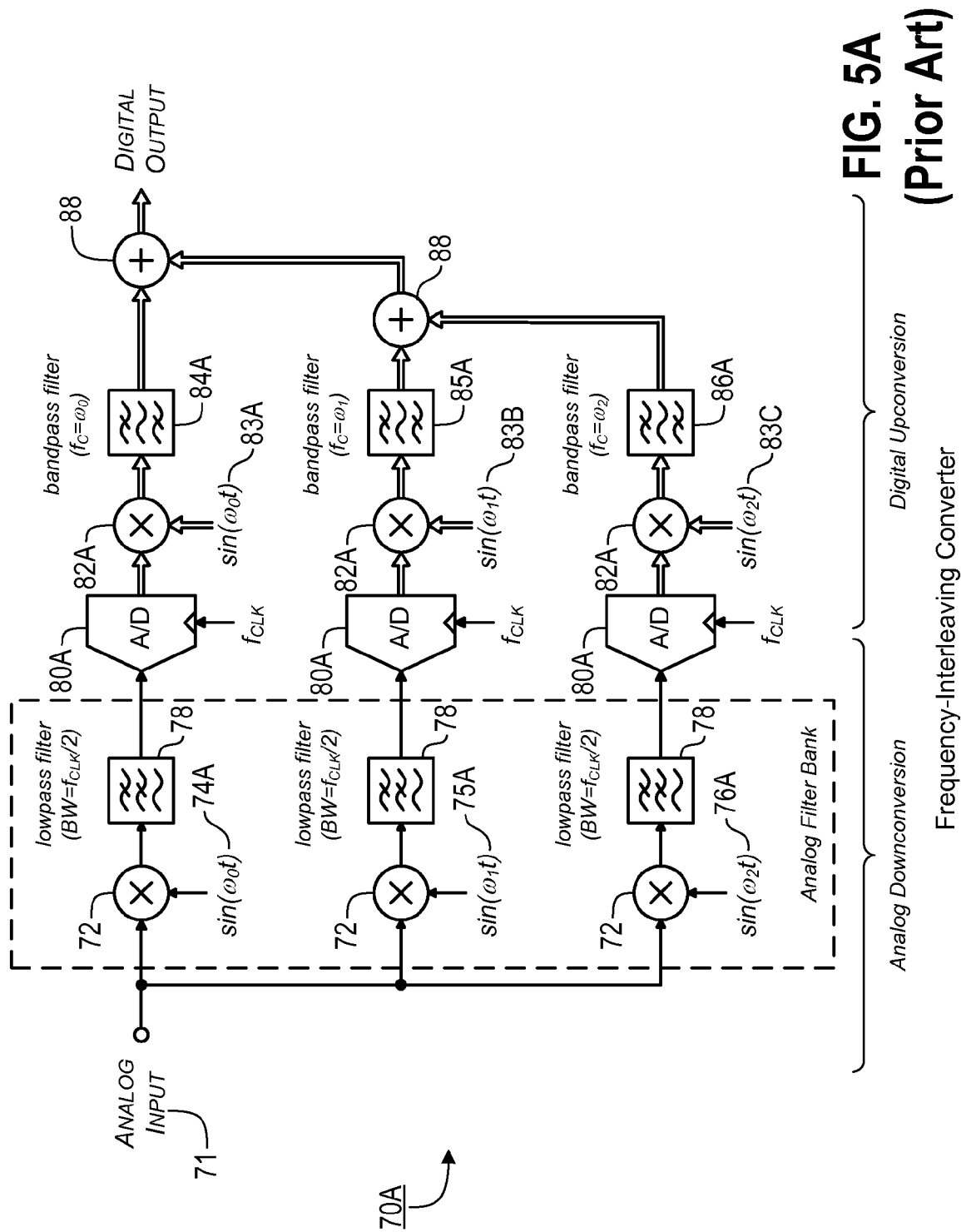
FIG. 5A is a block diagram of a conventional frequency-interleaving converter.
Figure 5B:
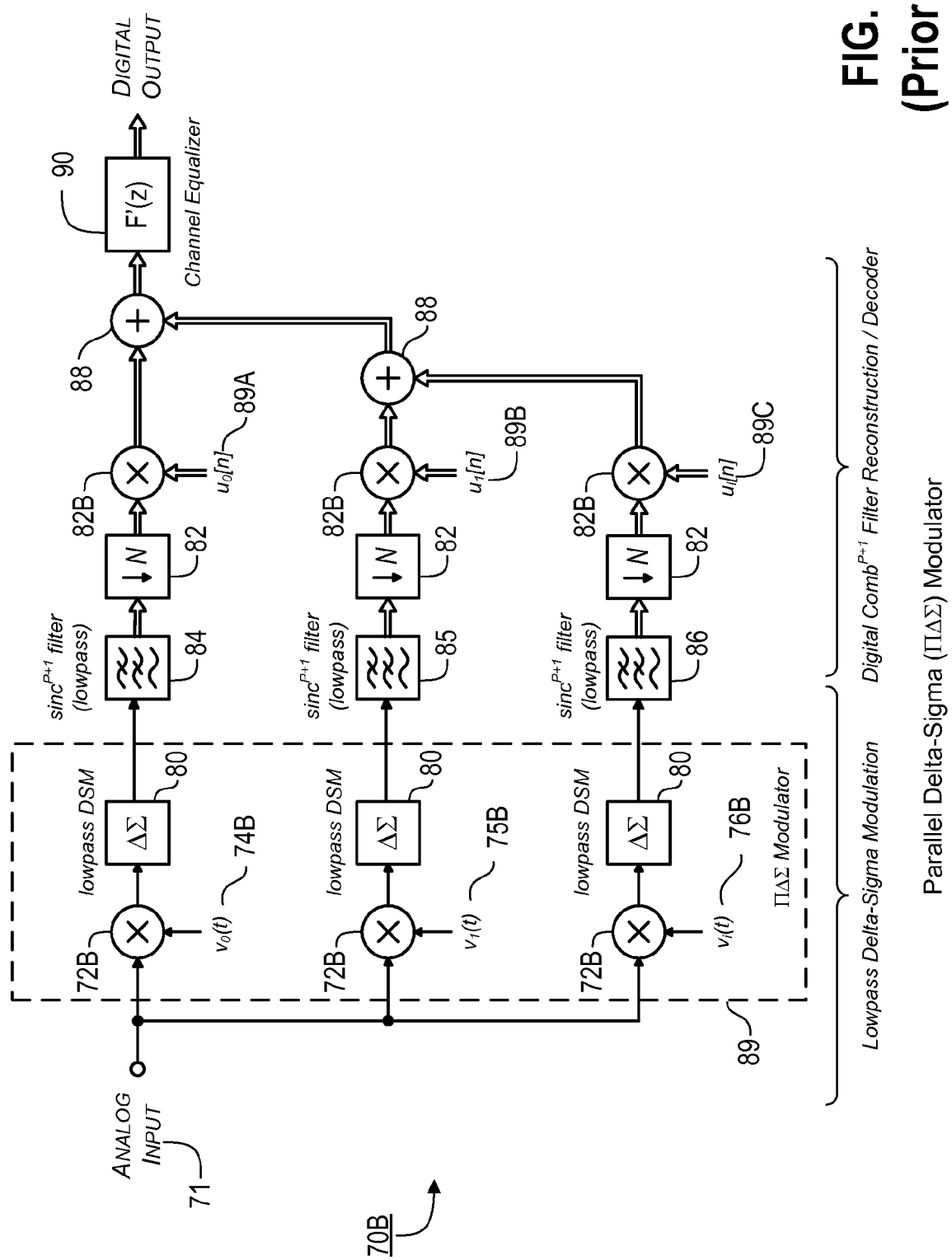
FIG. 5B is a block diagram of a conventional parallel delta-sigma modulator converter (ΠΔΣ ADC).

The present disclosure is related to the disclosure set forth in the application by the present inventor, titled "Multimode Sampling/Quantization Converters", which is being filed on the same day as the present application. The foregoing application is incorporated by reference herein as though set forth herein in full.

A preferred converter according to the present invention uses a technique that sometimes is referred to herein as Multi-Channel Bandpass Oversampling (MBO). Such a technique shares some structural similarities with conventional parallel delta-sigma ($\Pi\Delta\Sigma$) and multiband delta-sigma (MB$\Delta\Sigma$) analog-to-digital converters, in that the MBO converter also consists of multiple, parallel, oversampling converters. However, a MBO converter according to the preferred embodiments of the present invention incorporates one or more of the following technological innovations to improve instantaneous bandwidth and resolution: 1) continuous-time, Diplexing Feedback Loops (DFLs) are used in place of delta-sigma ($\Delta\Sigma$) modulators, e.g., to improve quantization noise shaping at very high converter sample rates; 2) bandpass (preferably second-order or higher) oversampling eliminates the need for analog downconversion using sinusoidal waveforms or Hadamard sequences (e.g., as in $\Pi\Delta\Sigma$ converters); 3) Bandpass Moving-Average (BMA) filter banks are used in place of decimating comb$^{P+1}$ filters (i.e., $\Pi\Delta\Sigma$), conventional FIR filter banks (i.e., MB$\Delta\Sigma$), or Hann window function FIR filters to minimize phase and amplitude distortion and significantly reduce signal-processing complexity; 4) a nonlinear bit-mapping function is applied to the output of the sampling/quantization circuit so that errors made in converting the digital output of the sampling/quantization circuit to an analog feedback signal are subjected to a noise-shaped response; and/or 5) active noise shaping circuit calibration is employed to reduce conversion performance losses caused by mismatches between the notch frequencies ($f_{notch}$) of the noise shaping circuit (preferably, a DFL) and the center frequencies of the signal reconstruction (preferably BMA) filters. Such techniques can in some respects be thought of as a unique and novel method of combining two distinct conventional techniques—continuous-time, bandpass oversampling and multichannel, frequency-interleaving. As discussed in more detail below, the use of such techniques often can overcome the problems of limited conversion resolution and precision at very high instantaneous bandwidths.

Simplified block diagrams of converters 100A-D according to certain preferred embodiments of the present invention are illustrated in FIGS. 6A-D, respectively. In the preferred embodiments, converters 100A-D separately processes M different frequency bands for a continuous-time continuously variable signal 102, using a separate branch (e.g., branch 110 or 120) to process each such band, and then sum up all the branch outputs in an adder 131 in order to provide the output digital signal 135. In one embodiment of the invention, the M different frequency bands are orthogonal, or at least approximately orthogonal, with respect to the converter output data rate. More specifically, the signal 102 is input on a line 103 that could be implemented, e.g., as a physical port for accepting an external signal or as an internal wire, conductive trace or a similar conductive path for receiving a signal from another circuit within the same device. In the present embodiment, the input signal 102 is provided directly to each of the branches (e.g., branches 110 and 120). However, in alternate embodiments the input line 103 can be coupled to such branches in any other manner. As used herein, the term "coupled", or any other form of the word, is intended to mean either directly connected or connected through one or more other processing blocks, e.g., for the purpose of preprocessing. It should also be noted that any number of branches may be used and, as discussed in more detail below, increasing the number of branches generally increases the resolution of the converters 100A-D.

In any event, in the present embodiment each such branch (e.g., branch 110 or 120) primarily processes a different frequency band and includes: 1) a Diplexing Feedback Loop (e.g., DFL 113 or 123 of converters 100A&C) or other quantization-noise-shaping circuit (e.g., circuit 113 or 123 of converter 100B, either or both potentially being a conventional discrete-time or continuous-time quantization-noise-shaping circuit); 2) a sampling/quantization circuit 114; and 3) a Bandpass Moving-Average (BMA) reconstruction filter (e.g., BMA filter 115 or 125 of converters 100B&C) or other bandpass reconstruction filter (e.g., filter 115 or 125 of converter 100A). Each quantization-noise-shaping circuit (e.g., circuit 113 or 123) realizes a quantization noise response (NTF) with a minimum (i.e., notch or null) at or near the frequency band(s) (more preferably, the center of the frequency band(s)) that is/are intended to be processed by its respective branch. Each sampling/quantization circuit 114 preferably is identical to the others and is implemented as a single-bit quantizer, sometimes referred to herein as a hard limiter, or a multi-bit quantizer. When the sampling/quantization circuit 114 is implemented as a multi-bit quantizer, each branch preferably incorporates a nonlinear bit-mapping function (e.g., circuit 112 of converter 100D), so that the digital input to the reconstruction filter (e.g., conventional filter 115 or 125 of converter 100D) accurately represents the analog signal that is fed back into the continuous-time quantization-noise-shaping circuit (e.g., conventional circuit 113 or 123 of converter 100D).

According to the representative embodiments of converters 100A&C and as discussed in greater detail below, the signal input into sampling/quantization circuit 114 and the signal output by sampling/quantization circuit 114 preferably are fed back, diplexed (i.e., independently filtered, combined, and then optionally jointly filtered), and combined with the input signal 102 so that quantization errors in earlier samples can be taken into account in generating later quantized samples (i.e., noise shaping using a Diplexing Feedback Loop). In the alternate embodiments of exemplary converter 100B, however, quantization errors and noise are shaped using a conventional means, such as discrete-time or continuous-time $\Delta\Sigma$ modulation. Each digital bandpass filter, preferably a Bandpass Moving-Average filter according to the representative embodiments of converters 100B&C (e.g., filter 115 or 125), selects out the frequency band being processed within its respective branch. As shown in FIGS. 6B&C, each such filter (e.g., 115 or 125) preferably includes a quadrature frequency downconverter (e.g., using multipliers 118A&B or 128A&B) having in-phase and quadrature outputs, a moving-average filter (e.g., 116A or 126A) coupled to the in-phase output of the quadrature frequency downconverter, a moving-average filter (e.g., 116B or 126B) coupled to the quadrature output of the quadrature frequency downconverter, and a quadrature frequency upconverter (e.g., using multipliers 118C&D or 128C&D) coupled to outputs of such moving-average filters, with the downconverter and upconverter using cosine and sine sequences, respectively, having a frequency corresponding to the minimum in the quantization noise transfer function. In alternative embodiments, such exemplary converter 100A, the frequency band being processed within a respective branch is selected out using a conventional filter, such as a transversal FIR filter. The adder 131, which can be implemented, e.g., as a single adder with multiple inputs or as a series of two-input adders, combines the outputs of the digital bandpass filters.

For applications requiring maximum possible sample rate (i.e., instantaneous bandwidth) and minimum circuit complexity, use of a hard limiter for the sampling/quantization circuits 114 generally is preferred. In addition, use of a hard limiter has the advantage that the two-level (digital) output of the hard limiter can be converted to an analog feedback signal (i.e., digital-to-analog conversion) without introducing the differential nonlinearities or rounding errors (as opposed to quantization noise) associated with the digital-to-analog (D/A) conversion of multi-bit quantizer outputs. At the expense of instantaneous bandwidth and circuit complexity, however, use of multi-bit quantizers potentially can improve converter resolution and reduce sensitivity to sampling jitter (i.e., variations in sampling interval), provided that the differential nonlinearities associated with D/A conversion are mitigated though some means such as precision manufacturing (e.g., to reduce component tolerances), component calibration, or preferably, nonlinear compensation. According to the representative embodiments of converter 100D, nonlinear compensation preferably is realized by applying a nonlinear bit-mapping function 112 to the output of sampling/quantization circuit 114. Nonlinear bit-mapping function 112 replicates the nonlinearities at the output of digital-to-analog converter (DAC) 111, such that the input to the reconstruction filter (e.g., filter 115 and 125) is a more precise digital representation of the actual analog signal that is fed back into continuous-time quantization-noise-shaping filter (e.g., filter 113 or 123). A more precise digital representation of the analog feedback signal ensures that quantization errors in earlier samples are accurately taken into account in generating later quantized samples to effectively subject feedback DAC nonlinearities to the noise-shaped response of the quantization-noise-shaping filter.

In the preferred embodiments, the sample rate $f_S$ of the individual sampling/quantization circuits 114 is equal, or nearly equal (e.g., within 20, 30, 40 or 50%), to the conversion-rate frequency $f_{CLK}$ (i.e., output data rate) for the converters 100A-D as a whole, meaning that no downsampling is performed (i.e., $$N = \frac{1}{2} \cdot f_S / f_B = 1),$$

although in alternate embodiments it might be desirable to perform some (e.g., limited, such as by a factor of no more than 2 or 4) downsampling. At the same time, a desired overall effective resolution of the converters 100A-D generally can be achieved, independent of the sample rate ($f_S$), by appropriately selecting design parameters such as the number of processing branches M (corresponding to the number of individual frequency bands processed) and the quality of the filters used (e.g., the order of the noise-shaped response and the stopband attenuation of the bandpass reconstruction filter).

Noise Shaping Considerations

Figure 6A:
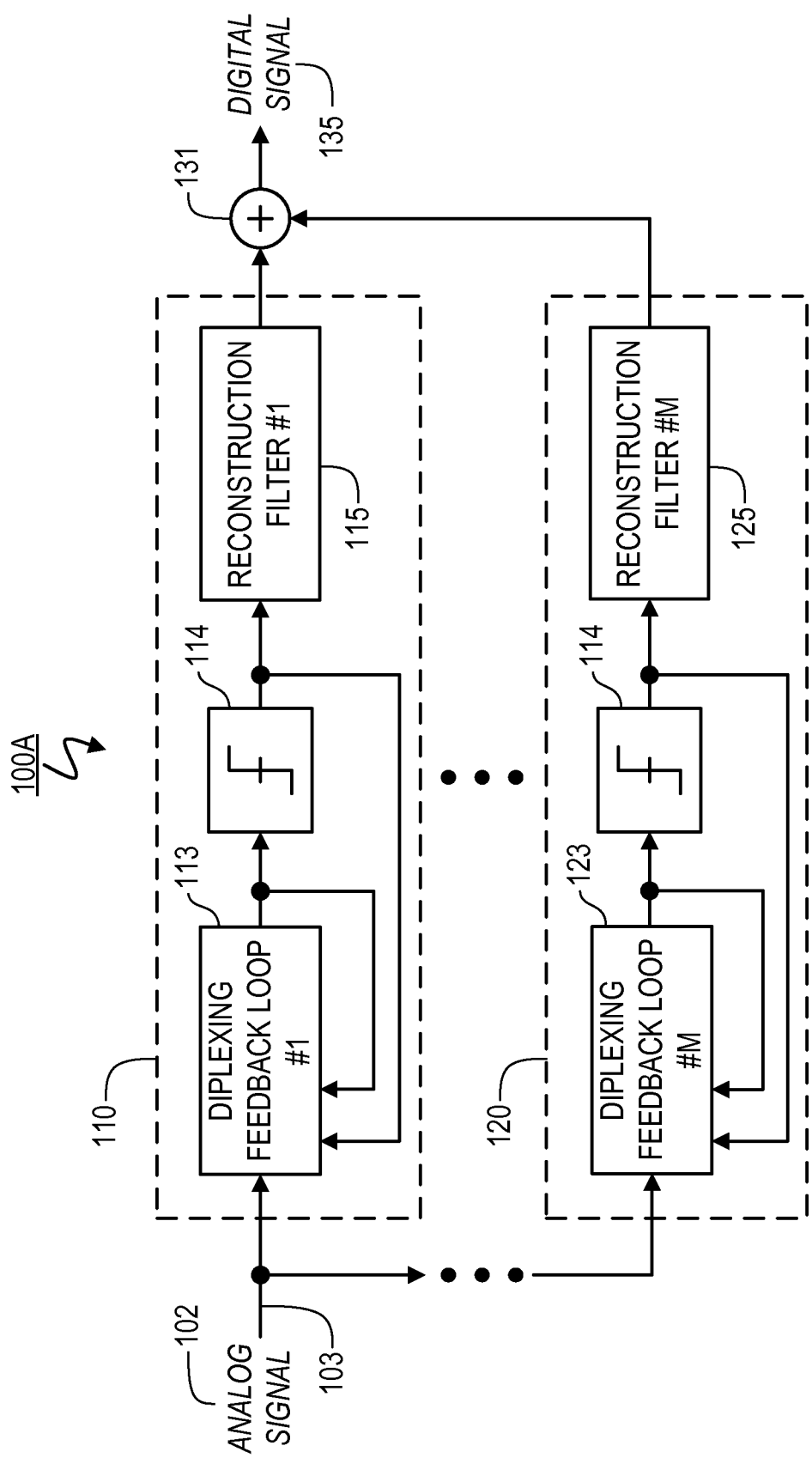
FIG. 6A is a simplified block diagram of a Multi-Channel Bandpass Oversampling (MBO) converter according to one representative embodiment of the present invention that employs a Diplexing Feedback Loop for noise shaping.
Figure 6B:
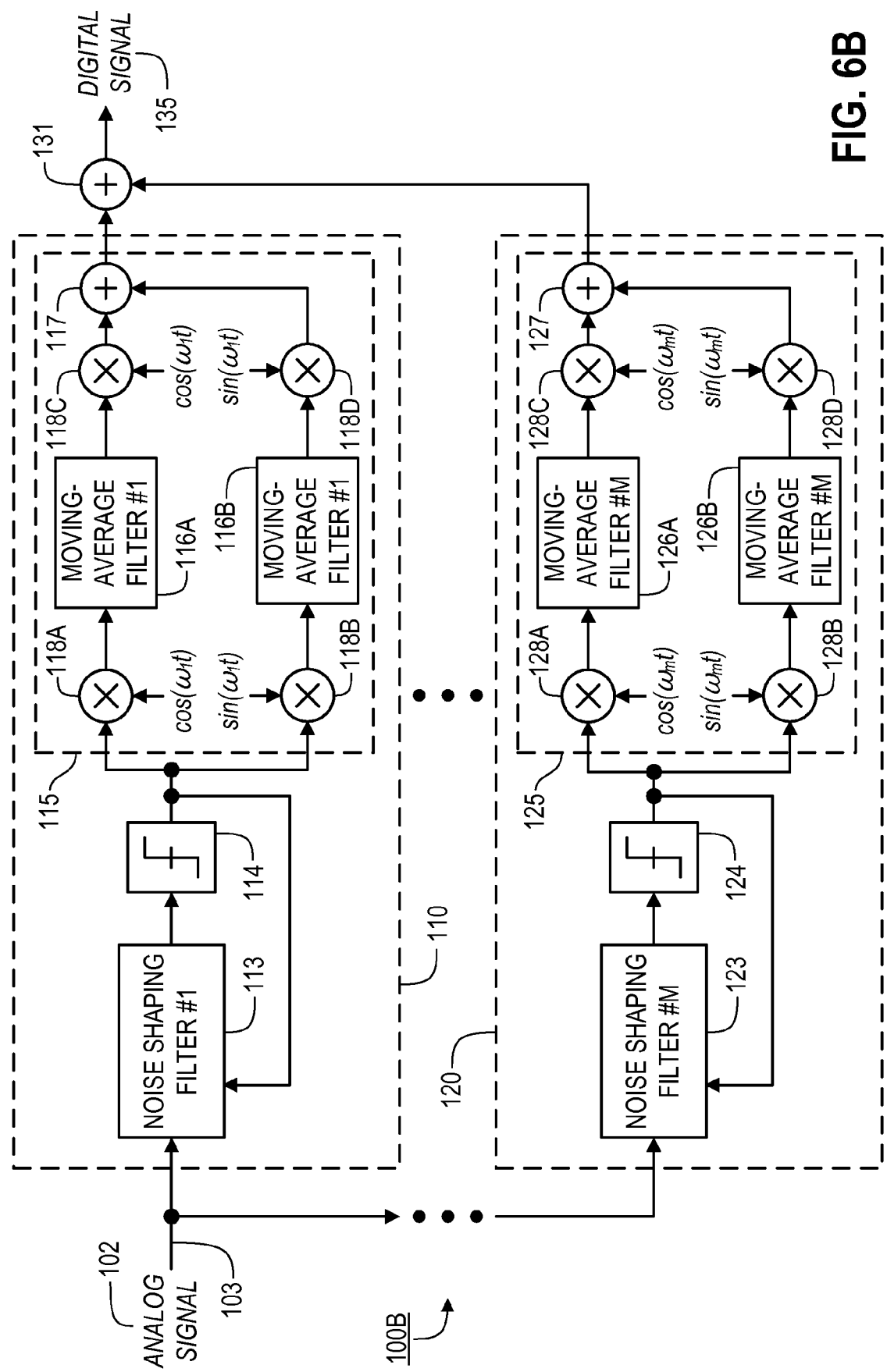
FIG. 6B is a simplified block diagram of a Multi-Channel Bandpass Oversampling (MBO) converter according to a second representative embodiment of the present invention that employs a Bandpass Moving-Average filter for signal reconstruction.
Figure 6C:
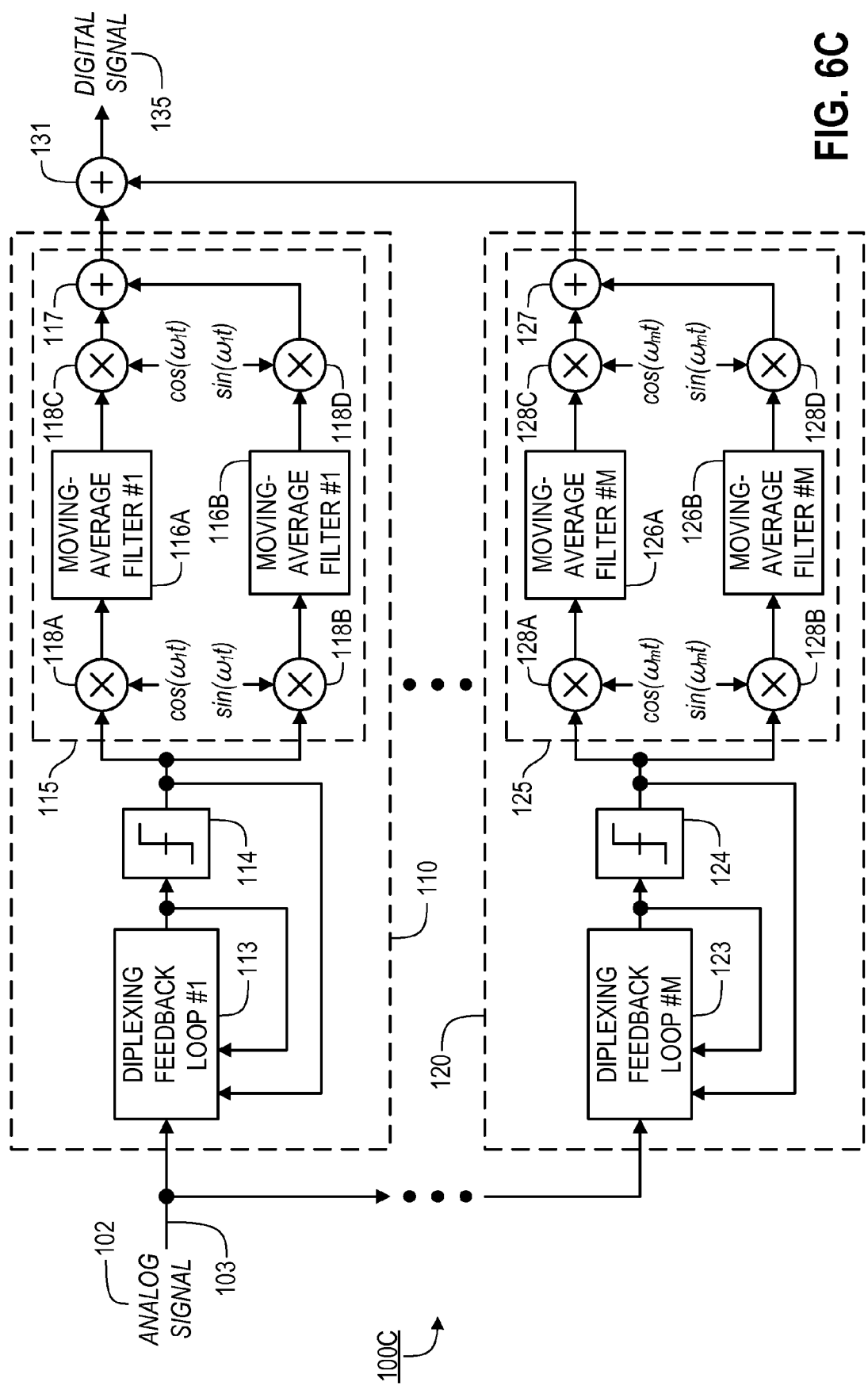
FIG. 6C is a simplified block diagram of a Multi-Channel Bandpass Oversampling (MBO) converter according to a third representative embodiment of the present invention that employs a Diplexing Feedback Loop for noise shaping and a Bandpass Moving-Average filter for signal reconstruction.
Figure 6D:
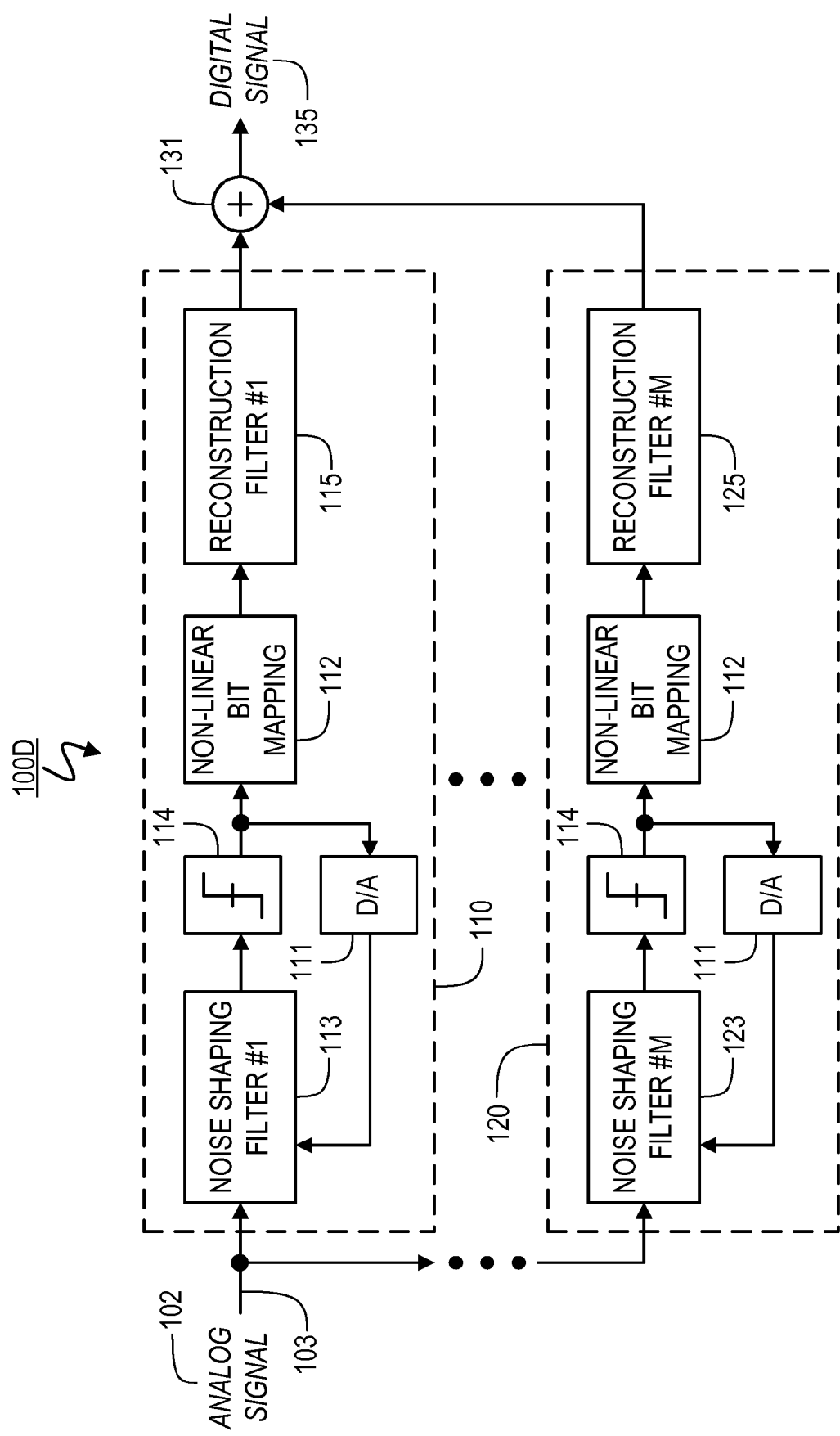
FIG. 6D is a simplified block diagram of a Multi-Channel Bandpass Oversampling (MBO) converter according to a fourth representative embodiment of the present invention that employs a multi-bit sampling/quantization circuit and feedback digital-to-analog converter (DAC) in conjunction with a nonlinear bit mapping function.

In the preferred embodiments, each of the circuits used for shaping quantization noise (e.g., circuits 113 and 123) is a DFL because such a circuit has been found to achieve the best combination of effectiveness, ease of construction and ease of configuration (i.e., converters 100A&C of FIGS. 6A&C). However, it should be noted that it is possible, as in the representative embodiment of converter 100B (i.e., illustrated in FIG. 6B), to use other kinds of circuits for noise shaping, such as conventional discrete-time or continuous-time delta-sigma (Δs) modulators. In any event, the primary considerations for the quantization-noise-shaping circuits to be used preferably derive from the desire for stable and accurate operation at very high sample rates. Therefore, each quantization-noise-shaping circuit according to the preferred embodiments has at least the following three properties: 1) the primary performance impairments of the quantization-noise-shaping circuit, such as those related to settling-time errors, sampling uncertainty/jitter, thermal noise, and quantization/rounding errors, are subject to a noise-shaped response and/or bandlimiting; 2) the performance of the quantization-noise-shaping circuit is relatively insensitive to non-ideal circuit behavior and excess feedback loop delay; and 3) the quantization-noise-shaping circuit can be implemented using high-frequency design techniques, such as those utilizing distributed-element circuits and monolithic microwave integrated circuits (MMICs). Achieving these properties generally precludes the use of conventional delta-sigma modulators for the noise shaping operation of the preferred embodiments.

For instance, the conventional DT ΔΣ modulator generally is not preferable for use in the MBO converter because the auxiliary (explicit or implicit) sample-and-hold operation of the DT ΔΣ modulator introduces impairments, such as settling-time errors, output droop, and nonlinear distortion, that are not subject to a noise-shaped response and, therefore, limit the performance of the DT ΔΣ modulator at high frequencies. In addition, the operating frequency of the DT ΔΣ modulator is limited by the sampling speed of the auxiliary, high-precision sample-and-hold operation.

In general, the conventional CT ΔΣ modulator is not preferable for use in the MBO converter because, although the impairments of the single, coarse sampling/quantization operation can be subjected to a noise-shaped response, the feed-forward filtering (i.e., for noise integration) of the conventional CT ΔΣ modulator generally requires (1) high-linearity, transconductance stages (i.e., current sources); (2) high-gain operational amplifiers (i.e., voltage sources); (3) high-quality (Q), lumped-element parallel resonators (i.e., discrete inductors and capacitors); and/or (4) feedback digital-to-analog converters (DACs) that use twice rate clocks to produce return-to-zero (RZ) and half-delayed return-to-zero (HRZ) outputs. Although a CT ΔΣ modulator can operate at higher frequencies than the DT ΔΣ modulator, due to the absence of an auxiliary sample-and-hold function, the performance of CT ΔΣ modulator implementations is limited by imperfect integration related to the non-ideal behavior of the active and reactive lumped circuit elements that comprise the continuous-time filter in the modulator feed-forward path, particularly when operating at very high sample rates. At very high frequencies, such as microwave frequencies, lumped-element devices instead behave like distributed-element devices: 1) the output impedance degradation of transconductance stages and limited gain of operational amplifiers cause them to behave less like current or voltage sources and more like basic amplifiers (i.e., power output versus current or voltage output); and 2) the parasitic impedances of reactive components, like inductors and capacitors, cause them to behave like low-Q series or parallel resonators. Still further, the non-ideal behavior of lumped circuit elements degrades the linearity and bandwidth of the feed-forward filter and thereby limits the operating frequency of the CT ΔΣ modulator.

Other problems with the CT ΔΣ modulator are that: (i) the settling errors and sampling jitter of the clocked feedback digital-to-analog converter (DAC) are not subjected to a noise-shaped response or otherwise mitigated, and (ii) the feedback (excess) loop delay introduced by the finite settling time of the feedback DAC degrades the stability and quality of the noise-shaped response by increasing the order of an interpolative modulator. The conventional solution to the latter problem of feedback loop delay is to bring multiple feedback paths into the continuous-time, feed-forward filter using clocked DACs that produce different output waveforms, such non-return-to-zero (NRZ), return-to-zero (RZ) and half-delayed return-to-zero (HRZ) pulses. See O. Shoaei, W. M. Snelgrove, "A Multi-Feedback Design for LC Bandpass Delta-Sigma Modulators", Proceedings International Symposium on Circuits and Systems, Vol. 1, 1995. However, at very high sampling frequencies, this solution only aggravates existing performance limitations related to the non-ideal behavior of the active and reactive lumped circuit elements comprising the feed-forward filter and complicates problems associated with DAC settling errors and sampling jitter.

Instead, the present inventor has discovered a new technique for shaping quantization and other noise, referred to herein as a Diplexing Feedback Loop (DFL), that, compared to conventional delta-sigma modulators, incorporates several significant technological innovations to improve operating frequency and performance stability. First, the DFL operates as a continuous-time circuit (i.e., processing continues-time continuously variable signals), as opposed to a discrete-time circuit. Thus, there is no high-precision, auxiliary sample-and-hold function (explicit or implicit), or clocked feedback DAC function, that limits speed and accuracy. Unlike conventional CT ΔΣ modulators that required clocked feedback DACs to produce RZ and HRZ outputs, the discrete-time input of the DFL's feedback DAC is transparently converted to a continuous-time output, eliminating the jitter errors associated with clocked (i.e., edge-triggered) DAC devices. Second, the DFL can be configured to produce bandpass (e.g., second order or higher) noise-shaped responses or lowpass noise-shaped responses. Thus, the DFL noise shaper has utility in converter applications where the input signal is not centered at zero frequency. Third, the DFL employs passive feedback filter (diplexer) structures to realize perfect integrators that produce quantization noise notches at pre-selected frequencies, but are relatively insensitive to excess feedback loop delay because feedback delay is fundamental to the integration operation. These passive filters are capable of high-frequency operation because they can be implemented using distributed-element and microwave design techniques. Fourth, the DFL can employ tunable feedback elements for dynamic calibration of the quantization noise transfer function (NTF). Thus, the performance of the noise shaper can be made significantly less sensitive to component or manufacturing tolerances. Fifth, the architecture of the DFL is such that the nonlinear distortion of the digital-to-analog conversion operation in the feedback path (feedback DAC) can be mitigated by using active calibration or by predistorting the quantizer output e.g., using nonlinear bit-mapping). Therefore, impairments introduced by feedback DAC can be significantly attenuated during the signal reconstruction process. For these reasons, among others, the preferred embodiment of the MBO converter uses the DFL approach for shaping quantization and other noise.

Figure 7:
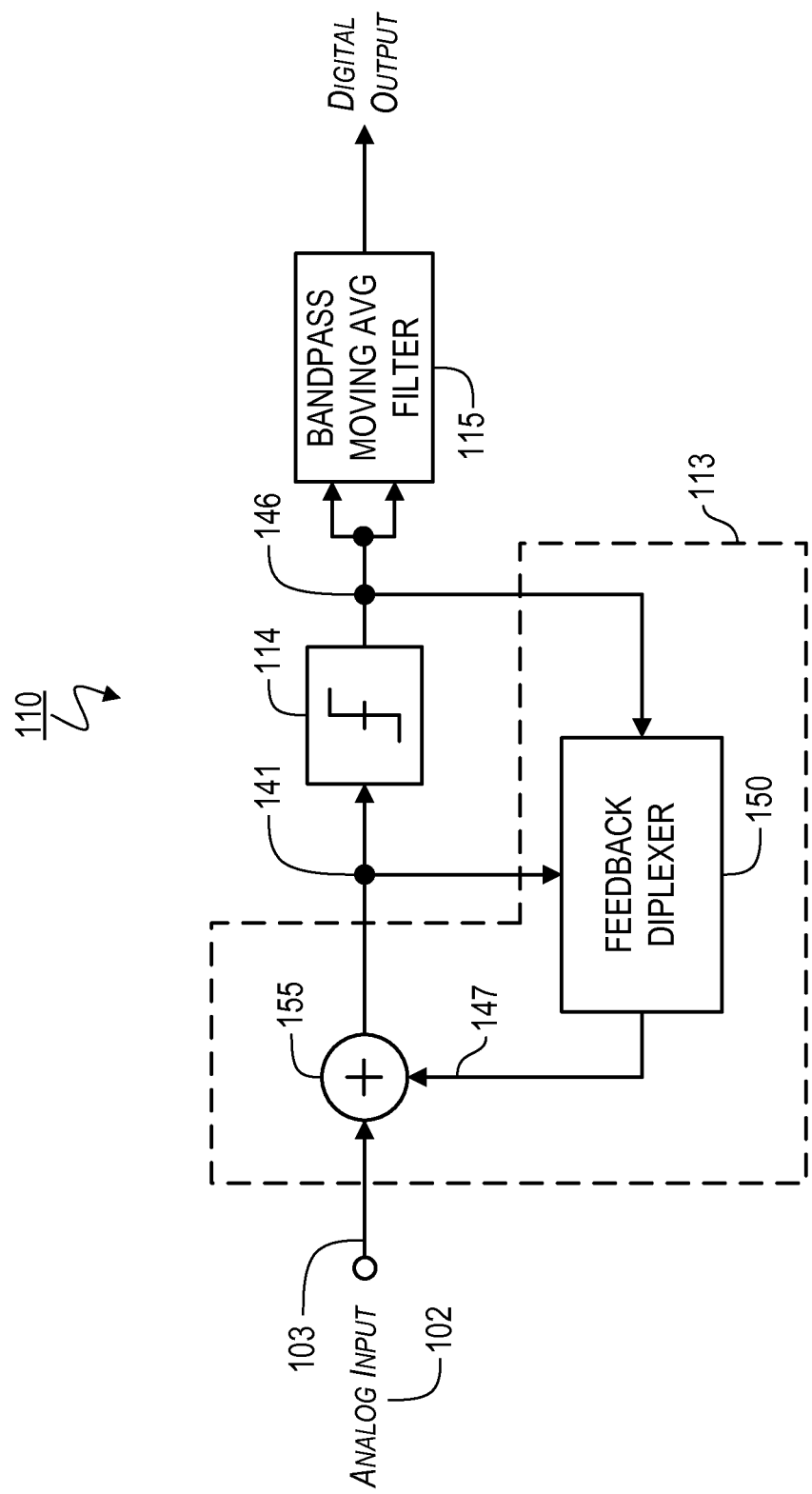
FIG. 7 is a more detailed block diagram of an exemplary MBO processing branch according to a representative embodiment of the present invention.

A simplified block diagram of a MBO processing branch having a Diplexing Feedback Loop 113 that utilizes a feedback diplexer 150 is shown in FIG. 7. As illustrated, the feedback diplexer 150 inputs the signal 141 that is input into sampling/quantizing circuit 114, inputs the signal 146 that is output from sampling/quantizing circuit 114, and outputs a correction signal 147 that is additively combined (in adder 155) with the signal on input line 103. Preferably, signal 147 is produced by separately filtering signals 141 and 146 and then additively combining the filtered signals.

Figure 8A:
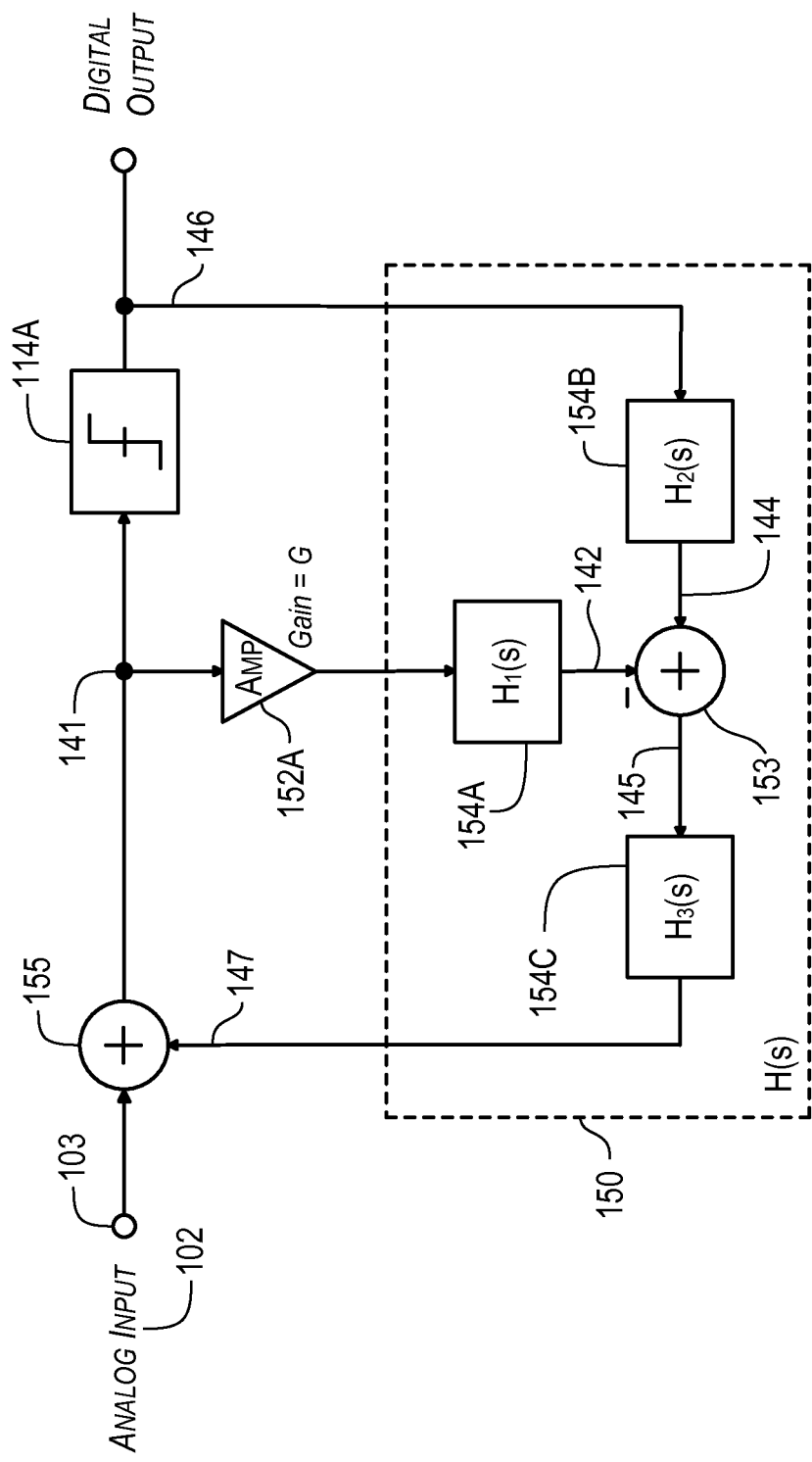
FIG. 8A is a block diagram illustrating a Diplexing Feedback Loop (DFL) according to a representative embodiment of the present invention that employs single-bit quantization and a feedback diplexer to produce quantization noise response minima at arbitrary frequencies, with signal amplification occurring at the input of the feedback diplexer.
Figure 8B:
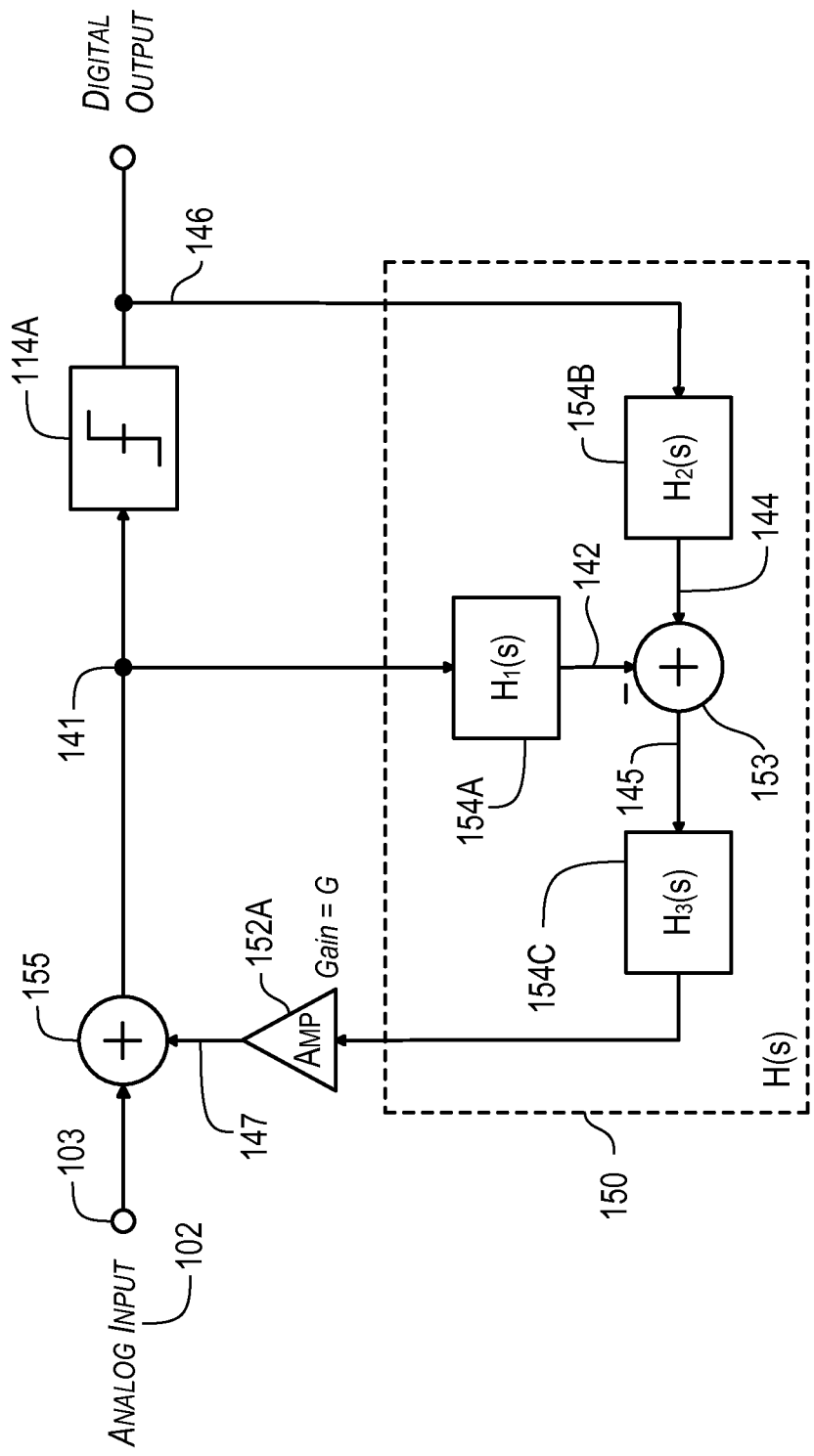
FIG. 8B is a block diagram illustrating a Diplexing Feedback Loop (DFL) according to a representative embodiment of the present invention that employs single-bit quantization and a feedback diplexer to produce quantization noise response minima at arbitrary frequencies, with signal amplification occurring at the output of the feedback diplexer.
Figure 8C:
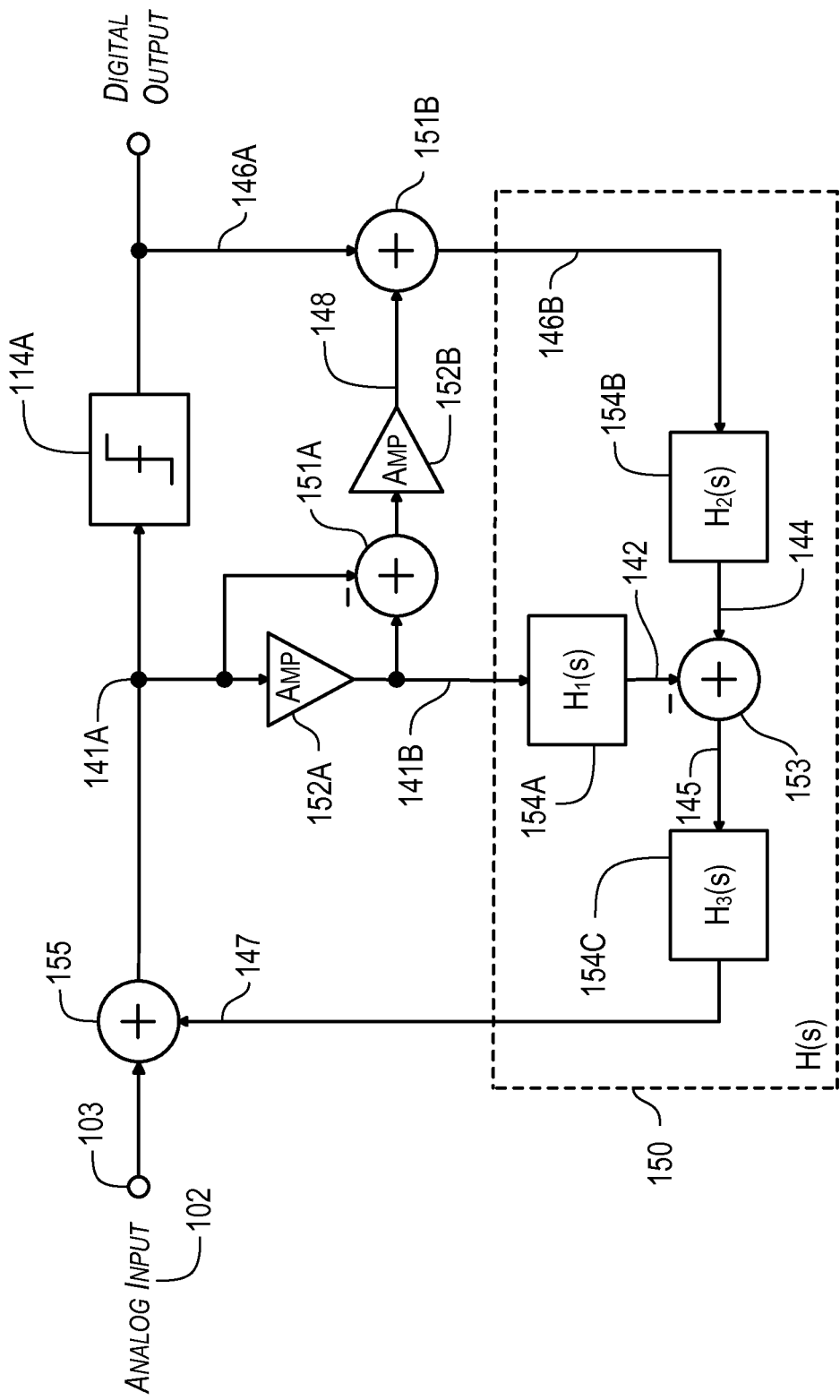
FIG. 8C is a block diagram illustrating a Diplexing Feedback Loop (DFL) according to a representative embodiment of the present invention that employs single-bit quantization, active feedback gain with distortion mitigation, and a feedback diplexer to produce quantization noise response minima at arbitrary frequencies.
Figure 8D:
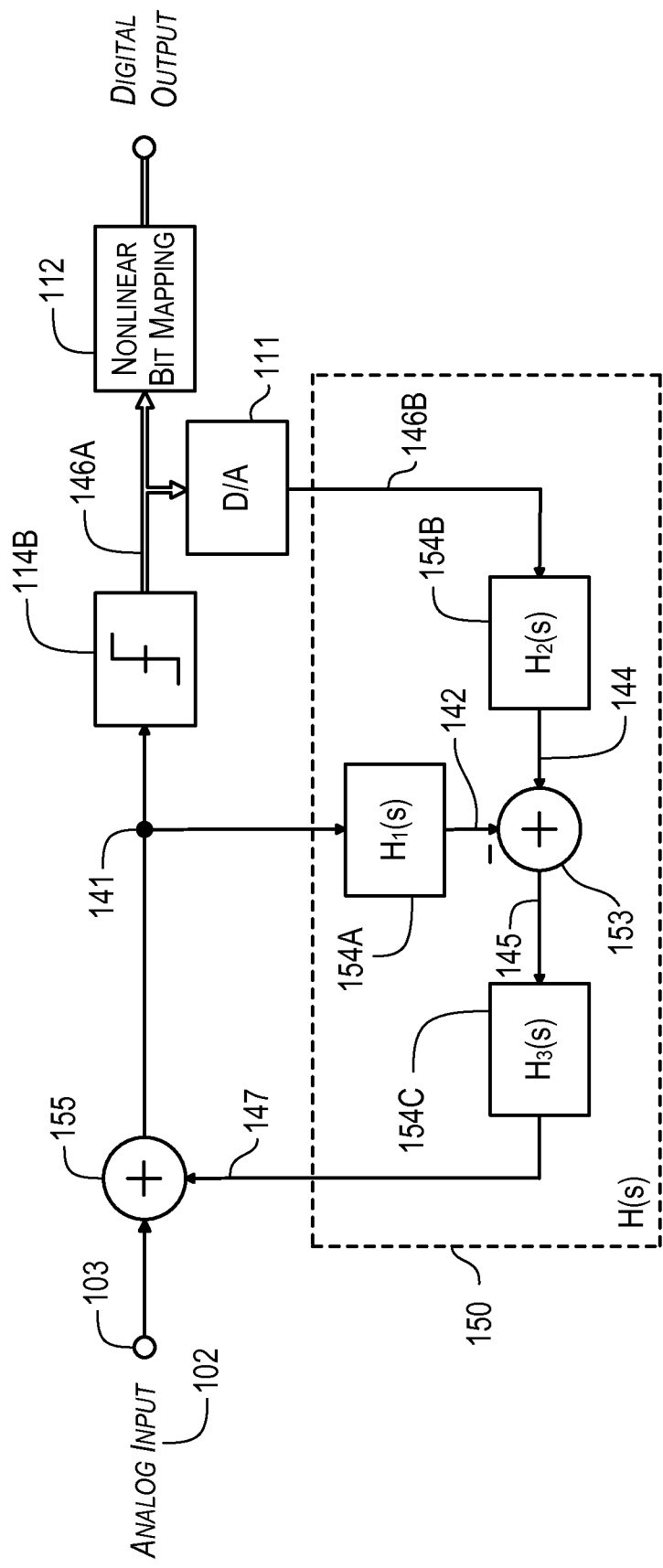
FIG. 8D is a block diagram illustrating a Diplexing Feedback Loop (DFL) according to a representative embodiment of the present invention that employs multi-bit quantization, with nonlinear bit mapping, and a feedback diplexer to produce quantization noise response minima at arbitrary frequencies.

Simplified block diagrams of exemplary DFLs, employing a feedback diplexer 150 in combination with a single-bit sampling/quantization circuit 114A, are shown in FIGS. 8A&B; and a simplified block diagram of an exemplary DFL, employing a feedback diplexer 150, in combination with a multi-bit sampling/quantization circuit 114B, a nonlinear bit-mapping operation 112, and digital-to-analog converter 111, is shown in FIG. 8D. For embodiments employing a multi-bit sampling/quantization circuit, the improved circuit described in the '668 application is preferred. However, it is also possible to use any other multi-bit sampling/quantization circuit, such as the conventional circuit described in the '668 application. In the preferred embodiments of the invention, the shaping of quantization noise is continuous-time and does not employ any filtering in the modulator feed-forward path (between adder 155 and sampler/quantization circuit 114A or 114B).

Referring to DFL feedback diplexer 150 in FIG. 8A, a signal 141 (that is output from adder 155 and input into sampler/quantizer 114A) is amplified using feedback amplifier 152A with gain G, and independently filtered 154A, using a filter transfer function $H_1(s)$, thereby resulting in signal 142. As will be readily appreciated, the feedback gain can be integrated into diplexer response 154A without loss of generality, or as illustrated in FIG. 8B, can be moved to the output of feedback diplexer 150 (i.e., or equivalently, integrated into diplexer response 154C). Placing the feedback gain at the input of feedback diplexer 150 minimizes additive noise, and placing the feedback gain at the output of feedback diplexer 150 reduces the output drive level required of amplifier 152A. At the same time, the output of sampler/quantizer 114A is independently filtered 154B, using a filter transfer function $H_2(s)$, thereby resulting in signal 144. Then, signal 142 is subtracted from signal 144 in subtractor 153, and the resulting combined signal 145 is filtered 154C, using a filter transfer function $H_3(s)$, thereby resulting in signal 147. Finally, signal 147 is combined with the input signal 102 in adder 155. The process of independently filtering signals and then combining them sometimes is referred to in the prior art as diplexing. In the present embodiment, filters 154A-C include just basic amplifiers, attenuators, distributed delay elements, and reactive components. Depending upon the filter parameters, filters 154A&B can be all-pass or can have appreciable magnitude variation across the relevant bandwidth that is being processed in the corresponding processing branch.

Imperfections in amplifier 152A cause its gain to vary as a function of its input signal amplitude (i.e., the gain is not constant). More specifically, limited supply-voltage headroom causes the large-signal gain of amplifier 152A to be lower than the small-signal gain of amplifier 152A (i.e., gain decreases as the input signal level increases). This varying gain phenomenon, referred to in the prior art as gain compression or AM-AM conversion, introduces nonlinear distortion that is not subjected to the noise-shaped response of the DFL, and therefore, increases the quantization noise at the output of the bandpass reconstruction filters (e.g., filters 115 and 125 in FIGS. 6A&B). The present inventor has discovered means for mitigating the nonlinear distortion of amplifier 152A. One such mitigation means, illustrated in FIG. 8C, uses subtractor 151A and amplifier 152B to create a replica (i.e., signal 148) of the nonlinear distortion introduced by amplifier 152A. The replicated nonlinear distortion is summed with the output of quantizer 114B, using adder 151B, and eventually is cancelled in subtractor 153 (i.e., after filtering by diplexer response 154B). Although the nonlinear distortion of amplifier 152B is not cancelled in the process (i.e., only the distortion from amplifier 152A is cancelled), amplifier 152B introduces significantly less nonlinear distortion compared to amplifier 152A, because amplifier 152B operates at much lower signal levels. These lower signal levels occur because the input to amplifier 152B is relatively low-level distortion (i.e., signal and noise being removed by subtractor 151A), and adder 151B isolates amplifier 152B from the output of quantizer 114 (i.e., signal 146A), which due to hard limiting, peaks at levels that are at least half as large as its input (i.e., signal 141A). In the preferred embodiments, the small-signal response of amplifiers 152A and 152B are matched, except that amplifier 152B has slightly higher gain to account for losses in subtractor 151A and adder 151B. Also, the preferred degree of matching ($\delta$) depends on the overall intended resolution (B) of the MBO converter, where generally $\delta=2^{-B}$.

Similar processing is illustrated in FIG. 8D as well. In that embodiment, however, a digital-to-analog converter (DAC) 111 is used to convert the multi-bit, binary-weighted, digital output of sampling/quantization circuit 114B into a binary-weighted, continuous-time signal that can be fed back into and processed by DFL feedback diplexer 150. Imperfect binary scaling in DAC 111, introduces nonlinear distortion that causes continuous-time signal 146B, that is fed back into diplexer 150, to differ from the discrete-time representation of that signal (i.e., signal 146A) at the output of quantizer 114B. Because discrete-time signal 146A at the output of quantizer 114B differs from the continuous-time version of that signal fed back into diplexer 150 (i.e., signal 146B), the present inventor has discovered that without adequate compensation, the nonlinear distortion introduced by DAC 111 degrades the effectiveness of the DFL noise shaping function and increases the quantization noise at the output of the bandpass reconstruction filters (e.g., filters 115 and 125 in FIGS. 6A&B). In the currently preferred embodiments of the invention, therefore, the nonlinear response of DAC 111 is compensated: 1) directly, by dynamically adjusting the DAC 111 binary scaling to minimize the quantization noise at the bandpass reconstruction filter (e.g., filter 115 and 125) output; and/or 2) indirectly, by introducing nonlinear bit-mapping component 112 between the quantizer 114B output and the bandpass reconstruction filter (e.g., filter 115 and 125) input. The purpose of nonlinear bit-mapping function 112 is to mimic the binary scaling imperfections (i.e., nonlinearities) of DAC 111, such that the discrete-time version of the signal at the bandpass reconstruction filter input (i.e., signal 146A) is more perfectly matched to the continuous-time version of the signal (i.e., signal 146B) that is fed back into diplexer 150. This ensures that quantization errors in earlier samples are accurately taken into account in generating later quantized samples. Again, the preferred degree of matching ($\delta$) depends on the overall, intended resolution (B) of the MBO converter, where generally $\delta=2^{-B}$. It is noted that any of the circuits illustrated in FIGS. 8A-D could be implemented as a stand-alone circuit or as part of a processing branch (e.g., branch 110 or 120) in any of circuits 100A-D (discussed above).

Figure 8E:
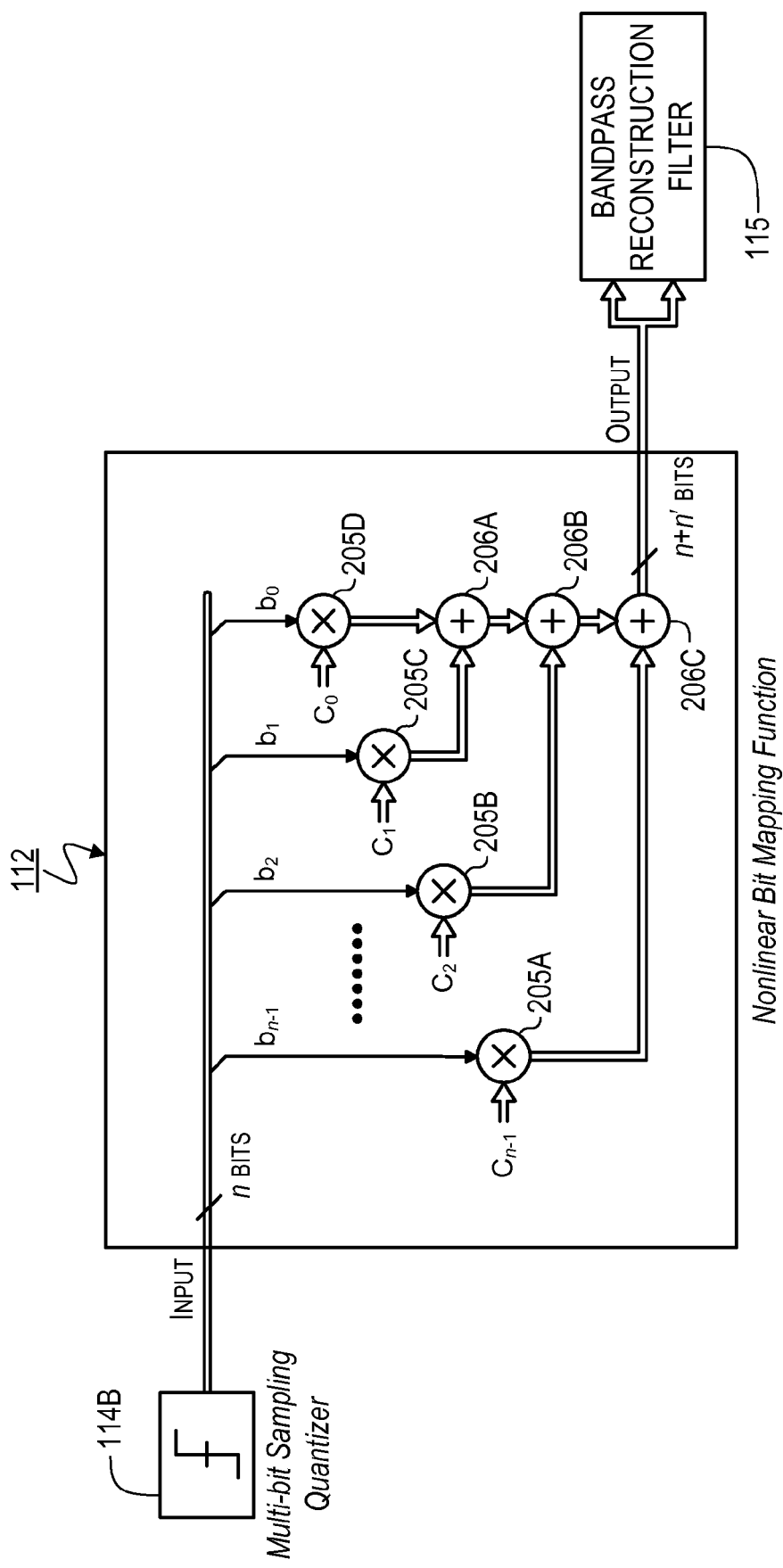
FIG. 8E is a block diagram illustrating a nonlinear bit-mapping function according to a representative embodiment of the present invention that uses digital multipliers and digital adders to produce nonlinear distortion.

An exemplary nonlinear bit-mapping circuit 112 is illustrated in FIG. 8E for the case of an n-bit quantizer. The output precision of nonlinear bit-mapping circuit 112 preferably is much greater than the input precision of the bit-mapping circuit. Nonlinear bit-mapping circuit 112, shown in FIG. 8E, has n input bits (i.e., $2^n$ representative input levels) and n+n' output bits (i.e., $2^{n+n'}=2^{n'} \cdot 2^n$ representative output levels), such that each of the $2^n$ input levels can be independently mapped to any one of $2^{n'}$ output levels. These additional levels (i.e., by a factor of $2^{n'}$) enable the nonlinear bit-mapping circuit to replicate imperfections in the binary scaling of DAC 111. Each bit from the output of quantizer 114B (i.e., each of bits $b_0$ to $b_{n-1}$) preferably is individually weighted (scaled) by a multi-bit factor ($C_0$ to $C_{n-1}$, respectively), thereby increasing its precision from one bit to multiple bits. In FIG. 8E, this multi-bit weighting operation is performed using digital multipliers 205A-D and digital adders 206A-C, but in alternative embodiments this weighting operation can be implemented by other conventional means, including digital memory devices (e.g., read-only or random-access memory) or digital multiplexers. Applying relatively high-precision weighting factors (i.e., n+n' bits of precision) to each such output bit from quantizer 114B, prior to passing the quantized signal to the bandpass reconstruction filter 115 input, makes it possible to more precisely match the binary scaling imperfections of DAC 111. More preferably, the precision of the weighting factors depends on the intended resolution (B) of the MBO converter, such that n+n'≈B.

More specifically, the non-linear bit mapping coefficients (i.e., weighting factors), $C_0 \ldots C_{n-1}$, shown in FIG. 8E, preferably are set so as to create bit-dependent, binary scaling offsets that coincide with the binary scaling offsets produced by mismatches in feedback DAC 111. If the DAC 111 binary scaling is perfect, then the nonlinear bit-mapping coefficients preferably reflect a perfect binary weighting (i.e., $C_2=2 \cdot C_1=4 \cdot C_0$). Otherwise the coefficient weighting is only approximately binary. Because uncompensated binary scaling errors increase residual quantization noise, the conversion noise introduced by sampling/quantization circuit 114B is a minimum when the bit-mapping coefficients and the actual DAC 111 scaling are perfectly aligned. Because the residual quantization (conversion) noise is additive with respect to the input signal, the overall signal-plus-noise level at the output of bandpass reconstruction filter 115 is also a minimum when the bit-mapping coefficients are perfectly aligned with the actual DAC 111 scaling. Therefore, in the preferred embodiments the quantization noise introduced by sampling/quantization circuit 114B is measured, or alternatively the overall signal-plus noise level (or strength) is measured at the output of the signal reconstruction filter 115, e.g., using a square-law operation, absolute-value operation, or other signal strength indicator, and then the nonlinear bit mapping coefficients $C_0 \ldots C_{n-1}$ are collectively altered until either of the measured levels (i.e., quantization noise or signal-plus-noise) is minimized, thereby minimizing conversion noise and distortion. In practice, the nonlinear bit-mapping coefficients $C_0 \ldots C_{n-1}$ preferably are calibrated once during a manufacturing trim operation, and then are dynamically adjusted in real time in order to account for variations due to changes in temperature and/or voltage. In the preferred embodiments, such dynamic adjustments are made on the order of once per second, so as to allow for a sufficient amount of time to evaluate the effect of any changes.

In the current embodiment, the quantization noise-shaped response resulting from the use of DFL feedback diplexer 150 can be configured to produce a minimum at a selected (e.g., predetermined) frequency. Preferably, the DFL feedback diplexer 150 first inputs the signals at the input and output of the sampler/quantizer (114A or 114B), and then filters or pre-processes those inputs to produce a correction signal 147 that is added to the current value of the continuous-time, continuously variable input signal 102. Generally speaking, the addition of the correction signal ensures that future sample values will compensate for earlier quantization errors, while the preprocessing of the quantization error prior to such addition ensures that the quantization noise introduced by sampler/quantizer 114 will be shifted away from the frequency band of the input signal that is being processed by the current processing branch (e.g., branch 110 or 120).

As will be readily appreciated, filter 154C can be moved upstream of adder 153 (e.g., one instantiation in each branch) and/or any portion or all of its desired transfer function can be incorporated (or integrated) into each of filters 154A&B. Also, the phase response of filter 154B, or any portion thereof, may be moved to the output (i.e., before the branch-off point of signal 146) of the sampling/quantization circuit 114A or 114B, or may be integrated with the sampling/quantization circuit 114A or 114B itself, without affecting the quality of the quantization-noise transfer function (NTF). In any event, the combined filtering performed on signal 141 is $H_1(s) \cdot H_3(s)$, and the combined filtering performed on signal 146 is $H_2(s) \cdot H_3(s)$. Each such combined filtering preferably produces frequency-dependent delaying (e.g., by less than or equal to twice the sampling period used in sampler/quantizer 114) and frequency-dependent amplification (e.g., by no more than 10 dB) over a bandwidth no greater than $f_S$, as discussed in greater detail below. At bandwidths much greater than two to three times $f_S$, feedback loop stability is ensured when such combined filtering preferably produces frequency-dependent delaying that approaches zero and frequency-dependent attenuation with a slope of 6 dB per octave to 30 dB per octave. Once again, the term "coupled", as used herein, or any other form of the word, is intended to mean either directly connected or connected through one or more other processing blocks, e.g., for the purpose of preprocessing. The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

Like the CT $\Delta\Sigma$ modulator, the DFL circuit, comprised of feedback diplexer 150 and quantizer 114, has the advantage that impairments related to the single, coarse sampling operation 114 can be subjected to the noise-shaped response of the circuit. Unlike the CT $\Delta\Sigma$ modulator, however, impairments related to the feedback digital-to-analog converter (DAC) 111 can also be mitigated using the DFL circuit with the inclusion of a nonlinear bit mapping function (i.e., circuit 112 in FIG. 8). Because of the arrangement of the individual diplexer filters 154A-C in the feedback path of the quantization-noise-shaping circuit, quantization noise notches are produced by filter structures with transmission zeros, instead of transmission poles. Therefore, unlike the CT $\Delta\Sigma$ modulator, the DFL does not require high-gain operational amplifiers (i.e., voltage sources) or high-linearity trans conductance stages (i.e., current sources) with high-Q parallel resonators. Instead, perfect integrators preferably are realized using only basic amplifiers (i.e., amplifiers with power output) with moderate gain that is sufficient to compensate for signal losses through the feedback loop of the DFL. Also, the feedback filter responses (e.g., the responses of feedback diplexer 150) can be produced by passive, distributed-element components such as transmission lines and attenuators. Furthermore, as discussed in greater detail below, sensitivities to component tolerances can be mitigated by using programmable gain elements (i.e., amplifiers and/or attenuators).

Figure 8F:
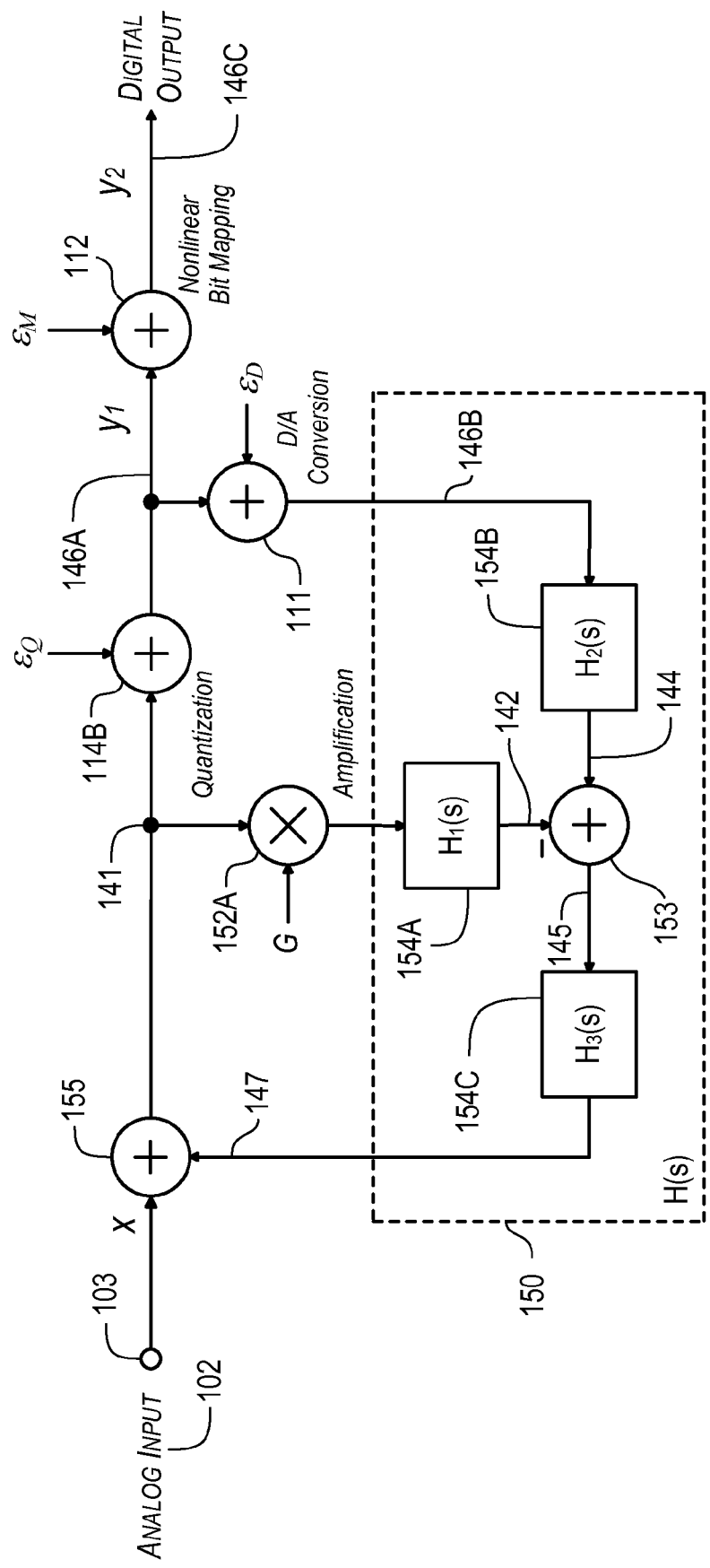
FIG. 8F is a block diagram illustrating a linearized model of a Diplexing Feedback Loop (DFL) according to a representative embodiment of the present invention that incorporates errors due to quantization, nonlinear bit mapping, and a feedback digital-to-analog (D/A) conversion.

Referring to the block diagram shown in FIG. 8F, the linearized signal transfer function (STF) between the input 103 and the output 146C is STF(s)≈1 (i.e., approximately all-pass). The linearized quantization-noise transfer function (NTF) between the quantization noise ($\epsilon_Q$) entry point and the output 146C is given by $$NTF(s) = \frac{1 + G \cdot H_1(s) \cdot H_3(s)}{1 + H_3(s) \cdot (G \cdot H_1(s) - H_2(s))}.$$

In the absence of quantization noise (i.e., $\epsilon_Q=0$) and input signal (i.e., x=0), the output 146A ($y_1$) of the sampling/quantization circuit is $$y_1 = \epsilon_D \cdot \frac{H_2(s) \cdot H_3(s)}{1 + H_3(s) \cdot (G \cdot H_1(s) - H_2(s))},$$

and the output 146C ($y_2$) of the nonlinear bit-mapping circuit is $$y_2 = y_1 + \epsilon_M \epsilon_M \cdot = \\ \epsilon_D \cdot \frac{H_2(s) \cdot H_3(s)}{1 + H_3(s) \cdot (G \cdot H_1(s) - H_2(s))} + \frac{1 + H_3(s) \cdot (G \cdot H_1(s) - H_2(s))}{1 + H_3(s) \cdot (G \cdot H_1(s) - H_2(s))},$$

where $\epsilon_D$ is nonlinear distortion introduced by feedback DAC 111 and $\epsilon_M$ is nonlinear distortion introduced by nonlinear bit-mapping function 112. When the nonlinear distortion introduced by the DAC 111 is equal to the nonlinear distortion introduced by the nonlinear bit-mapping function, such that $\epsilon_D=\epsilon_M$, then the overall distortion transfer (DTF=$y_2/\epsilon$) is $$DTF(s) = \frac{1 + G \cdot H_1(s) \cdot H_3(s)}{1 + H_3(s) \cdot (G \cdot H_1(s) - H_2(s))} = NTF(s),$$

and therefore, distortion is subjected to the same noise-shaped response as quantization noise. For exemplary diplexer responses given by $$H_1(s) = \frac{\phi_1}{G} \cdot e^{-sT_3} + \frac{\phi_0}{G} \cdot e^{-sT_1},$$
$$H_2(s) = \phi_1 \cdot e^{-sT_4} + \phi_0 \cdot e^{-sT_2}$$

and $$H_3(s) = \frac{\beta_0}{\beta_3 s^3 + \beta_2 s^2 + \beta_1 s + \beta_0},$$

the resulting overall DFL noise/distortion transfer function is $$NTF(s) = DTF(s) = \frac{\beta_3 s^3 + \beta_2 s^2 + \beta_1 s + \beta_0 \cdot (1 + \phi_1 \cdot e^{-sT_3} + \phi_0 \cdot e^{-sT_1})}{\beta_3 s^3 + \beta_2 s^2 + \beta_1 s + \beta_0 \cdot [1 + \phi_1 \cdot (e^{-sT_3} - e^{-sT_4}) + \phi_0 \cdot (e^{-sT_1} - e^{-sT_2})]}.$$

It can be shown that the DFL, for the appropriate choice of parameters (i.e., $T_1$, $T_2$, $T_3$, $T_4$, $\phi_0$, $\phi_1$, $\beta_0$, $\beta_1$, $\beta_2$ and $\beta_3$), produces second-order noise-shaped responses that are comparable to conventional delta-sigma ($\Delta\Sigma$) modulator noise-shaped responses, but with performance that is more stable and more tolerant of feedback delay variation.

The values of the parameters in the above exemplary NTF (or DTF) equation determine the frequency location of the notch, or null, in the quantization noise response ($f_{notch}$). In one embodiment, the location of the frequency notch is coarsely notch, determined by $\beta_i$ and the delay parameters, $T_i$, in increments greater than or equal to $\frac{1}{10} \cdot f_S$, and the location of the frequency notch is finely determined by the coefficient parameter, $\phi_1$, in increments less than or equal to $\frac{1}{8} \cdot f_S$. Table 1 provides exemplary, normalized (i.e., $f_S=1$ Hz and Z=1 ohm) DFL parameters as a function of the NTF notch frequency. As indicated in Table 1, the mapping of DFL parameters to the quantization noise notch frequency ($f_{notch}$) may not be a one-to-one function (e.g., non-isomorphic). However, the DFL parameters and the quantization noise notch frequency are related such that, for fixed $\phi_i$ and $\beta_i$, the quantization noise notch frequency decreases when the primary filter coarse tuning parameter $T_1$ increases, and increases when the primary filter coarse tuning parameter $T_1$ decreases. This behavior is different from that of a conventional, bandpass delta-sigma modulator, where the equivalent of this coarse tuning parameter is either fixed by the sampling operation of the modulator (i.e., DT $\Delta\Sigma$) or is embedded in the response of a continuous-time integrator (i.e., CT $\Delta\Sigma$).

component(s). Therefore, it is preferred that the propagation delay of the sampling circuits and/or amplifiers is less than $\frac{1}{4} \cdot T_S$ (i.e., a condition causing $T_4 \geq 0$ in the preferred embodiments) to enable the placement of quantization noise notches at frequencies up to $\frac{1}{2} \cdot f_S$ (i.e., the Nyquist bandwidth).

More generally, in the preferred embodiments of the DFL noise shaping circuit, each of the first diplexer filter responses, which in the present embodiment are given by the convolution of filter $H_1(s)$ 154A with filter $H_3(s)$ 154C, and the second diplexer filter responses, which in the present embodiment are given by the convolution of filter $H_2(s)$ 154B and filter $H_3(s)$ 154C, is the linear combination of two filter responses $W_{ij}(s)$, such that:

$$H_1(s) \cdot H_3(s) = \phi_{00} \cdot W_{00}(s) + \phi_{01} \cdot W_{01}(s) \text{ and}$$

$$H_2(s) \cdot H_3(s) = \phi_{10} \cdot W_{10}(s) + \phi_{11} \cdot W_{11}(s),$$

where $\phi_{ij}$ are positive or negative scalars. The above scalar values are analogous in function to the fine-tuning parameters $\phi_i$ discussed earlier with respect to an exemplary embodiment of the DFL, and generally determine the fine frequency loca-

TABLE 1

Exemplary Normalized Diplexing Feedback Loop Parameters

| NTF Notch Freq. ($f_{notch}/f_{CLK}$) | $\frac{T_1}{T_{CLK}}$ | $\frac{T_2}{T_{CLK}}$ | $\frac{T_3}{T_{CLK}}, \frac{T_4}{T_{CLK}}$ | $\phi_0$ | $\phi_1$ | $\beta_0$ | $\beta_1$ | $\beta_2$ | $\beta_3$ |
|---|---|---|---|---|---|---|---|---|---|
| 0.00 | 8.00 | 7.50 | 4.00 | 2.00 | −3.00 | 6.1E−5 | 3.1E−3 | 7.9E−2 | 1.0 |
| 0.00 | 2.50 | 2.00 | 1.00 | 1.00 | −2.00 | 3.9E−3 | 4.9E−2 | 3.1E−1 | 1.0 |
| 0.01 | 8.00 | 7.50 | 4.00 | 1.80 | −2.70 | 6.1E−5 | 3.1E−3 | 7.9E−2 | 1.0 |
| 0.02 | 7.00 | 6.50 | 3.50 | 1.60 | −2.20 | 6.1E−5 | 3.1E−3 | 7.9E−2 | 1.0 |
| 0.05 | 7.00 | 6.50 | 3.50 | 1.10 | −0.20 | 6.1E−5 | 3.1E−3 | 7.9E−2 | 1.0 |
| 0.10 | 3.75 | 3.25 | 1.875 | 1.00 | 0 | 4.8E−4 | 1.2E−2 | 1.6E−1 | 1.0 |
| 0.15 | 2.70 | 2.20 | 1.35 | 1.00 | 0 | 3.9E−3 | 4.9E−2 | 3.1E−1 | 1.0 |
| 0.20 | 1.85 | 1.35 | 0.925 | 1.00 | 0 | 3.9E−3 | 4.9E−2 | 3.1E−1 | 1.0 |
| 0.25 | 1.35 | 0.85 | 0.675 | 1.00 | 0 | 3.9E−3 | 4.9E−2 | 3.1E−1 | 1.0 |
| 0.25 | 1.60 | 1.10 | 0.80 | 1.00 | 0 | 1.3E−2 | 1.1E−1 | 4.7E−1 | 1.0 |
| 0.30 | 1.00 | 0.50 | 0.50 | 1.00 | 0 | 3.9E−3 | 4.9E−2 | 3.1E−1 | 1.0 |
| 0.30 | 1.25 | 0.75 | 0.625 | 1.00 | 0 | 1.3E−2 | 1.1E−1 | 4.7E−1 | 1.0 |
| 0.35 | 1.00 | 0.50 | 0.50 | 1.00 | 0 | 1.3E−2 | 1.1E−1 | 4.7E−1 | 1.0 |
| 0.40 | 1.00 | 0.50 | 0.50 | 0.90 | 0.20 | 3.1E−2 | 2.0E−1 | 6.3E−1 | 1.0 |
| 0.45 | 0.75 | 0.25 | 0.25 | 1.00 | 0 | 3.1E−2 | 2.0E−1 | 6.3E−1 | 1.0 |
| 0.50 | 0.75 | 0.25 | 0.25 | 0.95 | 0.22 | 3.1E−2 | 2.0E−1 | 6.3E−1 | 1.0 |

In one embodiment of the DFL, the $\beta_i$ parameters determine the cut-off frequency ($f_{3dB}$), or 3 dB bandwidth, of a third-order, lowpass filter response. In the preferred embodiments, the lowpass filter response defined by the $\beta_i$ parameters is such that $f_{3dB} > f_B$ and the in-band propagation delay ($\tau_{GD}$) is less than $\frac{1}{4} \cdot T_S$, where $T_S$ is the period of the quantizer 114 sampling clock. Furthermore, in the preferred embodiments the following relationships apply (at least approximately, but more preferably, exactly): 1) the relationship between $T_1$ and $T_S$ is $T_1 = 2 \cdot T_S - \tau_{GD}$; 2) the relationship between $T_2$ and $T_S$ is $T_2 = \frac{3}{2} \cdot T_S - \tau_{GD}$; 3) the relationship between $T_3$ and $T_S$ is $T_3 = T_S - \tau_{GD}$; and 4) the relationship between $T_4$ and $T_S$ is $T_4 = \frac{1}{2} \cdot T_S - \tau_{GD}$. Under these conditions, the signal transfer function (STF) of the noise shaping filter is approximately all-pass, i.e., STF(s) = $k \cdot e^{-s\tau}$, across the bandwidth of a given MBO processing branch. In general, the signal transfer function (STF) of the DFL has approximately the preferred all-pass response when the relationship between $T_1$, $T_2$, $T_3$ and $T_4$ is such that: $T_3 - T_4 = \frac{1}{2} \cdot T_S$ and $T_1 - T_2 = \frac{1}{2} \cdot T_S$. Also, it is preferable that each delay variable $T_i$ includes the propagation, or settling, delays of any corresponding active tion ($f_{notch}$) and depth of the null in the quantization-noise transfer function (NTF). Therefore, the values of $\phi_{ij}$ depend on the desired frequency notch location. To reduce complexity, the first and second diplexer filter responses can use common scalar values (i.e., $\phi_{00} = \phi_{10}$ and $\phi_{01} = \phi_{11}$), because the characteristics of the NTF quantization noise null are primarily determined by $\phi_{00}$ and $\phi_{01}$, with $\phi_{10}$ and $\phi_{11}$ having a secondary effect. The filter responses $W_{ij}(s)$ preferably have group delay and insertion gain that are constant at frequencies lying within the 20 dB bandwidth of the NTF quantization noise response (i.e., frequencies near $f_{notch}$) and approach zero at frequencies greater than those lying within the 20 dB bandwidth of the NTF quantization noise response (e.g., frequencies much greater than $f_{notch}$), such that each of the diplexer filter responses $H_1(s) \cdot H_3(s)$ and $H_2(s) \cdot H_3(s)$ includes a lowpass component.

To maintain low complexity, the filter responses $W_{ij}(s)$ preferably are lowpass responses of first to fifth order and, more preferably, are given by:

$$W_{ij}(s) = \frac{\beta''_{ij0} \cdot e^{-sT_{ij}}}{\sum_{k=0}^{5} \beta''_{ijk} \cdot s^k},$$

where s is the Laplace variable with $s=2\pi f\sqrt{-1}$. In this particular case, the amplitude response of the lowpass filter $W_{ij}(s)$ is determined by the denominator coefficients $\beta''_{ijk}$, which establish the filter cutoff frequency $f_{3dB}$ and filter out-of-band, roll-off factor (e.g., 12 dB per octave for a second-order filter). The group delay (propagation delay) response of the lowpass filter $W_{ij}(s)$ is determined by the denominator coefficients $\beta''_{ijk}$ and the coarse tuning (delay) parameter $T_{ij}$ in the numerator. Furthermore, the filter coefficients) $\beta''_{ijk}$ can be derived using normalized filter polynomials for standard analog filter types, such as Bessel and equiripple filters which are preferable because they exhibit near constant group delay across the passband of the filter. Therefore, the general forms of the two diplexer filters preferably are:

$$H_1(s) \cdot H_3(s) = \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k}$$

and $$H_2(s) \cdot H_3(s) = \varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k}.$$

For the linearized embodiment shown in FIG. 8F, where signal amplification (i.e., gain of G) occurs prior to adder 153 (e.g., for example prior to filter response $H_1(s)$), the above filter responses result in a linearized quantization-noise transfer function that is generally of the form:

$$NTF(s) = \frac{1 + G \cdot \left(\varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k}\right)}{1 + G \cdot \left(\varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{00}}}{\sum_{k=0}^{5} \beta''_{01k} \cdot s^k}\right) - \left(\varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k}\right)}.$$

Without loss of noise shaping performance, the complexity of the above general DFL quantization-noise transfer function (i.e., and therefore the complexity of the DFL circuit) can be reduced by making the substitutions: $\beta''_{00k}=\beta''_{01k}=\beta'_{0k}$, $\beta''_{10k}=\beta''_{11k}=\beta'_{1k}$, $\phi_0=1/G\cdot\phi_{01}=\phi_{11}$, and $\phi_1=1/G\cdot\phi_{00}=\phi_{10}$. These substitutions result in the preferred DFL noise transfer function which is given by:

$$NFT(s) = \frac{1 + \frac{\beta'_{00}}{\sum_{k=0}^{5} \beta'_{0k} \cdot s^k} \cdot (\phi_1 \cdot e^{-sT_3} + \phi_0 \cdot e^{-sT_1})}{1 + \left(\frac{\beta'_{00}}{\sum_{k=0}^{5} \beta'_{0k} \cdot s^k} \cdot (\phi_1 \cdot e^{-sT_3} + \phi_0 \cdot e^{-sT_1}) - \frac{\beta'_{10}}{\sum_{k=0}^{5} \beta'_{1k} \cdot s^k} \cdot (\phi_1 \cdot e^{-sT_4} + \phi_1 \cdot e^{-sT_2})\right)},$$

where $T_1=T_{01}$, $T_2=T_{11}$, $T_3=T_{00}$, and $T_4=T_{10}$. In addition, for the particular case where the lowpass filter responses $W_{ij}(s)$ are third order and equal, such that $\beta'_{0k}=\beta'_{1k}=\beta_k$, the preferred DFL noise transfer further reduces to $$NTF(s) = \frac{\beta_3 s^3 + \beta_2 s^2 + \beta_1 s + \beta_0 \cdot (1 + \phi_1 \cdot e^{-sT_3} + \phi_0 \cdot e^{-sT_1})}{\beta_3 s^3 + \beta_2 s^2 + \beta_1 s + \beta_0 \cdot [1 + \phi_1 \cdot (e^{-sT_3} - e^{-sT_4}) + \phi_0 \cdot (e^{-sT_1} - e^{-sT_2})]},$$

which is the same equation that was discussed above in reference to the Table 1 parameters. Therefore, the exemplary DFL diplexer responses defined in Table 1 are just special cases of the general form of the preferred DFL quantization noise response. Although the preferred quantization-noise transfer function (NTF) defined above can be derived from diplexer filter responses that are the weighted sum (or difference) of two lowpass filter responses, as discussed above, other derivation methods and approaches are also possible, such as those based on iterative design methods, for example.

Applying signal amplification (G) after adder 153, as shown in the alternate embodiment of FIG. 8B, alters the linearized noise transfer function (NTF) of the DFL without significantly changing its actual noise-shaped response (i.e., the actual noise-shaped response would be a function of the nonlinear behavior of sampling/quantization circuit 114A). More specifically, for the embodiment shown in FIG. 8A, where signal amplification occurs after adder 153 (e.g., for example after filter response $H_3(s)$), the resulting linearized NTF is generally of the form $$NTF(s) = \frac{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{01}}}{\sum_{k=0}^{5} \beta''_{01k} \cdot s^k} \right)}{1 + G \cdot \left( \varphi_{00} \cdot \frac{\beta''_{000} \cdot e^{-sT_{00}}}{\sum_{k=0}^{5} \beta''_{00k} \cdot s^k} + \varphi_{01} \cdot \frac{\beta''_{010} \cdot e^{-sT_{00}}}{\sum_{k=0}^{5} \beta''_{01k} \cdot s^k} - \varphi_{10} \cdot \frac{\beta''_{100} \cdot e^{-sT_{10}}}{\sum_{k=0}^{5} \beta''_{10k} \cdot s^k} + \varphi_{11} \cdot \frac{\beta''_{110} \cdot e^{-sT_{11}}}{\sum_{k=0}^{5} \beta''_{11k} \cdot s^k} \right)}.$$

The above response reduces to the preferred DFL noise transfer function of $$NFT(s) = \frac{1 + \frac{\beta'_{00}}{\sum_{k=0}^{5} \beta'_{0k} \cdot s^k} \cdot (\phi_1 \cdot e^{-sT_3} + \phi_0 \cdot e^{-sT_1})}{1 + \left( \frac{\beta'_{00}}{\sum_{k=0}^{5} \beta'_{0k} \cdot s^k} \cdot (\phi_1 \cdot e^{-sT_3} + \phi_0 \cdot e^{-sT_1}) - \frac{\beta'_{10}}{\sum_{k=0}^{5} \beta'_{1k} \cdot s^k} \cdot (\phi_1 \cdot e^{-sT_4} + \phi_1 \cdot e^{-sT_2}) \right)},$$

for the case where: $\beta''_{00k}\beta''_{01k} = \beta'_{0k}$, $\beta''_{10k} = \beta''_{11k} = \beta'_{1k}$, $\phi_0 = 1/G \cdot \phi_{01} = 1/G \cdot \phi_{11}$, and $\phi_1 = 1/G \cdot \phi_{00} = 1/G \phi_{10}$. Since the noise shaping performance of the DFL is not dependent on the placement of amplifier 152A, the signal amplification needed to compensate for loses in feedback diplexer 150 can occur at any point between the input of filter response $H_1(s)$ (i.e., input signal 141) and the output of filter response $H_3(s)$ (i.e., output signal 147). In addition, the total signal amplification (G) can be distributed arbitrarily across the transmission path from input signal 141 to output signal 147, without significantly affecting the actual noise shaping performance of the DFL.

The sampler/quantizer 10 of the discrete-time, delta-sigma modulator introduces a transfer function $H_Q(z)$ that is unity, such that $H_Q(z)=1$. However, for continuous-time noise shaping circuits, such as the Diplexing Feedback Loop (DFL), the sampler/quantizer 114A introduces a non-unity, zero-order-hold transfer function given by $$H_Q(s) = \frac{1 - e^{-sT_S}}{s \cdot T_S}$$

where $T_S$ is the quantizer sample clock period and $T_S = 1/f_S$. This transfer function has a constant group delay (i.e., propagation delay) equal to $\frac{1}{2} \cdot T_S$. In addition, the sampler/quantizer has finite, extra transport delay $\tau_{PD}$. Therefore, the diplexer filter responses of the DFL preferably are different in amplitude, phase/group delay, or both to compensate for the sampler/quantizer 114A zero-order hold response, plus any additional transport delay $\tau_{PD}$ associated with the sampler/quantizer 114A. For this reason, the DFL diplexer filter responses preferably are different and account for the overall transfer function of the sampler/quantizer 114A.

Figure 9A:
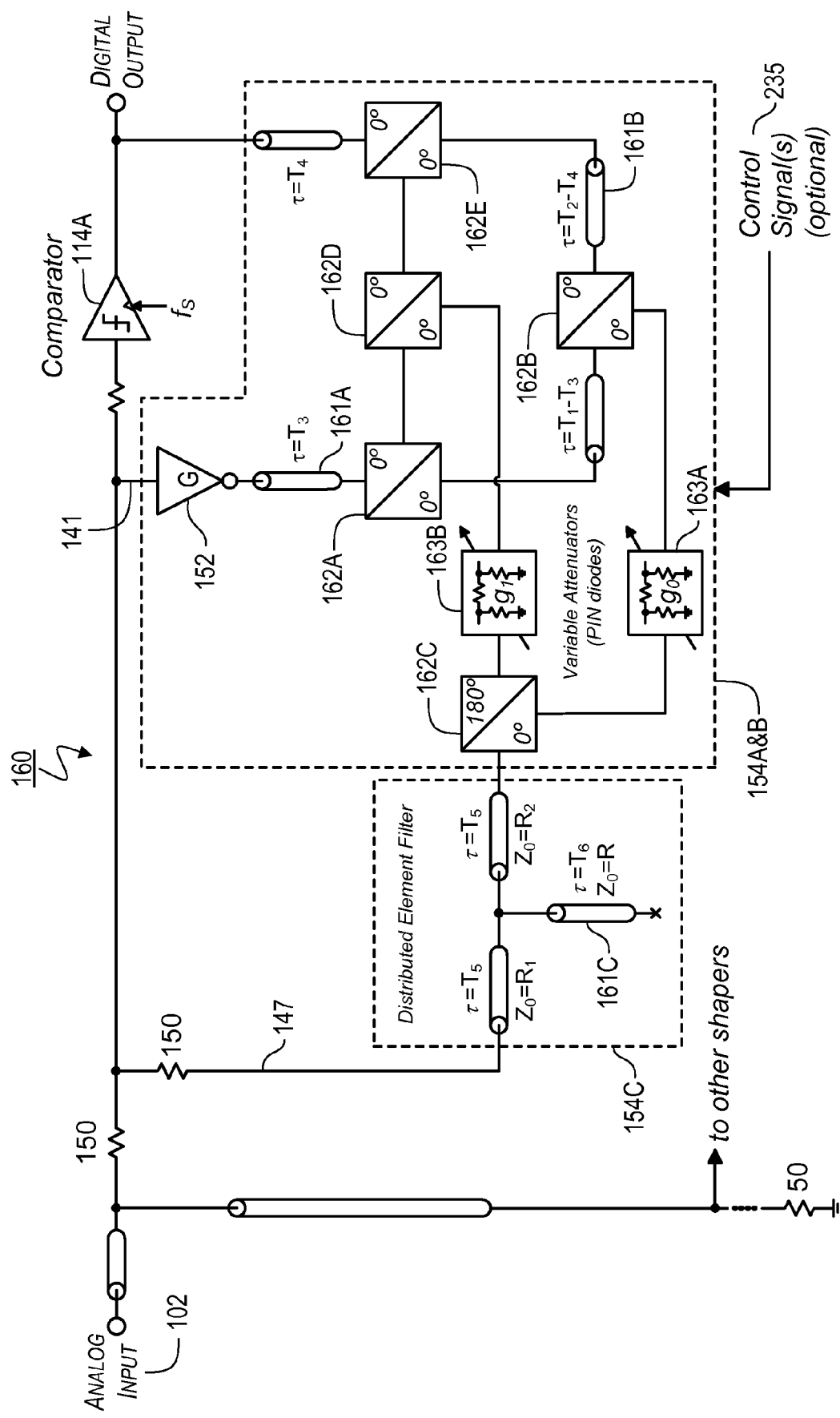
FIGS. 9A&B are circuit diagrams illustrating exemplary implementations of Diplexing Feedback Loop (DFL) noise shaping for negative trimming/calibration of $f_{notch}$ values using reactive networks for signal summing and signal distribution.
Figure 9B:
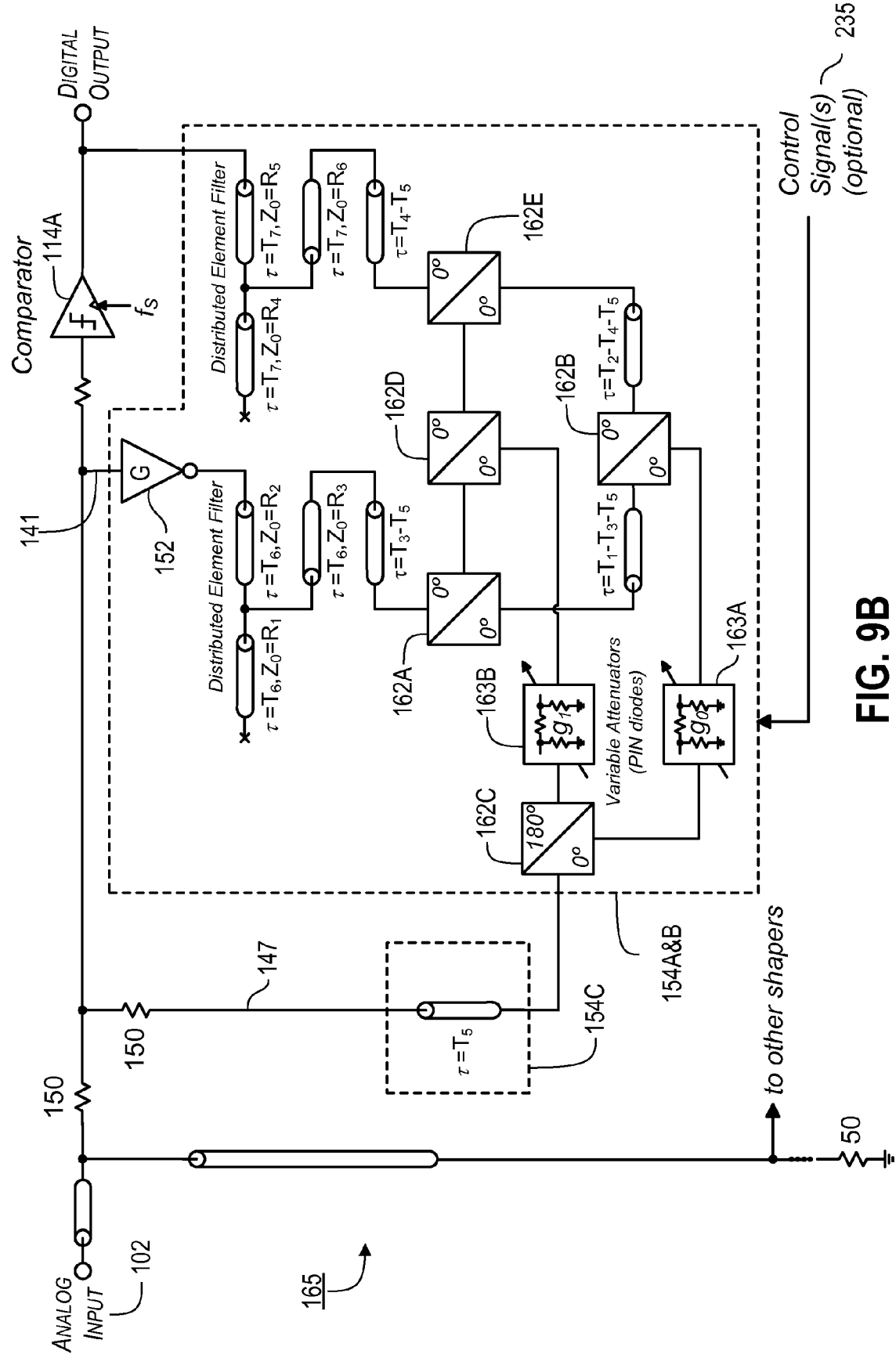
FIGS. 9C&G are circuit diagrams illustrating exemplary implementations of Diplexing Feedback Loop (DFL) noise shaping for positive trimming/calibration of $f_{notch}$ values using multi-bit quantization and reactive networks for signal summing and signal distribution.
FIG. 9D is a circuit diagram illustrating an exemplary implementation of Diplexing Feedback Loop (DFL) noise shaping for negative trimming/calibration of $f_{notch}$ values using resistive networks for signal summing and signal distribution.
FIGS. 9E&F are circuit diagrams illustrating exemplary implementations of Diplexing Feedback Loop (DFL) noise shaping for positive trimming/calibration of $f_{notch}$ values using resistive networks for signal summing and signal distribution.
Figure 9C:
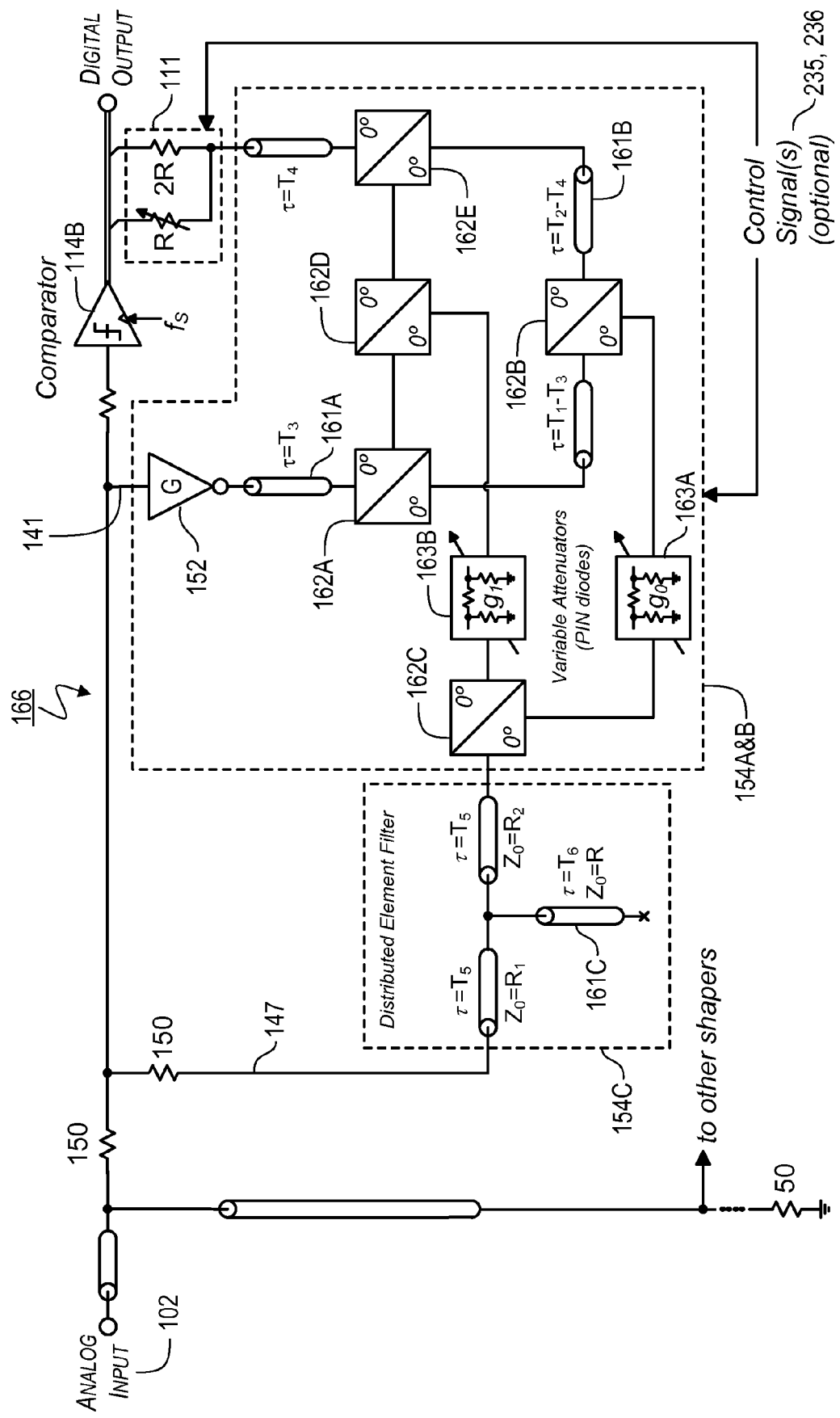
Figure 9D:
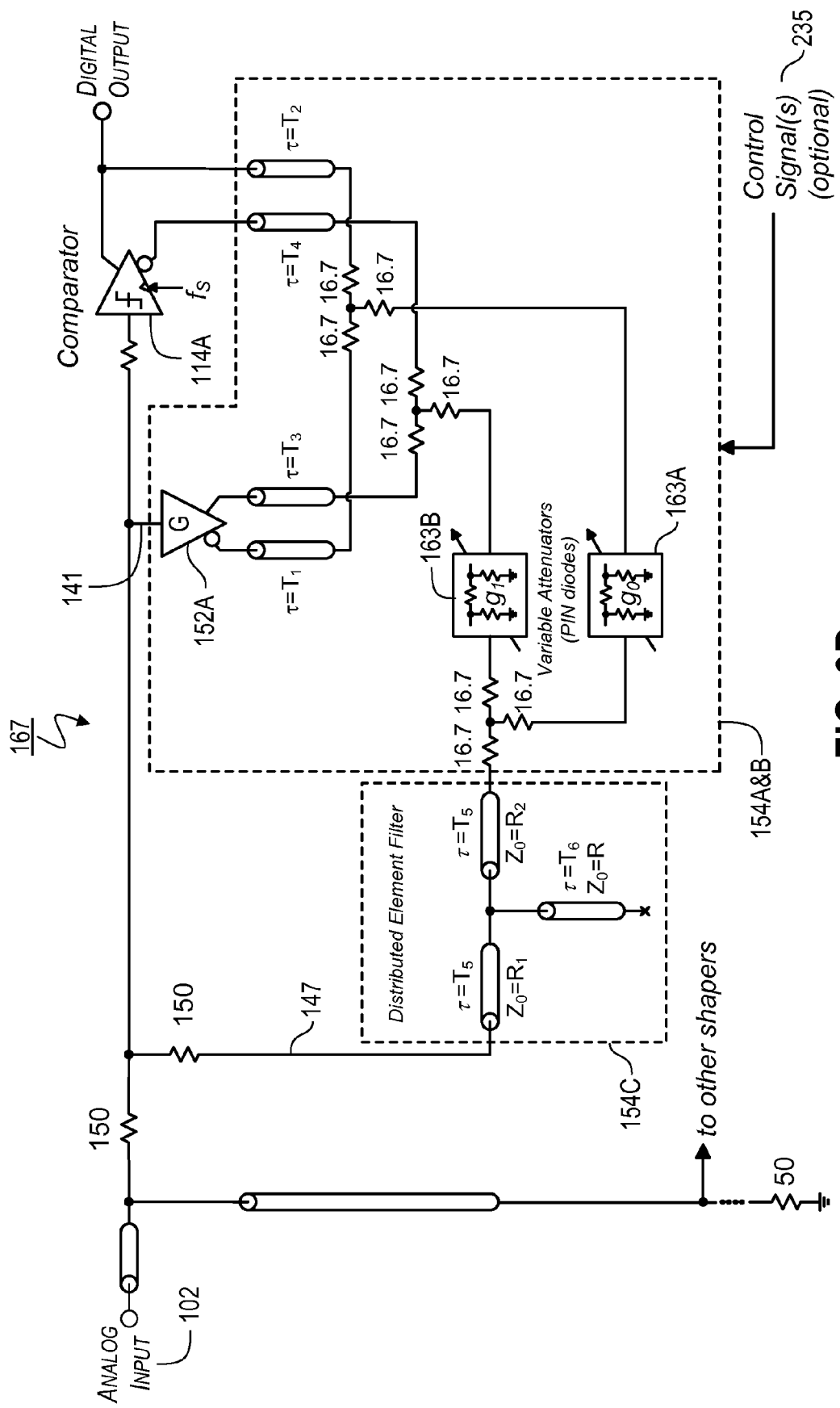
Figure 9E:
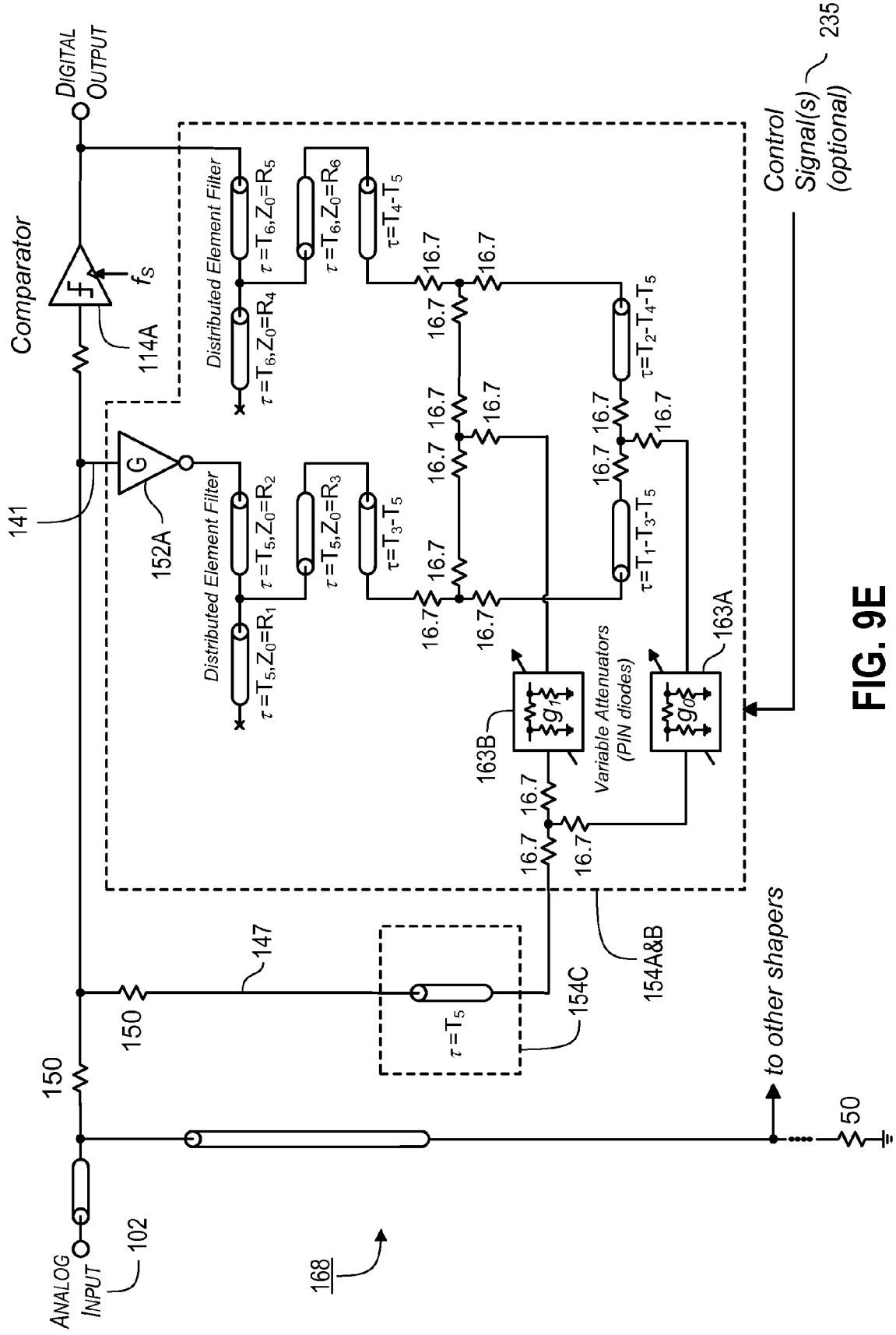
Figure 9F:
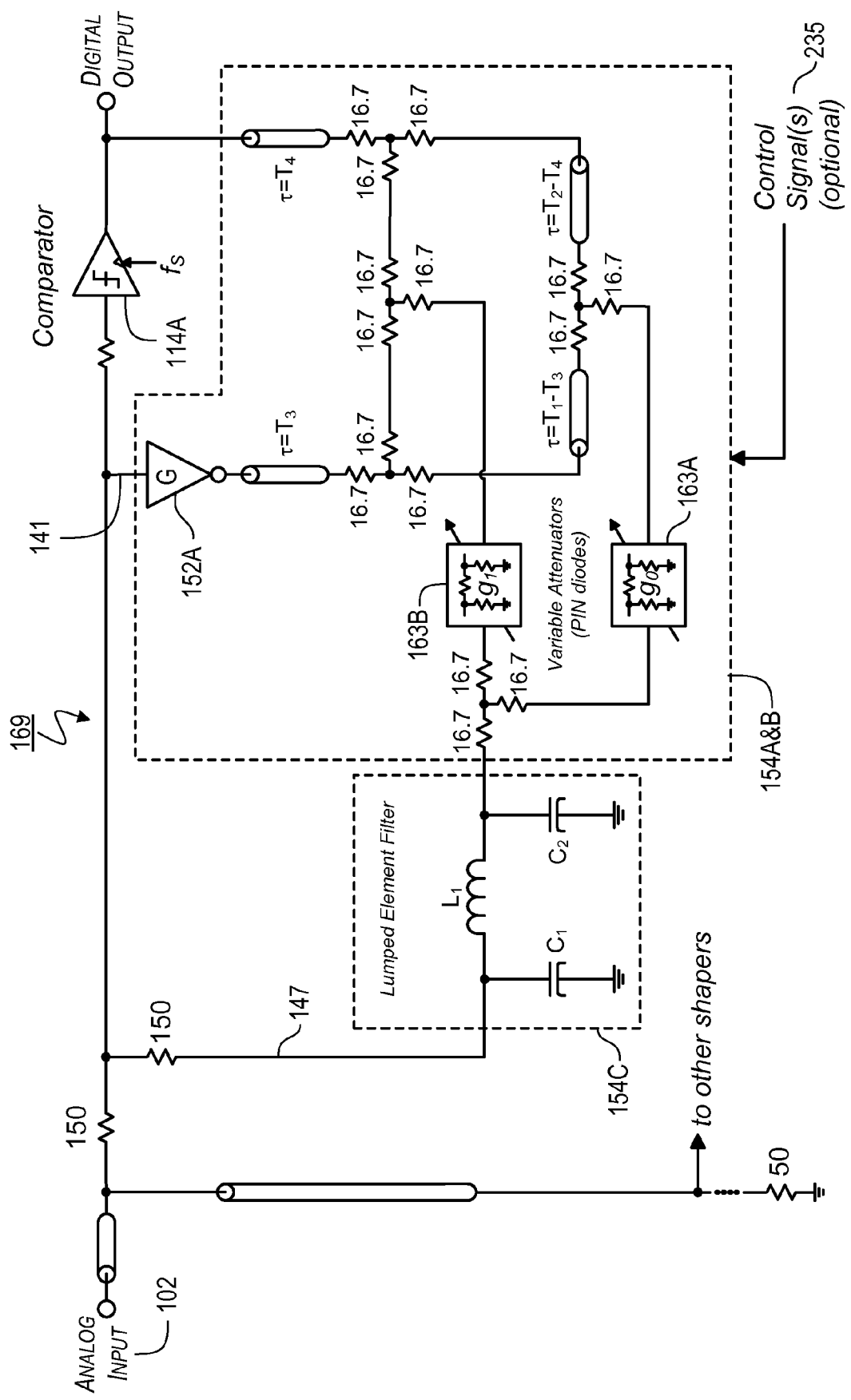
Figure 9G:
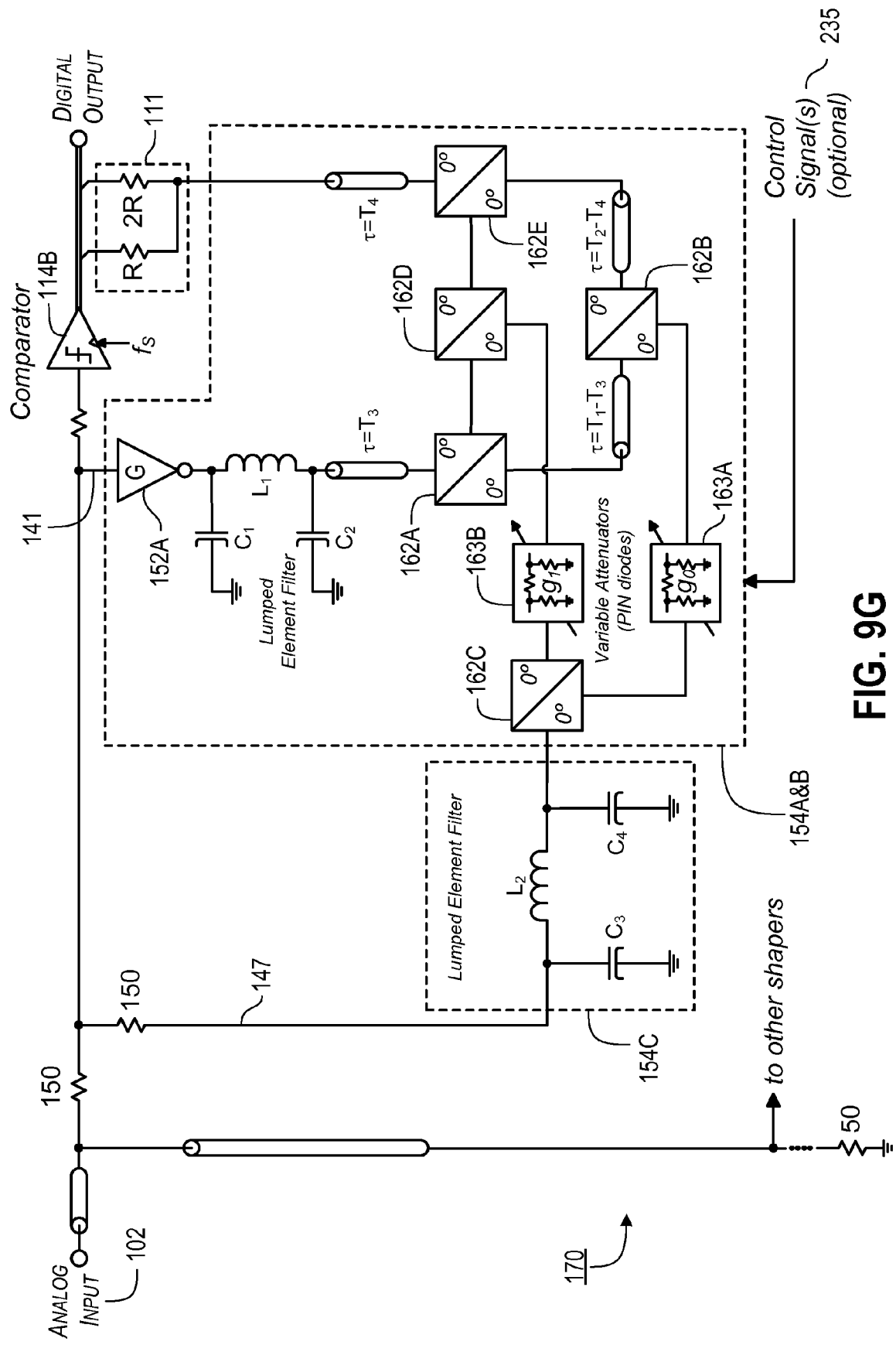
Figure 10:
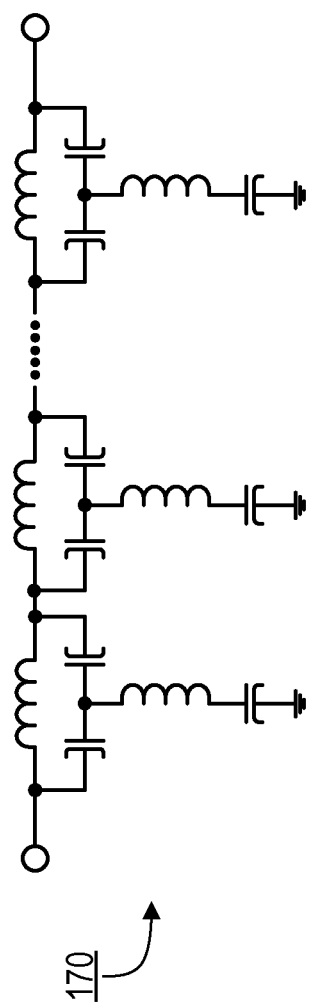
FIG. 10 illustrates a circuit diagram of a conventional, lumped-element delay network for use in a representative embodiment of the present invention.

The general and preferred DFL diplexer responses defined above, and the specific exemplary DFL diplexer responses parameterized in Table 1, can be realized using high-frequency design techniques, such as those based on distributed-element microwave components and monolithic microwave integrated circuits (MMICs). Exemplary implementations that include a Diplexing Feedback Loop filter 150 are: circuits 160 and 165 (shown in FIGS. 9A&B, respectively) for negative values of $\phi_1$ and a single-bit sampler/quantizer 114A; and circuit 166 (shown in FIG. 9C) for positive values of $\phi_1$ and a multi-bit sampler/quantizer 114B. These implementations are based on a single-ended controlled-impedance (i.e., 50 ohm) system, and the delay ($e^{-sT}$) elements (e.g., delay elements 161A-C) are realized using transmission lines. Unlike continuous-time or discrete-time delta-sigma modulators, the preferred DFL circuit 113 uses feedback in conjunction with 50-ohm, moderate gain (i.e., basic) amplifier blocks and distributed passive elements (e.g., attenuators, power splitters and transmission lines) to realize perfect integration. In the exemplary circuits shown in FIGS. 9A&B, the quantizer 114A is a hard limiter that produces a single-bit output. The hard limiter has the advantages of high-speed operation and precise quantization, but multi-bit quantizers instead could be used to improve converter resolution and performance stability (i.e., assuming direct or indirect compensation for binary scaling offsets), as illustrated by two-bit sampler/quantizer 114B in FIG. 9C (which, as noted above, preferably is implemented as discussed in the '668 application). In the exemplary two-bit sampler/quantizer circuit shown in FIG. 9C, feedback DAC 111 is composed of two binary-weighted resistors (i.e., R and 2·R), where one resistor (i.e., R) is a variable resistor to allow dynamic calibration of the DAC's binary scaling operation. This variable resistor can be implemented using semiconductor devices, such as PIN diodes and field-effect transistors (FETs), or can be implemented using a switched array of fixed resistors. Alternatively, as discussed above, a nonlinear bit-mapping function can be used to compensate for imperfections in the binary scaling operation of DAC 111. Also, in the exemplary circuits shown in FIGS. 9A-C, the parameters $\phi_i$ are determined by the value of a variable attenuator (163A or 163B, respectively) with $\phi_i=g_iG$. Alternate variable attenuators can be implemented using semiconductor devices, such as PIN diodes and field-effect transistors (FETs), or can be implemented using a switched array of fixed resistor networks. Still further, the value of $\phi_i$ instead could be set based on the gain of a programmable gain amplifier. In FIGS. 9A-C, the amplifier 152 provides a gain G of about 20 dB (although higher gains up to, e.g., approximately 40 dB instead could be provided to compensate for higher signal losses through the feedback path of the DFL). In alternate embodiments, the total gain G can be distributed across multiple amplifier devices, such as for example replacing one 20 dB gain device with two 10 dB gain devices. Also, in these embodiments signal summing and signal distribution is accomplished via power splitters and combiners (e.g., 162A-E) that, for example, can be implemented using a combination of coupled transmission lines, active devices, and/or reactive (magnetic) networks (e.g., Wilkinson divider, Lange coupler, branchline hybrid, etc.). However, other means of signal summing and distribution exist, including resistive networks known as Wye splitters/combiners, as shown for circuits 167 (which potentially has the same DFL transfer functions as circuit 160 discussed above) and 168 (which potentially has the same DFL transfer functions as circuit 166 discussed above) in FIGS. 9D&E, respectively. Resistive splitters have the advantages of very broadband operation and small size, but reactive splitters can be used to reduce signal losses and reduce amplifier gain. In addition, this DFL circuit is easily adapted for differential systems, and the basic design can be altered for construction using uncontrolled impedance devices (i.e., transconductance stages) or lumped element components, without loss of generality. For example, instead of transmission lines, any or all of the delay elements can be implemented using active or reactive structures, including buffers or passive lattice structures, such as the circuit 170 shown in FIG. 10. In addition, some or all of the diplexer filter 150 responses can be realized using lumped element components, as shown for circuits 169 and 170 in FIGS. 9F&G, respectively.

Figure 11:
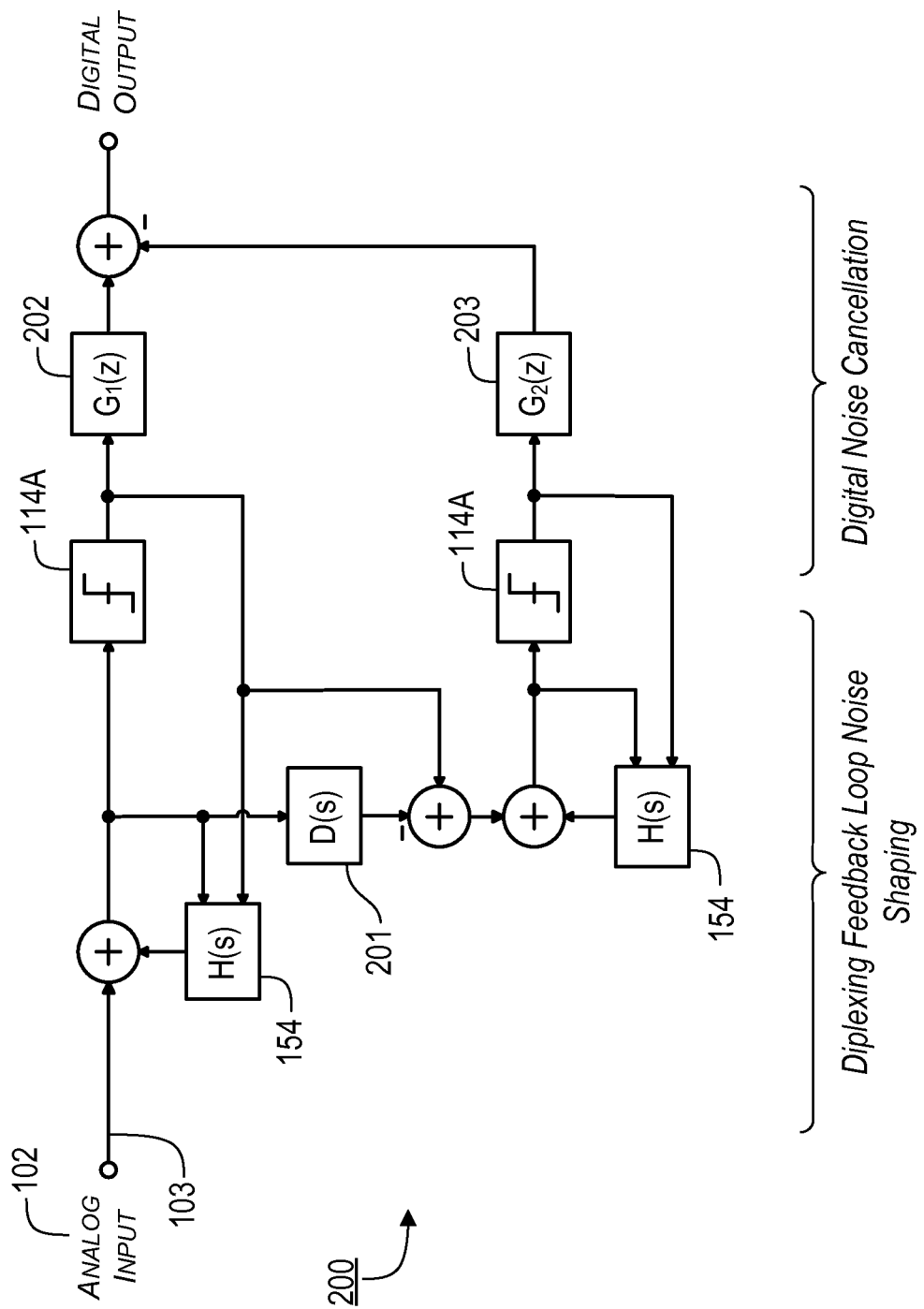
FIG. 11 is a block diagram of an exemplary fourth-order Diplexing Feedback Loop (DFL) noise shaping circuit using a parallel circuit arrangement.

Each of the DFL circuits shown in FIGS. 9A-G has a second-order noise-shaped response. However, like the MASH (i.e., Multi-stAge SHaping) structures implemented with conventional DT ΔΣ modulators, it is possible to realize improved noise shaping performance by adding additional DFL stages in a parallel arrangement to create higher-order responses. A DFL 200 with fourth-order noise-shaped response is shown in FIG. 11. Higher-order cascade (i.e., series) structures also are possible, but the parallel arrangement generally exhibits better stability than the cascade structure, particularly for high-order (i.e., >3) noise-shaped responses and single-bit sampling. However, the parallel structure generally requires the digital interface to handle two single-bit inputs rather than one single-bit input. The transfer functions of the additional filters 201, 202 and 203 shown in FIG. 11 preferably are:

$$D(s)=e^{-sT_S}$$

$$G_1(z)=z^{-1} \text{ and}$$

$$G_2(z)=1+\rho_1 \cdot z^{-1}+\rho_0 \cdot z^{-2},$$

respectively, where $T_S$ is the quantizer sample clock period and the $\rho_i$ values are chosen such that the response of $G_2(z)$ closely matches the NTF response of the first DFL stage within the signal bandwidth of the associated processing branch. The coefficient $\rho_1$ is calculated based on the NTF notch frequency ($f_{notch}$) of the first stage according to $\rho_1 \approx -2 \cdot \cos(2 \cdot \pi \cdot f_{notch}/f_S)$, preferably taking into account the potential inaccuracies or variations in, for example, the diplexer filter responses (e.g., group delay distortion) and/or the sampling frequency (e.g., phase/frequency drift or jitter). The coefficient $\rho_0$ is determined based on the Q of the quantization noise response first stage, such that $\rho_0 \approx 1$. Higher-order noise-shaped responses generally enable more quantization noise to be removed by the Bandpass Moving-Average reconstruction (or other reconstruction) filter(s) that follow the noise shaping circuit (i.e., preferably a DFL).

For the exemplary DFL parameter values given in Table 1, the mapping of filter parameters to the notch frequency ($f_{notch}$) of the quantization noise response is not a notch, of one-to-one function (e.g., non-isomorphic). However, the filter parameters and the notch frequency of the quantization noise response are related such that: 1) for fixed $\phi_i$ and $\beta_i$, the notch frequency decreases with increasing primary coarse tuning parameter $T_1$; and 2) for fixed $\beta_i$ and $T_i$, the notch frequency increases with increasing fine tuning parameter $\phi_1$. The latter relationship suggests a method for calibrating the DFL response to account for component tolerances. For the second-order DFL circuits shown in FIGS. 9A-G, the parameters $T_i$ and $\beta_i$ determine the coarse location of a relatively narrowband null ($f_{notch}$) in the quantization noise response, while the fine location of the notch frequency and its quality (Q) factor (i.e., notch depth) are determined by the tuning parameters $\phi_i=g_iG$. Given that, ultimately, the shaped quantization noise is passed through a narrowband Bandpass Moving-Average (BMA) reconstruction or other bandpass filter, the noise at the BMA filter output typically will not be at the minimum level if the location of the spectral null in the quantization noise response is not precisely aligned with the center frequency of the BMA filter response. Use of a variable attenuator or variable-gain amplifier allows the DFL tuning parameters, $\phi_i$, to be dynamically adjusted, or adjusted based on manufacturing trim operations.

Figure 12A:
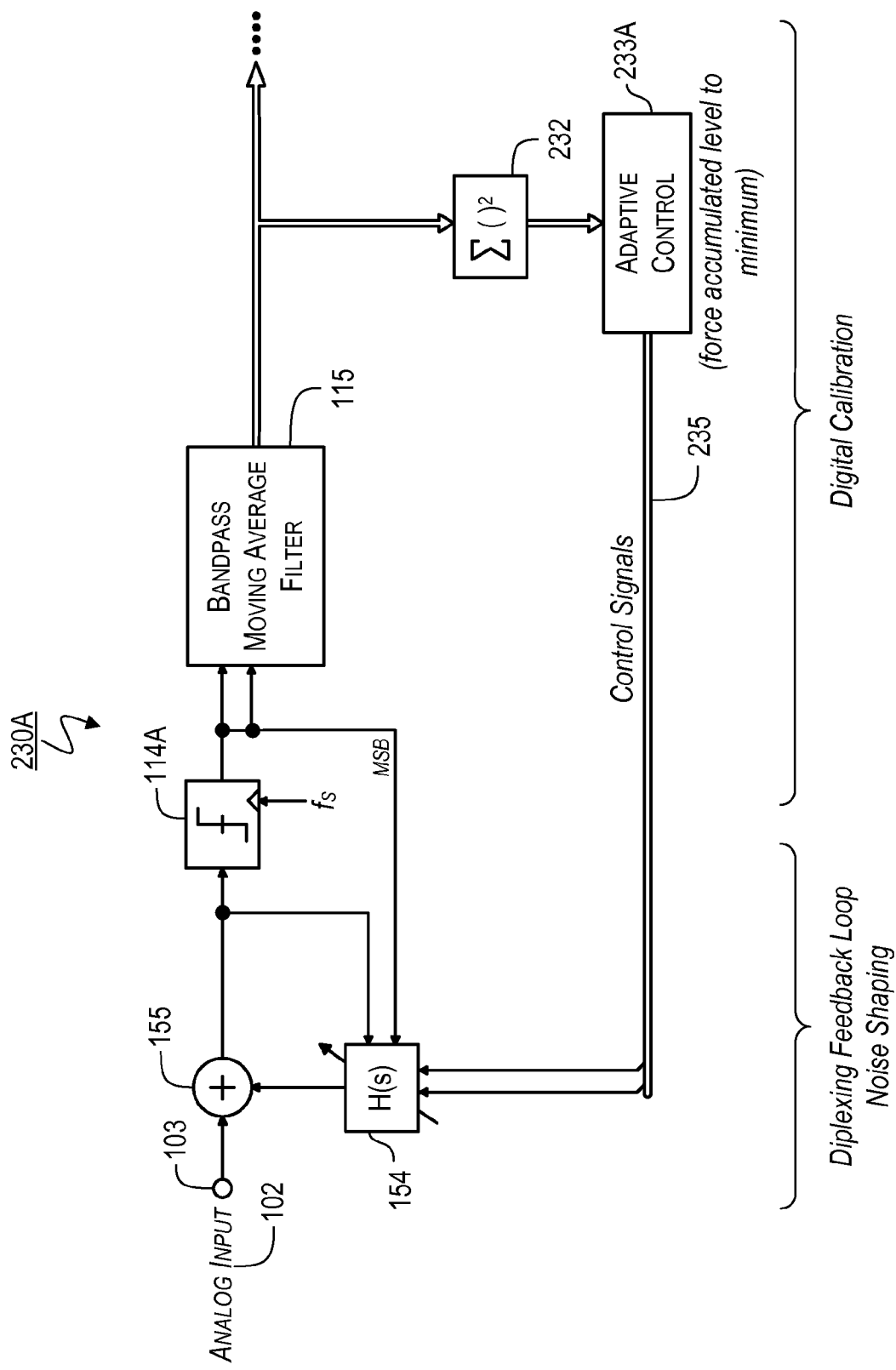
FIG. 12A illustrates a second-order Diplexing Feedback Loop (DFL) noise shaping circuit that employs single-bit quantization and uses active calibration, based on Bandpass Moving-Average filter output levels, to dynamically adjust the diplexer filter responses.
Figure 12B:
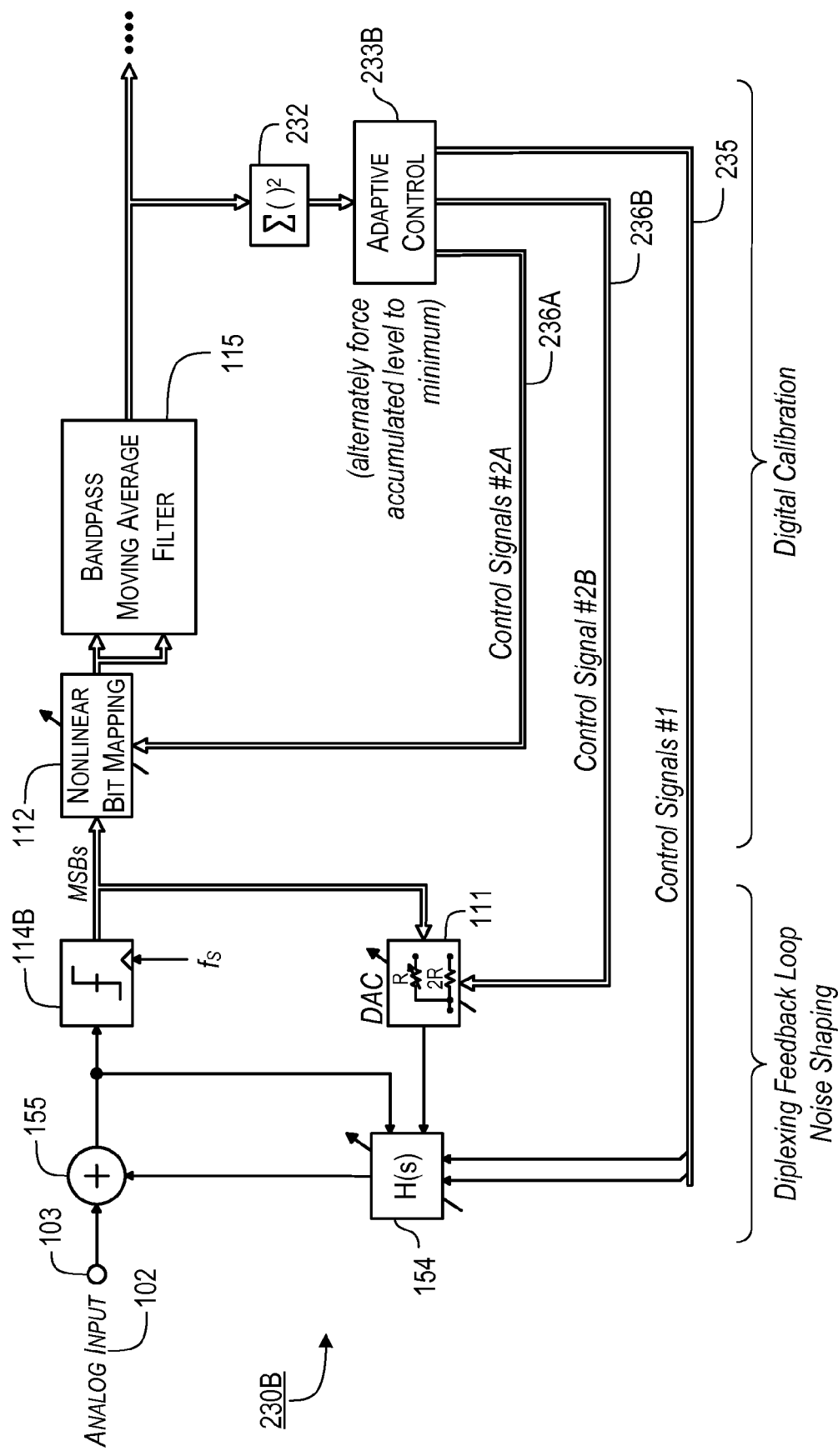
FIG. 12B illustrates a second-order Diplexing Feedback Loop (DFL) noise shaping circuit that employs multi-bit quantization and uses active calibration, based on Bandpass Moving-Average filter output levels, to dynamically adjust 1) diplexer filter responses, 2) nonlinear bit-mapping distortion, and 3) feedback digital-to-analog converter (DAC) transfer function.
Figure 12C:
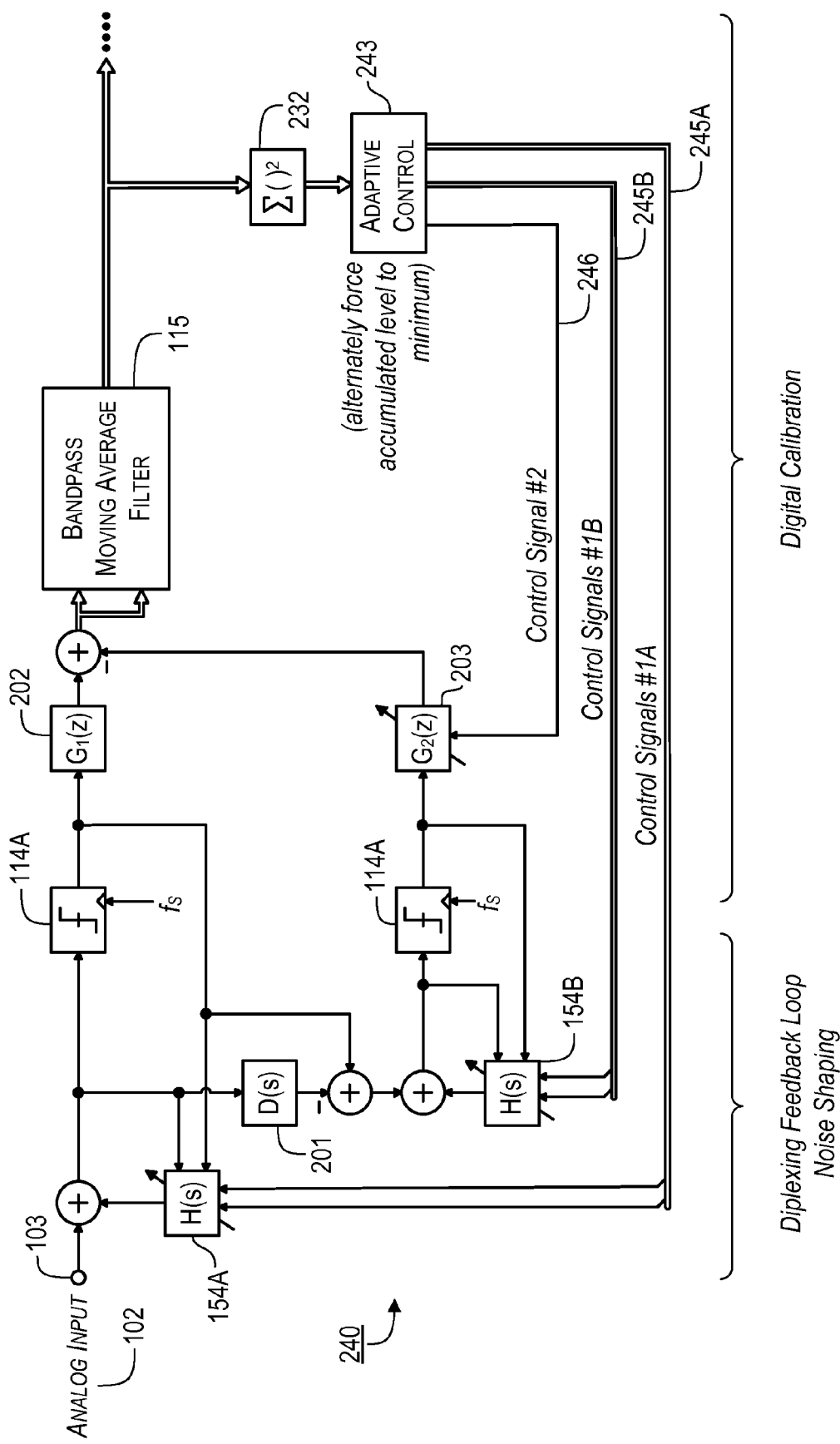
FIG. 12C illustrates a fourth-order Diplexing Feedback Loop (DFL) noise shaping circuit that employs single-bit quantizers and uses active calibration, based on Bandpass Moving-Average filter output levels, to dynamically adjust 1) diplexer filter responses and 2) error cancellation (digital) filter response.

Exemplary DFL calibration circuits are shown in FIGS. 12A-E. It is noted that any of these circuits could be implemented as a stand-alone circuit or as part of a processing branch (e.g., branch 110 or 120) in any of circuits 100A-D (discussed above). The exemplary calibration (i.e., tuning) circuit 230A, shown in FIG. 12A, is for use, e.g., with single-stage noise shaping and includes a means for tuning the coefficients of DFL feedback filter 154. The alternative calibration circuit 230B, shown in FIG. 12B, can be used, e.g., for more comprehensive calibration of single-stage noise shaping. Compared to circuit 230A, circuit 230B provides additional tuning capabilities, including: 1) a means for calibrating the binary scaling accuracy of DAC 111; and 2) a means for calibrating nonlinear bit-mapping operation 112 to compensate for residual inaccuracies in the DAC 111 binary scaling operation. An exemplary circuit 240 for use, e.g., with multi-stage noise shaping is shown in FIG. 12C. Calibration circuit 240 includes: 1) a means for tuning the coefficients of both noise shaping stages of DFL feedback filters 154A&B; and 2) a means for adapting the response of digital error cancellation filter 203. Because the quantization noise of the DFL is additive with respect to the input signal, the overall signal-plus-noise level at the output of the Bandpass Moving-Average filter (BMA) 115 is proportional to the level of added quantization noise. The added quantization noise is at a minimum, for example, when the fine tuning parameters $\phi_i$ of the DFL feedback filter and the feedback DAC (or nonlinear bit-mapping) binary scaling response are properly tuned, such that the DFL response exhibits a deep quantization noise null at the correct frequency (i.e., the downconversion frequency, or center frequency of the BMA filter response). Also, the average quantization noise measured as the mean absolute difference, or alternatively as the variance, between the input of quantizer 114 and the output of quantizer 114 is a minimum for a properly tuned DFL circuit.

The tuning parameters discussed above independently (i.e., the parameters do not significantly interact) affect the quantization noise level at the Bandpass Moving-Average (BMA) filter output. By sensing the overall power (or signal strength) at the BMA output, e.g., using a square law operation 232 (as shown in FIGS. 12A-C) or an absolute value operation, it is possible to alternatively adjust the parameters affecting the DFL quantization-noise response using, e.g., an algorithm that employs joint optimization, decision-directed feedback, gradient descent, and/or least squared-error (LSE) principles within processing block 233A in circuit 230A, processing block 233B in circuit 230B, or processing block 243 in circuit 240, until the overall power (or signal-strength) level at the output of the BMA filter is forced to a minimum. With respect to circuit 230A, based on the signal-plus-noise level at the BMA filter output (e.g., as determined in block 232), the algorithm generates control signals 235 that correct for errors in the response of the DFL feedback filter 154 using fine tuning parameters $\phi_i$. With respect to circuit 230B, based on the signal-plus-noise level at the BMA filter output (e.g., as determined in block 232), the algorithm generates: 1) control signals 235 that correct for errors in the response of the DFL feedback filter 154 using fine tuning parameters $\phi_i$; and 2) control signals 236A&B that correct for imperfections in the binary scaling response of feedback DAC 111. Control signals 236A indirectly compensate for imperfections in the binary scaling response of feedback DAC 111 by adjusting the binary scaling response (e.g., coefficients $C_0 \ldots C_{n-1}$) of nonlinear bit-mapping function 112 to match the imperfect binary scaling response of feedback DAC 111. Alternatively, control signals 236B directly correct for imperfections in the binary scaling response of feedback DAC 111 by adjusting the response of feedback DAC 111 itself. With respect to circuit 240, based on the overall signal-plus-noise level at the BMA filter output (e.g., as determined in block 232), the algorithm generates: 1) control signals 245A and 245B that correct for errors in the response of each DFL feedback filter (154A and 154B, respectively); and 2) control signal 246 that adjusts the response of error cancellation filter 203 to compensate for feedback loop gain errors in the first stage of the noise shaping circuit (i.e., the stage that includes blocks 114A and 154A). Because the noise shaping circuit topology depends on the sign of fine tuning parameter $\phi_1$, e.g., as illustrated by the use of 180° (inverting) reactive combiner 162C for negative $\phi_1$ in FIG. 9A and the use of 0° reactive combiner 162C for positive $\phi_1$ in FIG. 9C, the preferred calibration approach is one where the coarse location of $f_{notch}$ is set intentionally low or high, using filter parameters $T_i$ and $\beta_i$, such that the noise-shaped response can be fine tuned with strictly positive or negative values of $\phi_1$. In the currently preferred embodiments, the input to the component 232, which measures signal power or strength, is coupled to the output of the frequency of converter 239, as shown in FIGS. 12A-C. This configuration is believed to provide improved (e.g., more stable) performance and reduced complexity as compared to the configuration illustrated in the drawings of U.S. patent application Ser. No. 12/985,238.

The calibration method described above can be confused by variations in signal power because it employs a calibration error measurement (tuning metric) that is derived from the overall level at the BMA filter output, which is a function of both signal power and quantization noise power. Because it adds minimal additional circuit complexity, a tuning metric based on the BMA output level is preferred when calibration takes place only in the absence of input signal (e.g., an initial calibration at power up). For calibration during normal operation, however, the preferred tuning metric is instead derived from the average quantization noise level at the DFL output. Exemplary circuits 260A&B, shown in FIGS. 12D&E, respectively, illustrate the preferred means of DFL calibration in the presence of an input signal (i.e., dynamic calibration during normal operation). Referring to circuit 260A, a regressor signal $\zeta$ (i.e., signal 262) is generated from filter response $W_{00}(s)$ (i.e., within circuit 261A as shown, or within circuit 154), filter response $W_{10}(s)$ (i.e., within circuit 261B as shown, or within circuit 154), and adder 264 according to:

$$\zeta(t) = Q_x(t) * W_{01} - x(t) * W_{00},$$

where: 1) the * operator represents linear convolution, 2) $x(t)$ is the input to sampling/quantization circuit 114A, 3) $Q_x(t)$ is the quantized output of sampling/quantization circuit 114A, and 4) $W_{ij}$ are filter responses associated with the feedback diplexer of the DFL. The regressor signal $\zeta(t)$ is then preferably quantized, downconverted, and lowpass filtered in that order via single-bit sampling/quantization circuit 114A, mixer 267, and lowpass filter 268. Furthermore, in the preferred embodiments, downconversion is based on a sinusoidal sequence 269 with a frequency corresponding to the null in the quantization-noise transfer function of the associated DFL, and the two-sided bandwidth of lowpass filter 268 is approximately equal, and preferably exactly equal, to the bandwidth of BMA filter 115 within the same processing branch. The response of lowpass filter 268 preferably is generated by cascaded moving-average operations that are identical to those used to implement the BMA filter within the same processing branch. However, in alternate embodiments, the response of lowpass filter 268 can be generated using $comb^{P+1}$ or other conventional filters, and/or the two-sided bandwidth of the lowpass filter can be different from the bandwidth of the BMA filter within the same processing branch.

Figure 12D:
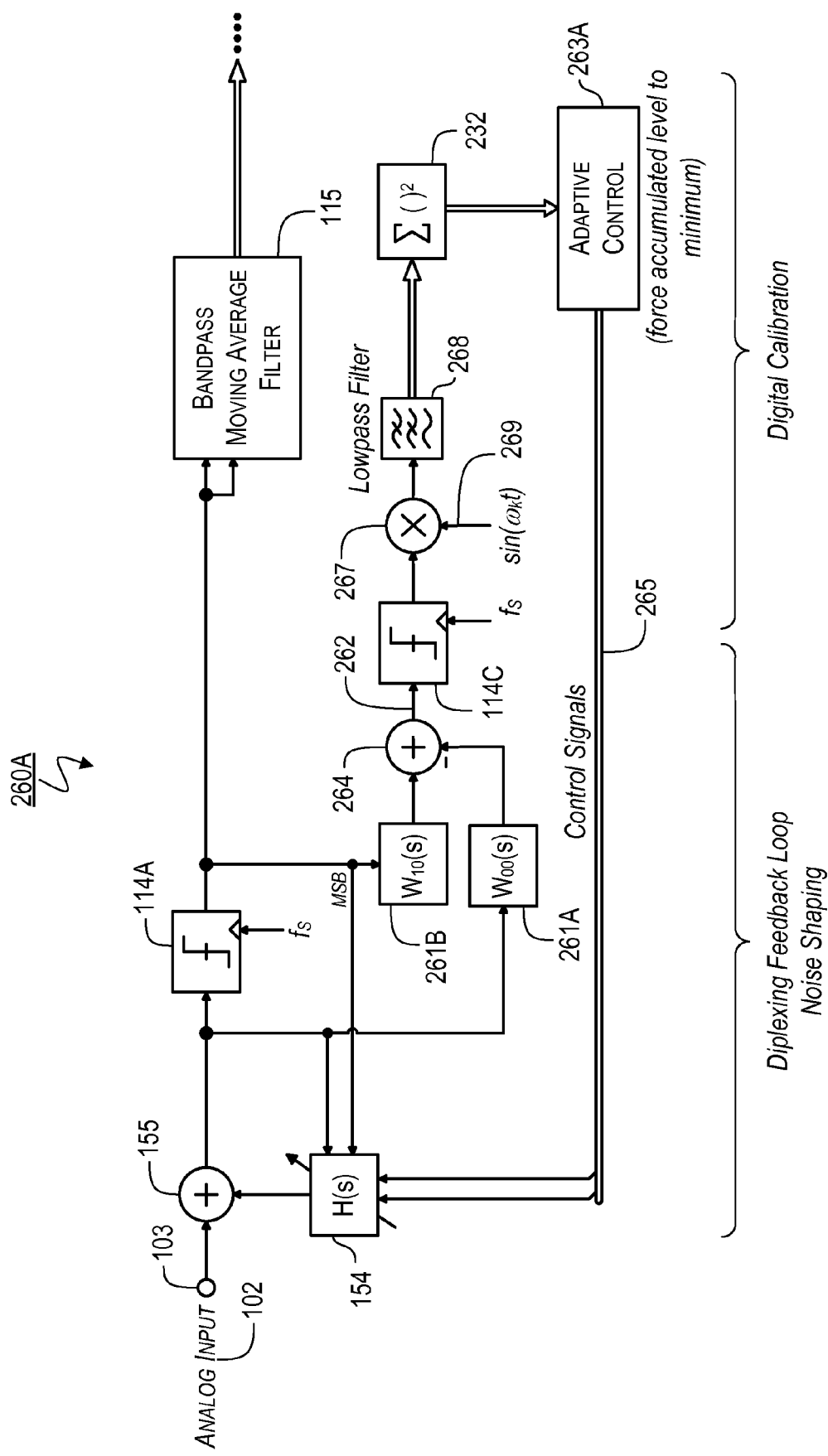
FIG. 12D illustrates a second-order Diplexing Feedback Loop (DFL) noise shaping circuit that employs single-bit quantization and uses active calibration, based on average quantization error levels, to dynamically adjust the diplexer filter responses.
Figure 12E:
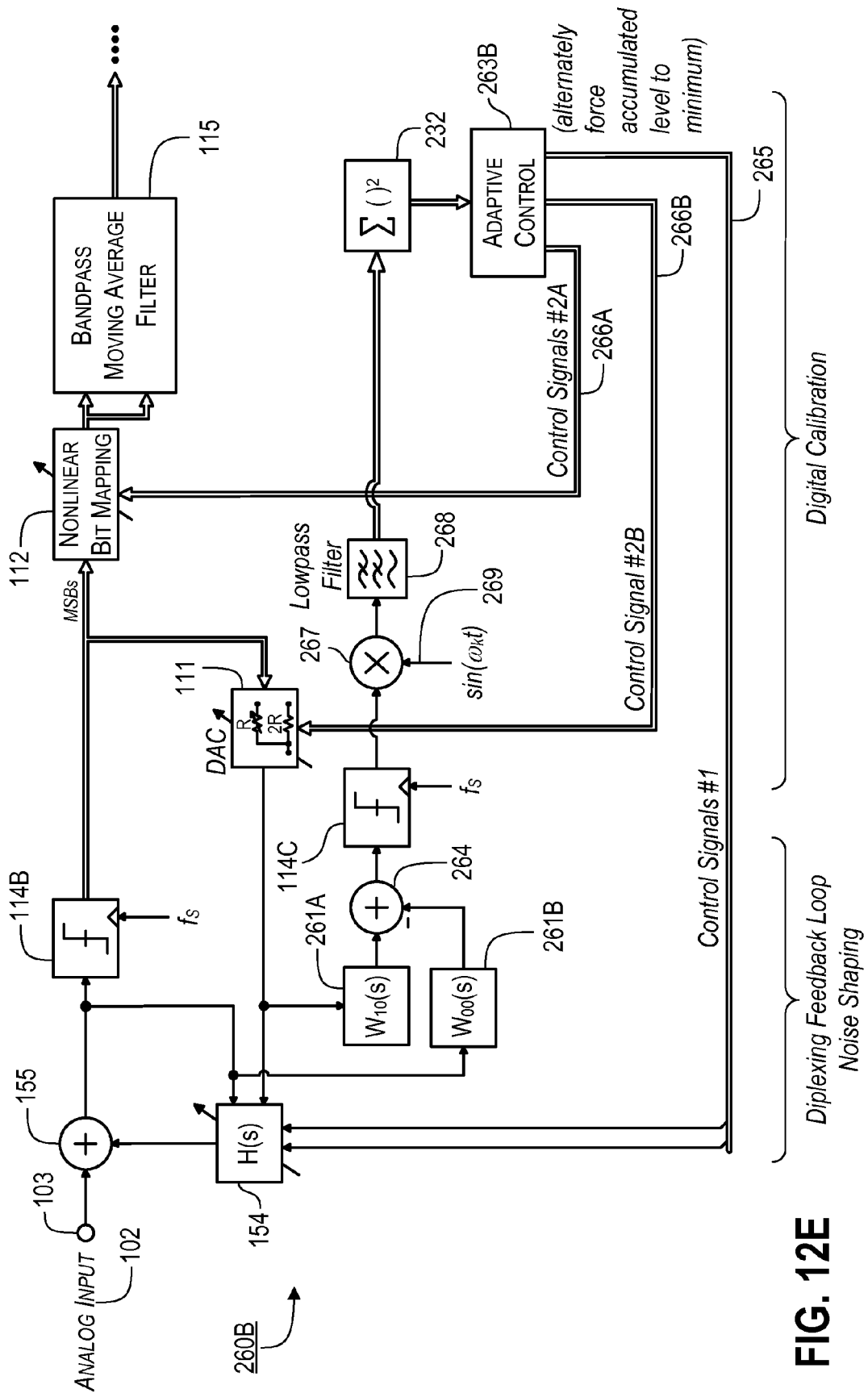
FIG. 12E illustrates a second-order Diplexing Feedback Loop (DFL) noise shaping circuit that employs single-bit quantization and uses active calibration, based on average quantization error levels, to dynamically adjust 1) diplexer filter responses, 2) nonlinear bit-mapping distortion, and 3) feedback digital-to-analog converter (DAC) transfer function.

Use similar processing to exemplary calibration circuits 230A&B, exemplary calibration circuits 260A&B sense the power (or signal strength) at the output of lowpass filter 268 and alternatively adjust the parameters affecting the DFL quantization-noise response. Specifically, power is sensed e.g., using a square law operation 232 (as shown in FIGS. 12D&E) or an absolute value operation. The DFL parameters preferably are optimized using, e.g., an algorithm that employs joint optimization, decision-directed feedback, gradient descent, and/or least squared-error (LSE) principles within processing block 263A in circuit 260A or processing block 263B in circuit 260B, until the power (or signal-strength) level at the output of the lowpass filter 268 is forced to a minimum. With respect to circuit 260A, based on the signal-strength level at the output of lowpass filter 268 (e.g., as determined in block 232), the algorithm generates control signals 265 that correct for errors in the response of the DFL feedback filter 154 using fine tuning parameters $\phi_i$. With respect to circuit 260B, based on the level at the output of lowpass filter 268 (e.g., as determined in block 232), the algorithm generates: 1) control signals 265 that correct for errors in the response of the DFL feedback filter 154 using fine tuning parameters $\phi_i$; and 2) control signals 266A&B that correct for imperfections in the binary scaling response of feedback DAC 111. When an input signal is present, a tuning metric based on residual quantization noise, rather than a tuning metric based on signal-plus-noise, provides improved calibration performance as compared to the configurations illustrated in the drawings of U.S. patent application Ser. No. 12/985,238.

In some applications, such as those where the notch frequencies ($f_{notch}$) of each DFL are user-programmable for multi-mode operation (as discussed in more detail in the Overall Converter Considerations section), it can be beneficial to allow the fine tuning parameters $\phi_i$ to tune $f_{notch}$ across as much of the overall ½·$f_S$ converter bandwidth as possible. This also permits a single DFL circuit to be replicated multiple times in the multi-channel converter assembly, which can have manufacturing and other benefits. For these reasons, the coarse tuning elements $\beta_i$ and $T_i$ preferably are fixed such that the bandwidths $f_{3dB}$ of the diplexer lowpass responses $W_{ij}(s)$ are greater than ½·$f_S$, and such that the group delays D associated with the diplexer lowpass responses are $DW_{00}=T_S$, $DW_{01}=2\cdot T_S$, $DW_{10}=\frac{1}{2}\cdot T_S-\tau_{PD}$, and $DW_{11}=\frac{3}{2}\cdot T_S-\tau_{PD}$, where $\tau_{PD}$ is the extra transport delay of the sampler/quantizer (i.e., delay in excess of the sampler/quantizer zero-order hold response group delay). Under these conditions, varying the DFL fine-tuning parameter $\phi_1$ over a range of 2 to +2 places the notch frequency $f_{notch}$ of the DFL quantization-noise transfer function (NTF) at selected arbitrary locations across the overall data converter bandwidth, and the DFL signal transfer function (STF) is approximately all-pass across the bandwidth of the respective MBO processing branch. Furthermore, the DFL fine-tuning parameter $\phi_0$ can be varied to maximize the depth of the null in the DFL quantization-noise transfer function (NTF), a condition that occurs when the overall insertion gain/loss of the first diplexer filter response (i.e., the convolution of filter $H_1(s)$ 154A with filter $H_3(s)$ 154C in the present embodiment) is unity at the NTF notch frequency ($f_{notch}$).

The required accuracy of $f_{notch}$ depends on the intended resolution of the data converter, which is commonly specified in terms of effective number of bits, B. For example, an oversampled converter with M branches having quantization noise responses $NTF_i$, has a resolution of $$B = \Delta Q - \frac{1}{2}\cdot \log_2 \sum_{i=1}^{M}\left(\int_0^{f_S/2} |NTF_i(e^{2\pi jfT}, P)\cdot F_i(e^{2\pi jfT})|^2 \, df\right),$$

where $\Delta Q$ is the number of bits at the output of the sampling/quantization circuit (i.e., level of coarse quantization) and $F_i(e^{2\pi jfT})$ are the frequency responses of the Bandpass Moving-Average (BMA) reconstruction filters. Differentiation of the above equation with respect to the DFL parameters (e.g., $T_1, T_2, T_3, T_4, \phi_0, \phi_1, \beta_0, \beta_1,$ and $\beta_3$ for the exemplary embodiment discussed above) provides the mathematical relationship between converter resolution and filter parameter accuracy.

For two-bit sampling/quantization, the resolution of the converter improves rapidly as DFL parameter accuracy (i.e., tuning parameters $\phi_0$ and $\phi_1$) and distortion (i.e., DAC and amplifier nonlinearity) improve to better than ±1%. Data converter applications targeting effective resolution of 8-10 bits or more preferably have DFL parameter tolerances and distortion of better than ±0.5% to ±1.0% (~$1;2^7\cdot100\%$). On the other hand, data converter applications targeting less effective resolution can accommodate larger tolerances and distortion. For example, tolerances and distortion of ±5% usually are sufficient for data converter applications targeting effective resolution of 6 bits or less. Also, greater tolerance and distortion can be accommodated when sampling/quantization levels are increased to greater than 2-bits. For example, at sampling/quantization levels of 3-bits, converter resolution of 8-10 bits can be obtained for DFL parameter tolerances and distortion of ±5%. Although electronic components can be manufactured to accuracies of ±1% or better, use of a variable attenuator or variable-gain amplifier allows the DFL fine tuning parameters, $\phi_i$, to be dynamically adjusted, or adjusted based on manufacturing trim operations.

In general, M noise shaping DFLs produce M quantization noise response nulls at frequencies spaced across the Nyquist (½·$f_S$, or 0.5 of the normalized frequency) bandwidth of the converter. A converter 100 consisting of M processing branches sometimes is described herein as having a frequency-interleaving factor of M, or an interleaved oversampling ratio of M. Unlike conventional oversampling converters (i.e., as described by Galton and Beydoun), where the conversion accuracy is primarily, or significantly, a function of an excess-rate oversampling ratio (N), defined as the ratio between the converter sample/clock rate and the converter output signal bandwidth $$\left(N = \frac{1}{2}\cdot f_S/f_B\right),$$

the conversion accuracy of the MBO converter primarily depends on the interleave factor (M). The MBO converter performance is less dependent on the traditional excess-rate oversampling ratio N, because N is preferably kept low (preferably, less than 4 and, more preferably, 1) and M is preferably substantially higher than N (e.g., at least 2·N or at least 4·N). For the MBO converter, it still is appropriate to refer to an "effective" oversampling ratio, which is defined as M·N. It is noted that this effective oversampling ratio is different than the effective resolution of converters 100A-D, which also depends on the quality of the noise shaping and reconstruction filters employed. Because the effective oversampling ratio of the MBO converters 100A-D directly depends on the number of converter processing branches (i.e., the frequency interleaving factor), the effective oversampling ratio can be increased, without increasing the converter sample rate clock, by using additional processing branches (or noise shaping DFL circuits).

As discussed above, the notch frequency ($f_{notch}$) of the DFL response is coarsely determined by a delay parameter, $T_1$, in con on with associated parameters $\beta_i$. Increasing the coarse tuning parameter $T_1$, relative to the sampling rate period (1/$f_S$), generally has the consequence of reducing the effective order of the DFL circuit's quantization noise-shaped response. Similarly, decreasing the coarse tuning parameter $T_1$, relative to the sampling rate period (1/$f_S$), generally has the consequence of increasing the effective order of the DFL's quantization noise-shaped response. For this reason, in representative embodiments of the invention, it is sometimes preferable for the M quantization noise response nulls to be at frequencies ($f_{notch}$) that are not uniformly spaced across the (signal) bandwidth of the converter. In contrast, quantization noise nulls are spaced evenly across the converter bandwidth in conventional ΠΔΣ and MBΔΣ converters.

Bandpass (Signal Reconstruction) Filter Considerations

Regardless of noise shaping implementation (e.g., DFL or ΔΣM, continuous-time or discrete-time, etc.), the primary considerations for the digital bandpass (i.e., frequency decomposition and signal reconstruction) filters used in MBO signal reconstruction according to the preferred embodiments of the present invention are: 1) design complexity (preferably expressed in terms of required multiplications and additions); 2) frequency response (particularly stopband attenuation); 3) amplitude and phase distortion; and 4) latency. The best converter-resolution performance is obtained for bandpass filters (i.e., reconstruction filters) having frequency responses that exhibit high stopband attenuation, which generally increases with increasing filter order. In addition, it is preferable for the filter responses to have suitable (e.g., perfect or near-perfect) signal-reconstruction properties to prevent conversion errors due to intermodulation distortion and/or amplitude and phase distortion. For example, it can be shown that the decimating $\text{sinc}^{P+1}$ ($\text{comb}^{P+1}$) filter responses that conventionally have been considered near-optimal in oversampling converters and are used in $\Pi\Delta\Sigma$ conversion (e.g., as in Galton), do not in fact exhibit the near-perfect reconstruction filter bank properties that are preferred in parallel oversampling converters with many processing branches (e.g., M>8). Filter distortion is a particularly important consideration because, unlike quantization noise, filter distortion levels do not improve as filter order increases or as the number of parallel-processing branches M increases. Therefore, filter distortion prevents converter resolution from improving with increasing filter order or with increasing M. Also, although stopband attenuation generally increases with filter order, increases in filter order result in greater processing latency, especially for transversal, finite-impulse-response (FIR) filters. Bandpass filters with low latency are preferred to support applications where latency can be a concern, such as those involving control systems and servo mechanisms.

The conventional frequency decomposition and signal reconstruction methods used in $\Pi\Delta\Sigma$ converters (such as in Galton) and in $\text{MB}\Delta\Sigma$ converters (such as in Aziz and Beydoun) generally are not preferable for the present MBO converters because they: 1) introduce unacceptable levels of intermodulation distortion (i.e., the $\Pi\Delta\Sigma$ scheme where lowpass $\Delta\Sigma$ modulators are used in conjunction with Hadamard sequences for frequency translation); 2) they produce unacceptable amounts of amplitude and phase distortion (e.g., the conventional $\text{sinc}^{P+1}$ filters used in $\Pi\Delta\Sigma$) that cannot be mitigated by increasing the number of parallel processing branches (M); and/or 3) they entail a degree of signal-processing complexity that can be impractical for converters with a large number of processing branches (e.g., the conventional Hann FIR filters and FIR filter banks used in $\text{MB}\Delta\Sigma$). For these reasons, signal reconstruction in the MBO converter preferably is based on an innovation described herein as Bandpass Moving-Average (BMA) signal reconstruction (e.g., according to the representative embodiments of converters 100B&C, illustrated in FIGS. 6B&C), which can result in: 1) high levels of stopband attenuation (i.e., attenuation of quantization noise); 2) negligible intermodulation distortion; 3) insignificant amplitude and phase distortion; and 4) significantly lower complexity than conventional approaches.

The desired frequency response of the bandpass filter preferably depends on: 1) the intended resolution (B) of the converter; 2) the order of the noise-shaped transfer function (P); and 3) the effective oversampling ratio of the converter (M·N). For an oversampling converter with M processing branches, $$B = \Delta Q - \frac{1}{2} \cdot \log_2 \sum_{i=1}^{M} \left( \int_0^{f_S/2} |NTF_i(e^{2\pi j f T}, P) \cdot F_i(e^{2\pi j f T})|^2 \, df \right)$$

where: 1) $\Delta Q$ is the number of bits at the output of the sampling/quantization circuit (i.e., level of coarse quantization); 2) $NTF_i(e^{2\pi j f T},P)$ are noise-shaped transfer functions of order P; and 3) $F_i(e^{2\pi j f T})$ are the frequency responses of the digital bandpass (signal reconstruction) filters. The square-bracketed term in the above equation represents an overall level of quantization noise attenuation. In addition, for near-perfect signal reconstruction, the digital bandpass filter bank preferably introduces negligible or no amplitude and phase distortion and has the following near-perfect signal reconstruction properties:

$$\sum_{i=1}^{M} F_i(z) = k \cdot z^{-n}, \text{ for } k = \text{constant} \quad \text{(i.e., strictly complementary)}$$

$$\sum_{i=1}^{M} |F_i(e^{2\pi j f T})|^2 = \text{constant} \quad \text{(i.e., power complementary)}$$

$$\sum_{i=1}^{M} F_i(z) = A(z), \text{ for } A(z) \to \text{all-pass} \quad \text{(i.e., all-pass complementary)}$$

To the extent that the digital reconstruction filter bank introduces appreciable amplitude and phase distortion, the minimum signal-to-distortion power ratio (SDR) of the filter bank preferably depends on the intended effective resolution (B) of the converter, and is approximately given by SDR≥6·B, or 6 dB per bit.

Figure 13A:
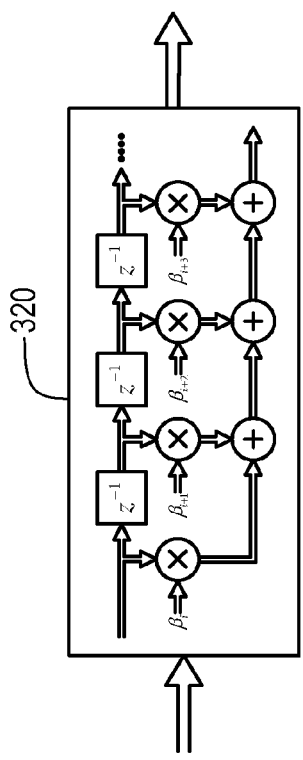
FIG. 13A is a block diagram illustrating a conventional structure for implementing a bandpass, signal-reconstruction filtering using a digital (e.g., Hann) bandpass finite-impulse-response (FIR) filter.

For high-resolution converter applications (e.g., requiring up to 10 bits of conversion accuracy), the present inventor has discovered that conventional FIR filter banks, such as those used in $\text{MB}\Delta\Sigma$ (such as in Aziz) converters and the FIR window filters (i.e., Hann filters) described by Beydoun, have suitable quantization noise attenuation and signal-reconstruction properties for two-sided bandwidths of $$\frac{1}{2} \cdot f_S / (N \cdot M)$$

and impulse-response lengths of 4·N·M, or potentially 30% less than that as described in Beydoun (i.e., length 256 filter with N=10 and M=8). Conventionally, it is well-understood that bandpass responses for digital signal reconstruction filter banks can be devised (such as in Aziz and Beydoun) using a two-step process. First, conventional techniques, such as the Parks-McClellan algorithm and window-based methods, are used to design a lowpass FIR filter response with suitable signal reconstruction properties (i.e., prototype filter); and if necessary, the prototype response is refined using iterative routines, spectral factorization, or constrained optimization techniques. Next, a lowpass-to-bandpass transformation is performed via multiplication of the prototype filter coefficients by a cosine wave having a frequency equal to the desired center frequency (a) of the bandpass filter (i.e., cosine-modulated filter banks). The result is a transversal FIR bandpass filter 320, such as that illustrated in FIG. 13A, which performs frequency decomposition (spectral slicing or signal analysis) and signal reconstruction (synthesis) by a direct bandpass filtering. The present inventor has determined that a 256-tap transversal FIR prototype design based on a Hann window (i.e., Beydoun), ensures greater than 62 decibels (dB) of quantization noise attenuation (i.e., 10-bit resolution), with negligible amplitude and phase distortion, for fourth-order noise shaping and an oversampling ratio of N·M=10·8=80.

Figure 13B:
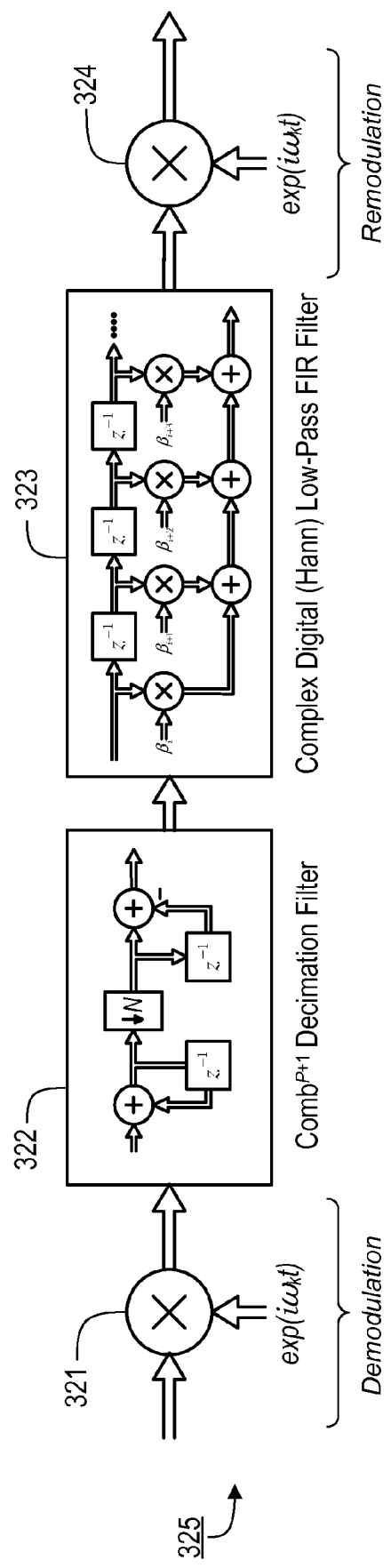
FIG. 13B is a block diagram illustrating a conventional structure for bandpass, signal-reconstruction filtering using: (a) digital demodulation, (b) comb$^{P+1}$ decimation, (c) complex digital (e.g., Hann) lowpass FIR filtering, and (d) remodulation.
Figure 13C:
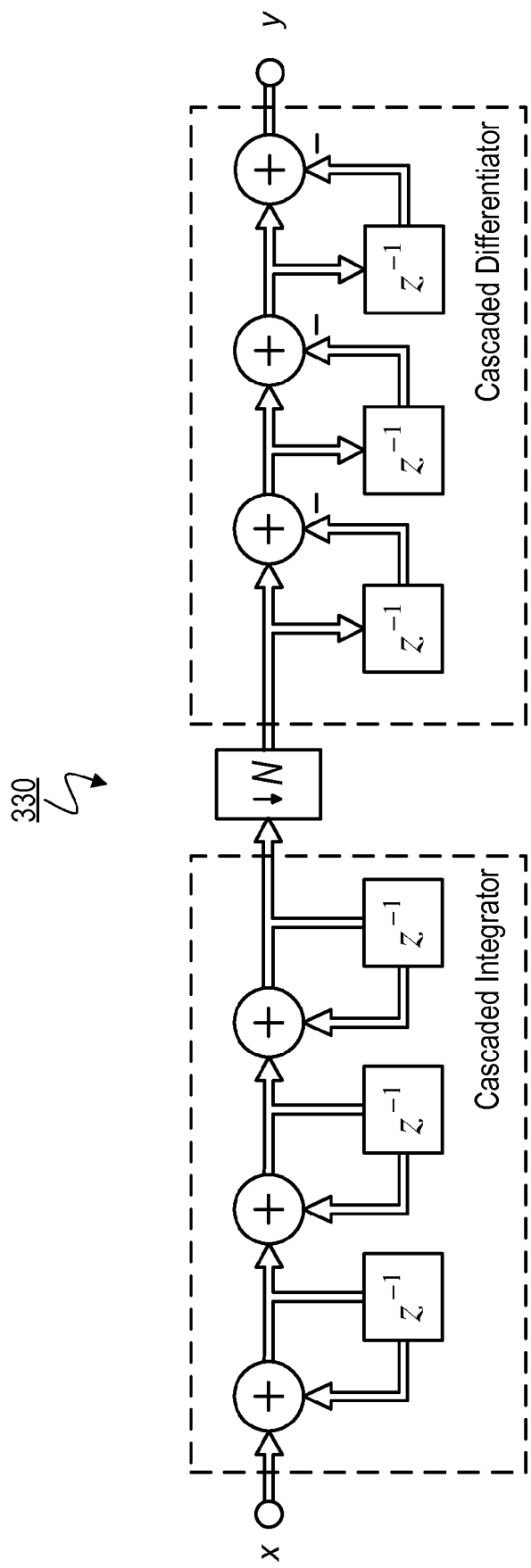
FIG. 13C is a block diagram illustrating a conventional structure for lowpass, signal reconstruction using a comb$^3$ (i.e., sinc$^3$) digital filter comprised of cascaded integrators and differentiators, with decimation by N.

However, the present inventor has discovered that the performance of conventional, bandpass filter banks is realized at the expense of very high complexity, as these transversal filters require up to 2·M multiplications and 4·M additions per processing branch. Generally (as described in Beydoun), a small reduction in filter complexity is realized for MBΔΣ converters with an excess-rate oversampling ratio N>1 when, as shown in FIG. 13B, such bandpass filters 320 are implemented using an indirect method involving four steps: 1) signal downconversion 321 (i.e., demodulation) using exponential sequences to shift the applicable band (having a center frequency of $\omega_k$) to a center frequency of zero; 2) comb$^{P+1}$ decimation 322 (i.e., by the excess-rate oversampling ratio N); 3) frequency decomposition and signal reconstruction using transversal, lowpass filter 323 based on a prototype FIR response (i.e., a Hann window filter); and 4) signal upconversion 324 (i.e., remodulation) to shift the applicable band back to its original frequency range (i.e., centered at $\omega_k$). The latter, indirect method potentially reduces the complexity of the frequency decomposition and signal reconstruction process by reducing the data rates associated with the digital window (e.g., Hann) FIR filters, but is only advantageous for N>>1 (i.e., Beydoun). For Beydoun, the data rate reduction comes at the expense of added conventional comb$^{P+1}$ filter 322 for rate decimation.

Compared to conventional FIR filter banks, the present inventor has discovered that conventional comb$^{P+1}$ filters are a low-complexity alternative for frequency decomposition and signal reconstruction, because conventional comb$^{P+1}$ filters are recursive structures that require no multiplication operations. For example, a conventional two-factor comb$^{P+1}$ filter has transfer function $$C_2(z) = \left(\frac{1-z^{-J_1}}{1-z^{-1}}\right)^{p_1} \cdot \left(\frac{1-z^{-J_2}}{1-z^{-1}}\right)^{p_2},$$

where $J_2=J_1+1$, $p_1+p_2=P+1$, and P is the order of the delta-sigma modulator noise-shaped response (i.e., Galton). Conventional comb$^{P+1}$ (i.e., sinc$^{P+1}$) filters are more often implemented using a simpler, single-factor transfer function of the form $$C_1(z) = \left(\frac{1-z^{-kN}}{1-z^{-1}}\right)^{P+1},$$

where k·N is the effective oversampling ratio of the converter (i.e., k=M). This single-factor form has frequency response nulls at multiples of the converter conversion rate (i.e., output data rate), which conventionally is considered near-optimal for oversampling converters in general. Conventionally (i.e., ΠΔΣ ADC), comb$^{P+1}$ filter banks are used in conjunction with lowpass ΔΣ modulators, where the required analog downconversion operation is based on Hadamard sequences that are rich in odd harmonic content. A consequence of this rich harmonic content is intermodulation distortion (i.e., related to harmonic intermodulation products) that degrades frequency decomposition and signal reconstruction quality. In addition, the present inventor has discovered that, unlike conventional FIR filter banks, conventional comb$^{P+1}$ filter banks introduce appreciable amplitude and phase distortion.

Examples are the conventional two-factor comb$^{P+1}$ filters $C_2(z)$ that have been contemplated for ΠΔΣ converters (i.e., Galton). For ΠΔΣ converters with effective oversampling ratio N·M=1·16=16 and sixth-order noise shaping (P=6), a two-factor comb$^{P+1}$ filter having $J_1=19$, $J_2=20$, $p_1=3$, and $p_2=4$ has been contemplated. Compared to conventional FIR (transversal) filter banks, the present inventor has determined that such a comb$^{P+1}$ filter realizes a nearly equal quantization noise attenuation level of 61 dB (i.e., ~10-bit resolution), but achieves a much lower signal-to-distortion power ratio (SDR) of 16 dB (i.e., <3-bit resolution). Furthermore, the two-factor comb$^{P+1}$ filter $C_2(z)$ contemplated for ΠΔΣ conversion with effective oversampling ratio N·M=10·4=40 and fourth-order noise shaping (P=4), has $J_1=50$, $J_2=51$, $p_1=3$, and $p_2=2$. The present inventor has ascertained that this second filter attenuates quantization noise by more than 59 dB (i.e., ~10-bit resolution), but with an SDR of only 2 dB (i.e., ~½-bit resolution). In addition, the present inventor has determined that for a ΠΔΣ converter with the same 40-times oversampling ratio, a conventional sinc$^{P+1}$ filter of single-factor form (i.e. $C_1(z)$ with k=M) offers an improved SDR of 24 dB (i.e., 6-bit resolution), but the penalty is a lower quantization noise attenuation level of 54 dB (i.e., ~9-bit resolution). Therefore, with SDR levels reaching only 24 dB, the demonstrated signal reconstruction properties of conventional comb$^{P+1}$ (sinc$^{P+1}$) filter responses are inadequate for high-resolution (i.e., 10 bits or greater), oversampling converters with many parallel processing branches (i.e., M>8). Consequently, to overcome the SDR limitations of conventional comb filters, especially two-factor comb$^{P+1}$ filters that exhibit high levels of quantization noise attenuation, relatively complex output equalizers (e.g., Galton) are employed in conventional ΠΔΣ oversampling converters to reduce the amplitude and phase distortion that otherwise limits converter resolution to about 6 bits. These output equalizers, however, increase circuit complexity and cannot perfectly eliminate the amplitude and phase distortion of the comb$^{P+1}$ filter bank because they conventionally require FIR approximations to what are non-causal IIR responses (e.g., as described by Galton).

Apparently not understood by Beydoun, the present inventor has discovered that recursive window filters are a better alternative to conventional, transversal FIR filter banks (and comb$^{P+1}$ filters) for frequency decomposition and signal reconstruction, because recursive window filters exhibit equivalent properties to transversal window filters, but typically can be implemented more efficiently (i.e., with fewer adds and multiplies). For example, consider a lowpass prototype filter with impulse response $$h_{win}(n) = a_0 - a_1 \cdot \cos\left(\frac{2\pi n}{L-1}\right) + a_2 \cdot \cos\left(\frac{4\pi n}{L-1}\right) - a_3 \cdot \cos\left(\frac{6\pi n}{L-1}\right),$$

where $a_0=0.35875$, $a_1=0.48829$, $a_2=0.14128$, $a_3=0.01168$, and L=4·(N·M−1). This filter response, which is defined in the prior art as a Blackman-Harris window filter response (a similar structure exists for the Hann window), realizes signal-to-distortion power ratios of greater than 84 dB (i.e., 14-bit resolution) and provides greater than 59 decibels (dB) of quantization noise attenuation (i.e., ~10-bit resolution), for fourth-order noise shaping and 64 processing branches (M). As significantly, this filter has a recursive transfer function equal to $$T_{win}(z) = a_0 \cdot \frac{1-z^{-L}}{1-z^{-1}} - \sum_{i=1}^{3} a_i \cdot \frac{1-\cos\left(\frac{2\pi i}{L-1}\right) \cdot (z^{-1}+z^{-L}) + z^{-(L+1)}}{1-2\cdot\cos\left(\frac{2\pi i}{L-1}\right)\cdot z^{-1} + z^{-2}},$$

which requires only 10 multiply operations for lowpass filtering, regardless of the filter impulse response length L. Additional multiplication operations are required for transforming the lowpass prototype response to a bandpass response, using downconversion followed by upconversion, but the recursive window filters still represent a considerable complexity savings over the transversal FIR approach described by Beydoun. However, the present inventor has discovered that when recursive window filters of this form are implemented using high-frequency, parallel-processing methods, such as polyphase decomposition, the complexity costs associated with coefficient dynamic range expansion can exceed any complexity savings afforded by the recursive structure.

A preferable alternative to recursive window filters and conventional methods for frequency decomposition and signal reconstruction is an innovation referred to herein as Bandpass Moving-Average (BMA) filtering. The BMA filter bank method features high stopband attenuation and negligible amplitude and phase distortion, in conjunction with low complexity. Conventional comb$^{P+1}$, or sinc$^{P+1}$, filters (i.e., Galton) can be considered a subset of a more general class of lowpass filters that can be called cascaded moving-average filters. The present inventor has discovered that although conventional comb$^{P+1}$ filter banks do not exhibit near-perfect signal reconstruction properties, certain types of cascaded moving-average filters (MAF) do exhibit near-perfect signal reconstruction properties. These moving-average filters are similar to conventional comb$^{P+1}$ filters, except that: 1) the overall filter order is not constrained to be P+1; 2) the $J_1$ and $J_2$ parameters of the two-factor form $C_2(z)$ are not constrained to the relationship $J_2=J_1+1$; and 3) the k·M product of the single-factor form $C_1(z)$ is not constrained to equal N·M, the effective oversampling ratio of the converter (i.e., the filter frequency response is not constrained to have nulls at multiples of the output data rate). By removing the constraints that are conventionally placed on ΠΔΣ comb$^{P+1}$ filters, the present inventor has been able to devise recursive, moving-average prototype responses that have near-perfect reconstruction properties and are suitable for frequency decomposition and signal reconstruction in MBO converters that have many parallel processing branches.

Figure 14A:
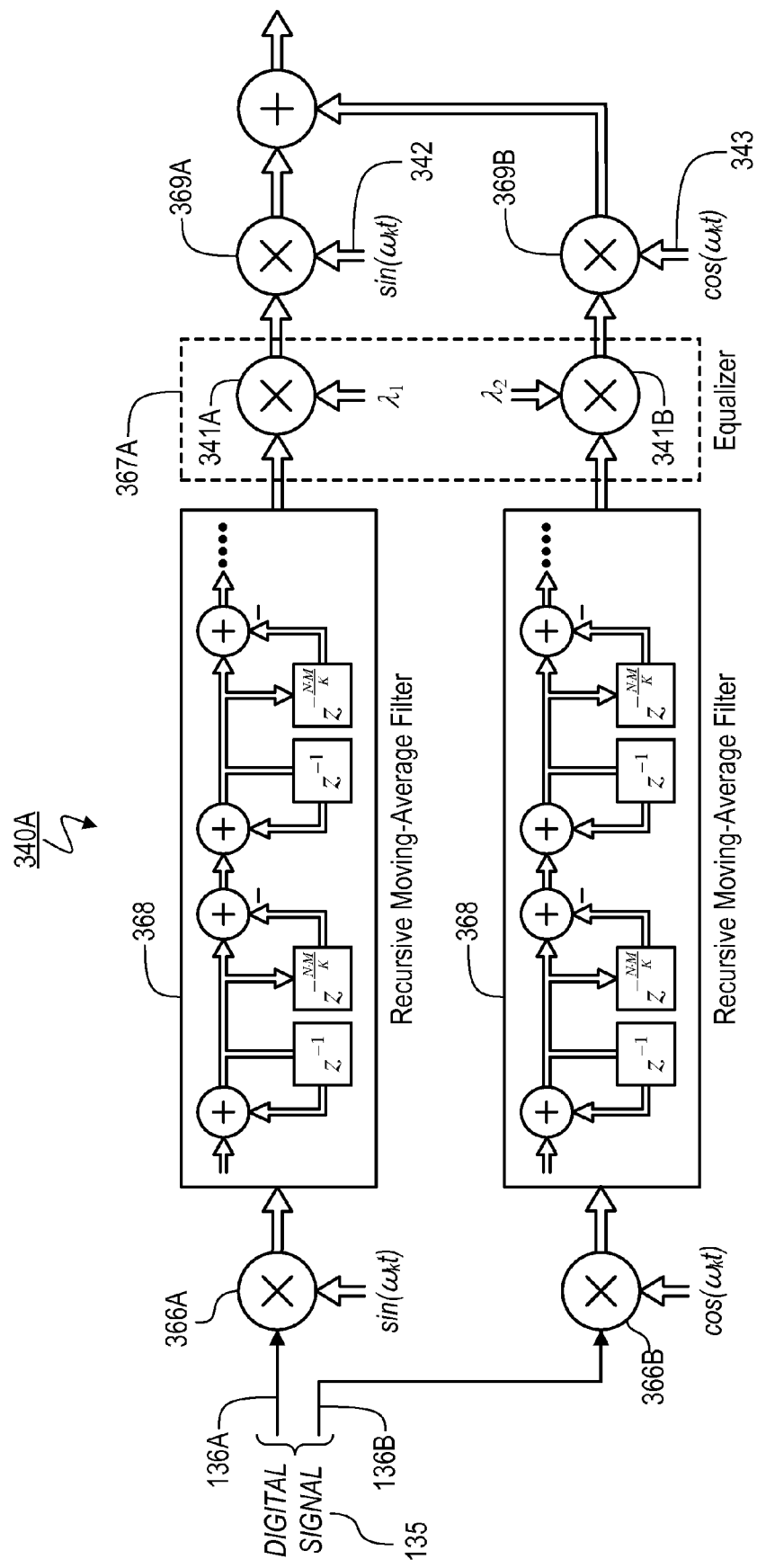
FIG. 14A is a block diagram of a Bandpass Moving Average (BMA) signal-reconstruction filter according to a representative embodiment of the invention that includes a single, complex tap equalizer and recursive moving-average filters with quadrature frequency conversion.
Figure 14B:
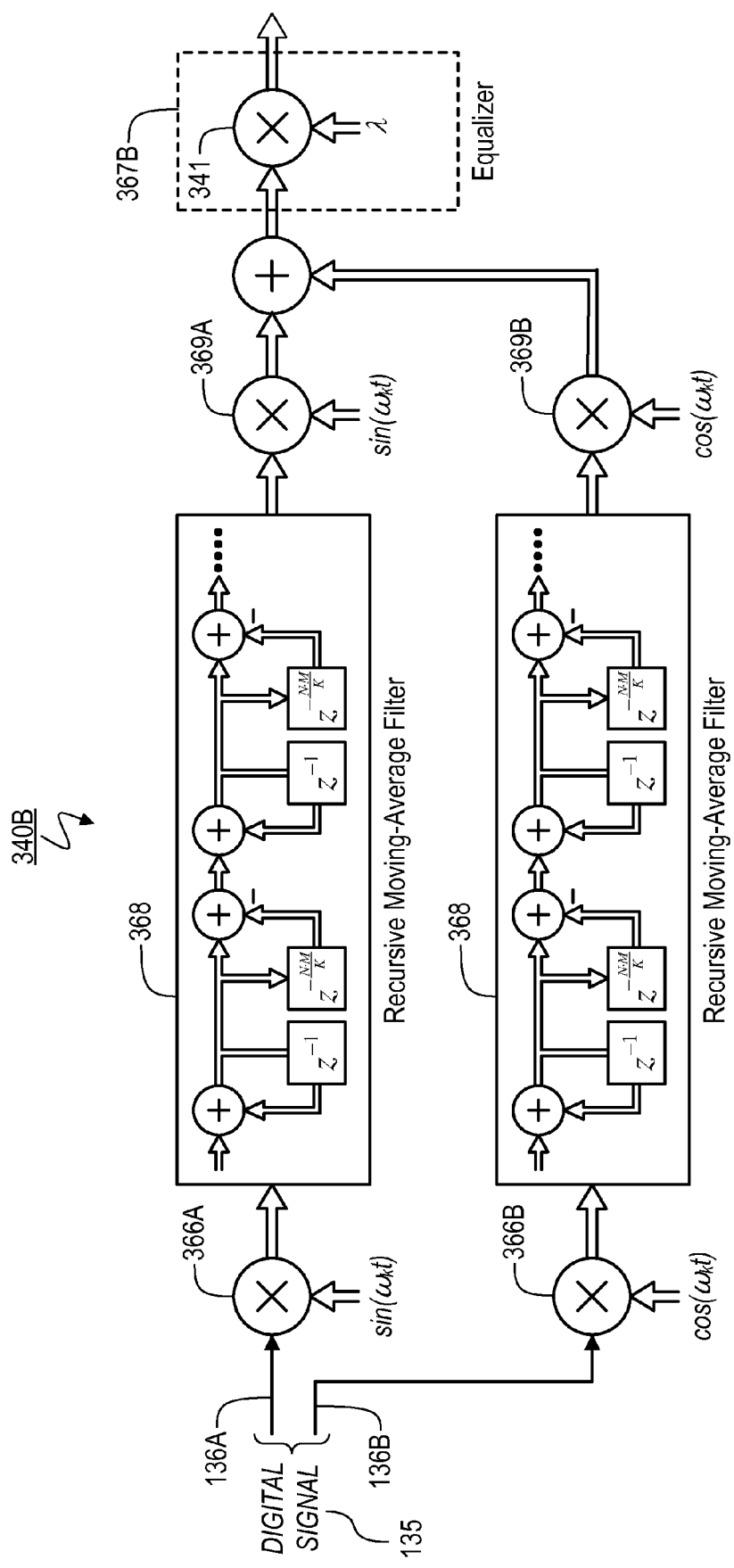
FIG. 14B is a block diagram of a Bandpass Moving Average (BMA) signal reconstruction filter according to a representative embodiment of the invention that includes a single, real tap equalizer and recursive moving-average filters with quadrature frequency conversion.

A block diagram of an exemplary BMA filter 340A is shown in FIG. 14A, and an alternate BMA filter 340B is shown in FIG. 14B (collectively referred to as BMA filter 340). As FIG. 14A illustrates, a BMA filter according to the present embodiment of the invention consists of: 1) a quadrature downconverter (i.e., dual multipliers 366A&B) that uses sine and cosine sequences to shift the band of the input digital signal 135 from a center frequency of $\omega_k$ (i.e., the center frequency of the associated MBO processing branch) to a center frequency of zero; 2) a pair of cascaded moving-average filters 368 (MAF) that performs frequency decomposition and near-perfect signal reconstruction using operations comprising only adders and delay registers (i.e., no multipliers); 3) a complex single-tap equalizer 367 (i.e., dual multiplier) that applies an amplitude and/or phase correction factor to the output of the moving-average filter 368 (i.e., via scalar coefficients $\lambda_1$ and $\lambda_2$); and 4) a quadrature upconverter (i.e., dual multipliers 369A&B) that uses sine and cosine sequences to shift the equalizer 367 output from a center frequency of zero back to a center frequency of $\omega_k$ (i.e., the original center frequency of the associated MBO processing branch). It will be readily appreciated that when the band of the input signal is centered at zero frequency (i.e., DC), the quadrature downconversion function can be eliminated, for example, by: 1) setting the downconversion cosine sequence to all ones; and 2) setting the downconversion sine sequence to all zeros, such that only half of the BMA filter pair is active. Since the center frequency of the BMA filter is equal to the frequency ($\omega_k$) of the sine and cosine sequences used in the downconversion and upconversion operations, the center frequency of the BMA filter can be adjusted to the desired center of a particular MBO processing branch by varying the period (i.e., $1/\omega_k$) of the respective sine and cosine sequences. BMA 340 introduces negligible intermodulation distortion and negligible amplitude and phase distortion by combining cascaded moving-average filters 368 having near-perfect reconstruction properties, with sinusoid-based quadrature downconversion 366A&B and upconversion 369A&B operations for transforming prototype lowpass response of BMA 340 to a bandpass response (i.e., as opposed to the Hadamard conversion described in Galton for ΠΔΣ). Furthermore, these low-complexity BMA filter structures do not require separate decimation filters 322 (as described by Beydoun).

The BMA equalizer, shown as a complex single tap filter 367A in FIG. 14A and alternatively as a real single tap filter 367B in FIG. 14B (collectively referred to as equalizer 367), corrects for phase and/or amplitude (i.e., gain) offsets that may occur among the various MBO parallel processing branches due to: 1) analog component tolerances; and 2) DFL signal transfer functions (STF) that deviate from an ideal all-pass response (i.e., the DFL STF is approximately all-pass, but not precisely all-pass, across the bandwidth of a given MBO processing branch). The degree to which the DFL STF deviates from an ideal all-pass response is directly related to the bandwidth of a given MBO processing branch. When all the MBO branches have equal processing bandwidth (i.e., uniform spacing of processing branch center frequencies), the bandwidth of each MBO processing branch is given by $$\frac{1}{2} \cdot f_S / (N \cdot M),$$

where $f_S$ is the converter sample rate, N is the converter excess-rate oversampling ratio, and M is the converter interleave factor. A single tap equalizer adds little additional complexity to the BMA 340 filter (i.e., one or two multipliers), and therefore, is preferable for large interleave factors, such as for M≥50, because relatively narrow MBO processing branch bandwidths result in DFL STFs that deviate little from an ideal all-pass response. However, the added complexity of multi-tap equalizers (i.e., implemented as transversal or recursive structures) is preferable for small interleave factors, such as for M≤10, because wider MBO processing branch bandwidths result in DFL STFs that exhibit greater deviation from an ideal all-pass response.

As will be readily appreciated, the BMA equalizer 367 can be moved upstream of the moving-average filter 368, and/or any portion or all of the equalizer 367 desired transfer function can be moved upstream of the moving-average filter 328, without affecting the overall transfer function of BMA filter 340. As will be further readily appreciated (although not specifically mentioned in U.S. patent application Ser. No.

12/985,238), the BMA equalizer 367 can be moved downstream of the quadrature upconverter (i.e., dual multipliers 369A&B). In other embodiments of the present invention, which were not disclosed in U.S. patent application Ser. No. 12/985,238, the BMA equalizer 367 function is integrated with the quadrature upconverter by directly scaling the amplitude and/or phase of the sine sequence 342 and cosine sequence 343 that shift the output of BMA filter 340 from a center frequency of zero back to a center frequency of $\omega_k$ (i.e., dual multipliers 369A&B simultaneously provide equalization and upconversion). More specifically, in these other embodiments, the sine sequence 342 becomes $A\cdot\sin(\omega_k+\theta)$ and the cosine sequence 343 becomes $A\cdot\cos(\omega_k+\theta)$, where $A=\sqrt{\lambda_1^2+\lambda_2^2}$ and $\theta=\tan^{-1}(\lambda_1/\lambda_2)$.

The moving-average prototype filters 368 utilized in the Bandpass Moving-Average (BMA) signal reconstruction method have both non-recursive and recursive forms and preferably have the general transfer function $$F(z) = \prod_{i=0}^{R-1} \left( \sum_{j=0}^{2NM/K_i - 1} z^{-j} \right)^{p_i} = \prod_{i=0}^{R-1} \left( \frac{1 - z^{-2NM/K_i}}{1 - z^{-1}} \right)^{p_i},$$

where filter parameters R, $K_i$ and $p_i$ are integers, and the exponent $-2\cdot N\cdot M/K_i$ is also an integer. Although not specifically disclosed in U.S. patent application Ser. No. 12/985,238, the bandwidth ($B_N$) of the BMA filter is directly proportional to $K_i$ and inversely proportional to the product $N\cdot M$, such that $B_N \propto K_i/(N\cdot M)$, and the steepness (i.e., order) of the transition region between the passband and stopband is directly proportional to the filter parameter $p_i$. The factor $N\cdot M/K_i$ is equal to the number of samples included in the moving-average operation performed by each filter stage. Since the factor $N\cdot M/K_i$ determines a number of sample-rate delays in the transfer function of the moving-average prototype filter (i.e., according to the term $z^{-N\cdot M/K_i}$), the bandwidth (i.e., number of averages) of the BMA filter can be adjusted to the desired bandwidth of a particular MBO processing branch by configuring, for example, the number of stages in a pipelined delay register. Increasing the number of delay stages by 1% produces a corresponding 1% reduction of the BMA filter bandwidth, and decreasing the number of delay stages by 1% produces a corresponding 1% expansion of the BMA filter bandwidth. In alternative embodiments, the preferred sample-rate delay is realized using other conventional means, such as: 1) configurable digital register files and/or 2) variable-length, first-in-first-out (FIFO) memories. Unlike conventional FIR bandpass filters, therefore, the bandwidth of the BMA filter is not determined by complex signal processing operations (i.e., multiple stages of multiply-accumulate functions).

Referring to the prototype, moving-average transfer function F(z) above, the complexity of the prototype moving-average filter increases as the number of cascaded stages S increases, and therefore, S which is given by:

$$S = \sum_{i=0}^{R-1} p_i,$$

is preferably small, e.g., $S \leq 3$. The quantization noise attenuation ($A_{QN}$) of the BMA filter bank increases with increasing prototype filter impulse response length, L, given by $$L = 1 + \sum_{i=0}^{R-1} p_i \cdot (2NM/K_i - 1).$$

The amplitude and phase distortion introduced by the BMA filter bank is minimized (i.e., maximum SDR) for prototype filter impulse responses of length $L \leq 4\cdot N\cdot M - 1$, where as before, M is the MBO converter interleave factor and N is the MBO converter excess-rate oversampling ratio, preferably such that $N \ll M$. Thus, for maximum converter resolution, the prototype filter parameters R, $K_i$ and $p_i$ preferably result in a prototype filter of length $L = 4\cdot N\cdot M - 1$, or as close to that as possible. However, filter quantization noise attenuation ($A_{QN}$) is not a one-to-one function of L, as illustrated by the results in Table 2, which gives $A_{QN}$ and SDR for exemplary prototype moving-average filter responses with M=64. Specifically, some L-length prototype moving-average filters realize greater quantization noise attenuation than other L-length prototype moving-average filters. More preferably, therefore, the three BMA prototype filter parameters are optimized, for example using trial-and-error or a conventional constrained optimization method, such that both signal-to-distortion ratio (SDR) and quantization noise attenuation ($A_{QN}$) meet the minimum levels needed to achieve a specified MBO converter resolution (e.g., both SDR and $A_{QN}$ preferably exceeding ~60 dB for 10-bit resolution).

TABLE 2

Exemplary Prototype Responses for Bandpass Moving-Average Signal Reconstruction (N = 1, M = 64)

| Prototype Transfer Function | Filter Length (L) | P = 2 $A_{QN}$ (dB) | P = 2 SDR (dB) | P = 4 $A_{QN}$ (dB) | P = 4 SDR (dB) |
|---|---|---|---|---|---|
| $F(z) = \left(\frac{1 - z^{-NM}}{1 - z^{-1}}\right)^4$ | 4NM − 3 | 35 | 105 | 60 | 105 |
| $F(z) = \left(\frac{1 - z^{-NM}}{1 - z^{-1}}\right)^3 \left(\frac{1 - z^{-NM/2}}{1 - z^{-1}}\right)^2$ | 4NM − 4 | 34 | 129 | 59 | 129 |
| $F(z) = \left(\frac{1 - z^{-NM}}{1 - z^{-1}}\right)^3 \left(\frac{1 - z^{-NM/4}}{1 - z^{-1}}\right)^6$ | 9/2 NM − 8 | 34 | 76 | 58 | 76 |

TABLE 2-continued

Exemplary Prototype Responses for Bandpass Moving-Average Signal Reconstruction (N = 1, M = 64)

| Prototype Transfer Function | Filter Length (L) | P = 2 $A_{QN}$ (dB) | P = 2 SDR (dB) | P = 4 $A_{QN}$ (dB) | P = 4 SDR (dB) |
|---|---|---|---|---|---|
| $F(z) = \left(\frac{1-z^{-2NM}}{1-z^{-1}}\right)\left(\frac{1-z^{-NM/2}}{1-z^{-1}}\right)^4$ | 4NM − 4 | 36 | 120 | 60 | 120 |
| $F(z) = \left(\frac{1-z^{-2NM}}{1-z^{-1}}\right)\left(\frac{1-z^{-NM}}{1-z^{-1}}\right)^2$ | 4NM − 2 | 38 | 72 | 64 | 72 |
| $F(z) = \left(\frac{1-z^{-NM}}{1-z^{-1}}\right)^3\left(\frac{1-z^{-NM/2}}{1-z^{-1}}\right)\left(\frac{1-z^{-NM/4}}{1-z^{-1}}\right)^2$ | 4NM − 5 | 34 | 148 | 58 | 148 |
| $F(z) = \left(\frac{1-z^{-2NM}}{1-z^{-1}}\right)\left(\frac{1-z^{-NM/2}}{1-z^{-1}}\right)^3\left(\frac{1-z^{-NM/4}}{1-z^{-1}}\right)^2$ | 4NM − 5 | 36 | 138 | 59 | 138 |
| $F(z) = \left(\frac{1-z^{-2NM}}{1-z^{-1}}\right)\left(\frac{1-z^{-NM}}{1-z^{-1}}\right)\left(\frac{1-z^{-NM/4}}{1-z^{-1}}\right)^4$ | 4NM − 5 | 37 | 132 | 62 | 132 |
| $F(z) = \left(\frac{1-z^{-2NM}}{1-z^{-1}}\right)\left(\frac{1-z^{-NM}}{1-z^{-1}}\right)\left(\frac{1-z^{-NM/2}}{1-z^{-1}}\right)^2$ | 4NM − 3 | 37 | 96 | 63 | 96 |

As Table 2 indicates, cascaded moving-average prototype filters can realize attenuation of quantization noise at levels that are greater than 64 dB (i.e., ~11-bit resolution for P=4 and M=64) with negligible distortion (e.g., SDR up to 148 dB), thereby eliminating the need for the output equalizers that increase circuit complexity in ΠΔΣ ADCs (i.e., see Galton). The result is that converter resolution with BMA signal reconstruction filter banks is generally limited by the quantization noise attenuation ($A_{QN}$) of the filter bank, which can be enhanced (i.e., to improve converter resolution) by one or more approaches: 1) increasing noise-shaped response order P; 2) increasing the number of parallel processing branches M; and/or 3) increasing the order (i.e., length) of the BMA prototype response. Conversely, converter resolution with conventional comb$^{P+1}$ filter banks (i.e., ΠΔΣ ADC), is limited by signal-to-distortion ratio, which cannot be offset by any of the above three approaches. Consequently, the preferred embodiment of the MBO converter uses a Bandpass Moving-Average (BMA) method for frequency decomposition and signal reconstruction, instead of a conventional signal reconstruction scheme, because BMA reconstruction yields both the superior performance of conventional, transversal FIR filter banks and the low complexity of conventional comb$^{P+1}$ filters, for large interleave factors (i.e., M>8). It should be noted that for converter applications that require less resolution (i.e., that can tolerate lower SDR), it is possible to increase the BMA prototype impulse response length L beyond the preferable 4·M·N−1 upper limit (e.g., see row 3 of Table 2). Also, it should be noted that for converter applications where low latency is critical, it can be advantageous to use filter lengths L that are much less than the preferable upper limit (i.e., since latency increases with increasing length L) at the expense of lower $A_{QN}$.

Besides exhibiting near-perfect reconstruction properties and realizing high levels of quantization noise attenuation, cascaded moving-average prototype filters of the type given in Table 2 can be very low in complexity because they require no multiplication operations. For example, the 3-stage (i.e., S=3) prototype filter transfer function given by $$F(z) = \left(\frac{1-z^{-2NM}}{1-z^{-1}}\right)\left(\frac{1-z^{-NM}}{1-z^{-1}}\right)^2$$

Figure 14C:
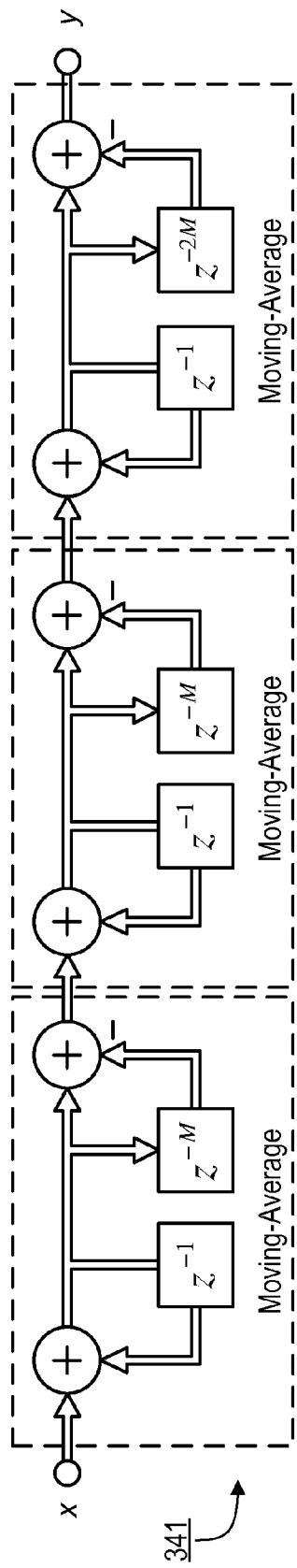
FIGS. 14C-E are block diagrams illustrating representative forms of recursive moving-average prototype filters for BMA signal reconstruction.
Figure 14D:
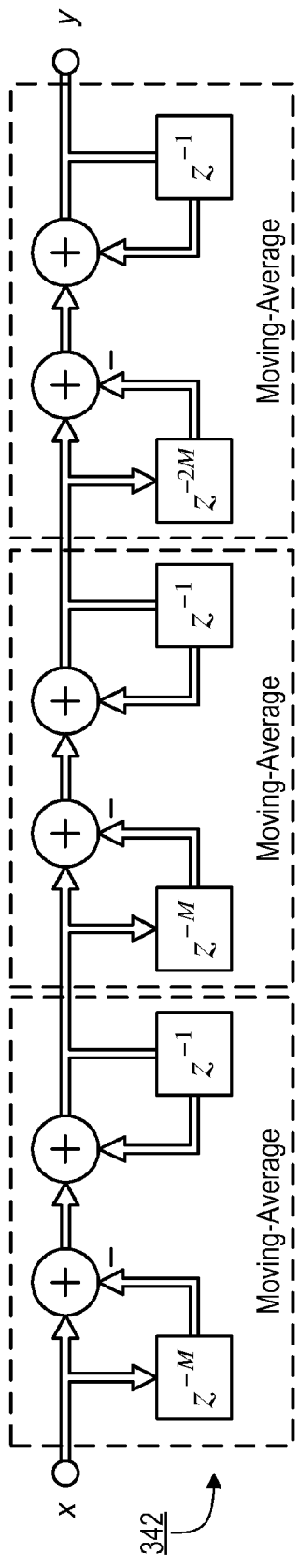
Figure 14E:
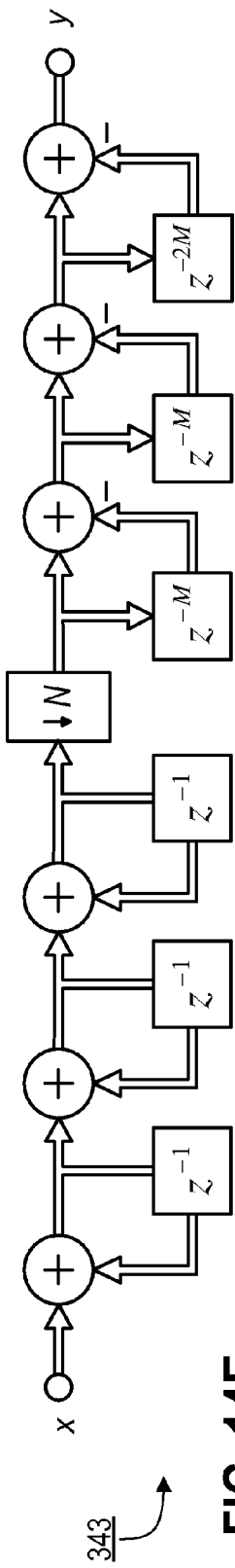

(see row 5 of Table 2) requires only 6 additions, independent of filter length (L=4·N·M−2), plus 4·M+3 registers, as illustrated by the exemplary moving-average prototype filters 341-343 in FIGS. 14C-E. FIGS. 14C&D show exemplary moving-average filter structures 341 and 342, respectively, for use with an excess-rate oversampling ratio of N=1, and FIG. 14E shows an exemplary moving-average filter structure 343 for use with N>1. With these moving-average prototype filters, the only multiplication operations required are those necessary for transforming prototype lowpass responses to bandpass responses. Bandpass transformation based on quadrature downconversion and upconversion, as shown in FIGS. 14A&B, requires only 4 multiplies when direct digital synthesis (e.g., employing digital accumulators with sine/cosine lookup memories) is used to generate the sine ($x_n$) and cosine ($y_n$) sequences, shown in FIGS. 14A&B as $\cos(\omega_k t)$ and $\sin(\omega_k t)$, that are needed for the quadrature downconversion and upconversion operations. Alternatively, the sine ($x_n$) and cosine ($y_n$) sequences can be generated using CORDICs (i.e., COordinate Rotation DIgital Computer) or other recursive operations that require no lookup memory, such as those represented by the following conventional difference equations:

$x_n = 2 \cdot \cos(\omega_0) \cdot x_{n-1} - x_{n-2}$ $y_n = 2 \cdot \cos(\omega_0) \cdot y_{n-1} - y_{n-2}$ with initial conditions $x_0 = -A \cdot \sin(2 \cdot \omega_0 - \theta)$, $x_1 = -A \cdot \sin(\omega_0 - \theta)$ $y_0 = A \cdot \cos(2 \cdot \omega_0 - \theta)$, $y_1 = A \cdot \cos(\omega_0 - \theta)$.

Although Bandpass Moving-Average (BMA) frequency decomposition and signal reconstruction using cascaded moving-average filter (MAF) prototypes, such as filters 341-

343 described above, generally is preferred because such a structure provides a substantial savings in computational complexity, particularly for interleave factors (M) greater than 8, the conventional, transversal FIR filter bank and transversal window filter approaches can provide equal or less complexity for small interleave factors. In the preferred embodiments, a MAF or BMA filter includes two, three or more cascaded stages, each performing a moving-average function.

Figure 15A:
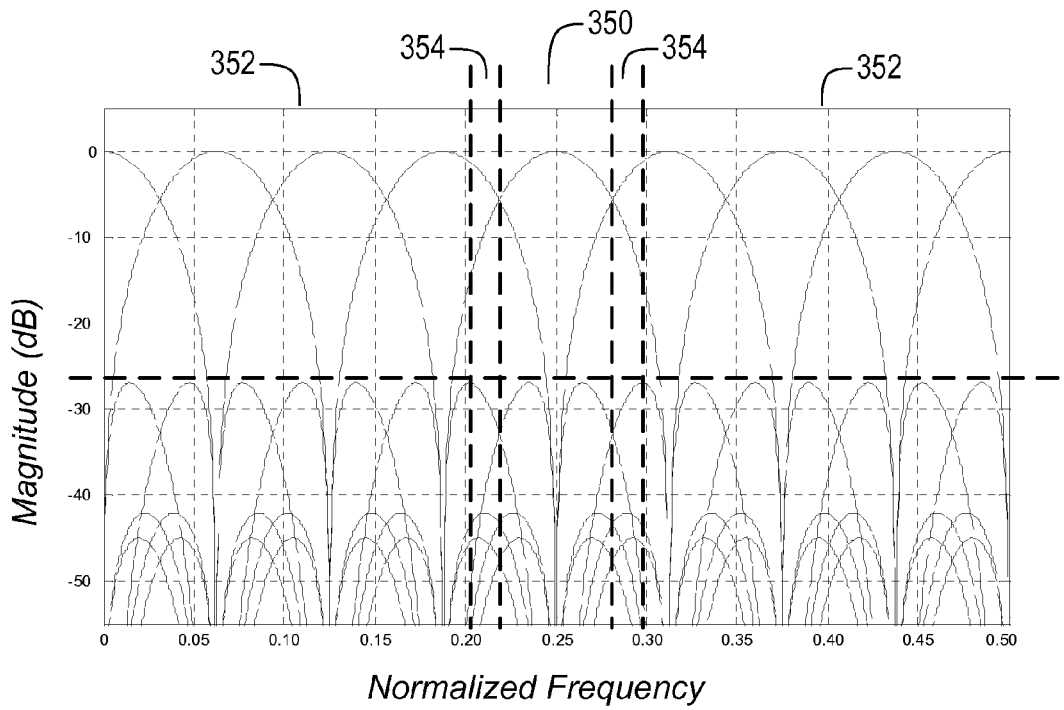
FIG. 15A illustrates frequency responses of a Bandpass Moving Average signal reconstruction filter bank used in a MBO converter according to a representative embodiment of the present invention.
Figure 15B:
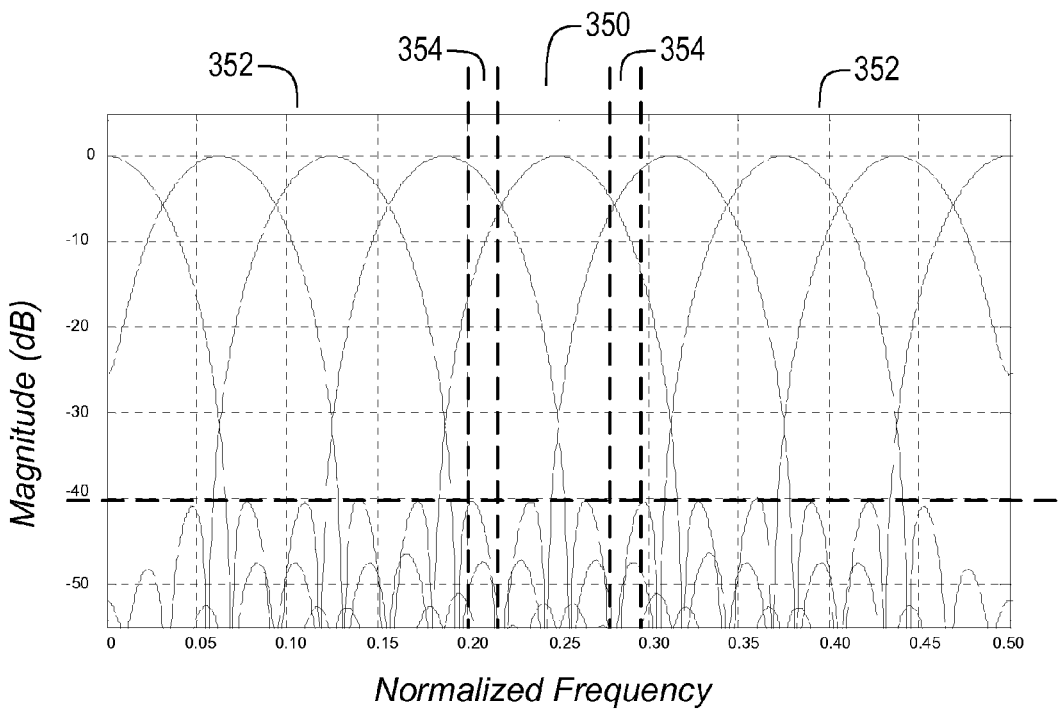
FIG. 15B illustrates the frequency responses of a conventional signal reconstruction FIR filter bank based on a Kaiser window function.

For an interleave factor of M=9, the frequency response of a Bandpass Moving-Average (BMA) signal reconstruction filter bank is shown in FIG. 15A, based on moving-average filters 341-343 described above (i.e., row 5 in Table 2) for evenly-spaced (i.e., uniformly-spaced) center frequencies, and after accounting for the frequency translation effects of the downconversion and upconversion processes. Each of these bandpass filters includes a passband region 350, stopband regions 352 in which all frequencies are suppressed with an attenuation of at least 25 dB (resulting in a quantization noise attenuation of 64 dB for fourth-order noise shaping and M=64), and transition regions 354 between the passband region 350 and the stopband regions 352. For the filters centered at zero frequency and ½·$f_S$, the transition regions 354 together occupy only approximately the same bandwidth as the passband region 350. For all filters other than the one centered at zero frequency and ½·$f_S$, the transition regions 354 together only occupy approximately half of the bandwidth of the passband region 350. In addition, the amplitude and phase distortion of such a filter bank are negligible compared to a bank of filters that does not exhibit near-perfect reconstruction properties (e.g., $sinc^{P+1}$ filters). For comparison, the frequency response of a conventional FIR filter bank (i.e., Kaiser window prototype with β=3) system is shown in FIG. 15B for M=9.

As discussed in the Noise Shaping Filter Considerations section, a representative embodiment of the invention can employ multiple processing branches (M) where, due to the dependence of the noise shaping filter response on the coarse tuning (delay) parameter ($T_1$), the quantization noise notch frequencies ($f_{notch}$) are not uniformly spaced and the orders (P) of the quantization noise-shaped responses are not the same across the converter processing branches. In this representative embodiment of the invention, it is preferable that the BMA reconstruction filter center frequencies and bandwidths are also non-uniform, with center frequencies that are aligned with the notch frequencies ($f_{notch}$) and bandwidths that are dependent upon the noise shaping orders (P) of the DFLs in the respective processing branches. For DFLs with relatively higher-order noise-shaped responses (i.e., lower $T_1$ relative to 1/$f_S$), it is preferable for the BMA reconstruction filters to have wider (preferably proportionally wider) bandwidths. Conversely, for DFLs with relatively lower-order noise-shaped responses (i.e., higher $T_1$ relative to 1/$f_S$), it is preferable for the BMA reconstruction filters to have narrower (preferably proportionally narrower) bandwidths. Under these non-uniform conditions, it still is possible to realize near-perfect signal reconstruction using the BMA method by adjusting the center frequencies and bandwidths of the prototype responses (i.e., non-uniform frequency spacing introduces only a negligible amount of amplitude and phase distortion).

In applications involving very high conversion rates, multirate filter structures based on polyphase decomposition can significantly reduce the clock speeds at which the BMA circuitry (e.g., digital multipliers and adders) operates. For example, consider a moving-average operation with transfer function $$T_{mAvg}(z) = \frac{1 - z^{-N}}{1 - z^{-1}}$$

The above moving-average operation can be represented by the difference equation $$y_n = x_n - x_{n-N} + y_{n-1}.$$

and therefore, the difference equations for the first two output samples (i.e., n=1, 2) are $$y_2 = x_2 - x_{2-N} + y_1 \text{ and } y_1 = x_1 - x_{1-N} + y_0.$$

Substitution of $y_1$ into $y_2$ results in $$y_2 = x_2 - x_{2-N} + (x_1 - x_{1-N} + y_0) = x_2 + x_1 - x_{2-N} - x_{1-N} + y_0,$$

and the preceding equation can be generalized to $$y_n = x_n + x_{n-1} - x_{n-N} - x_{n-N-1} + y_{n-2}.$$

Because the calculation of $y_n$ requires only inputs and outputs that have been delayed by two or more samples in the above example, the moving-average function can be instantiated as a structure with two polyphase processing paths, each running at half the effective clock rate.

Figure 14F:
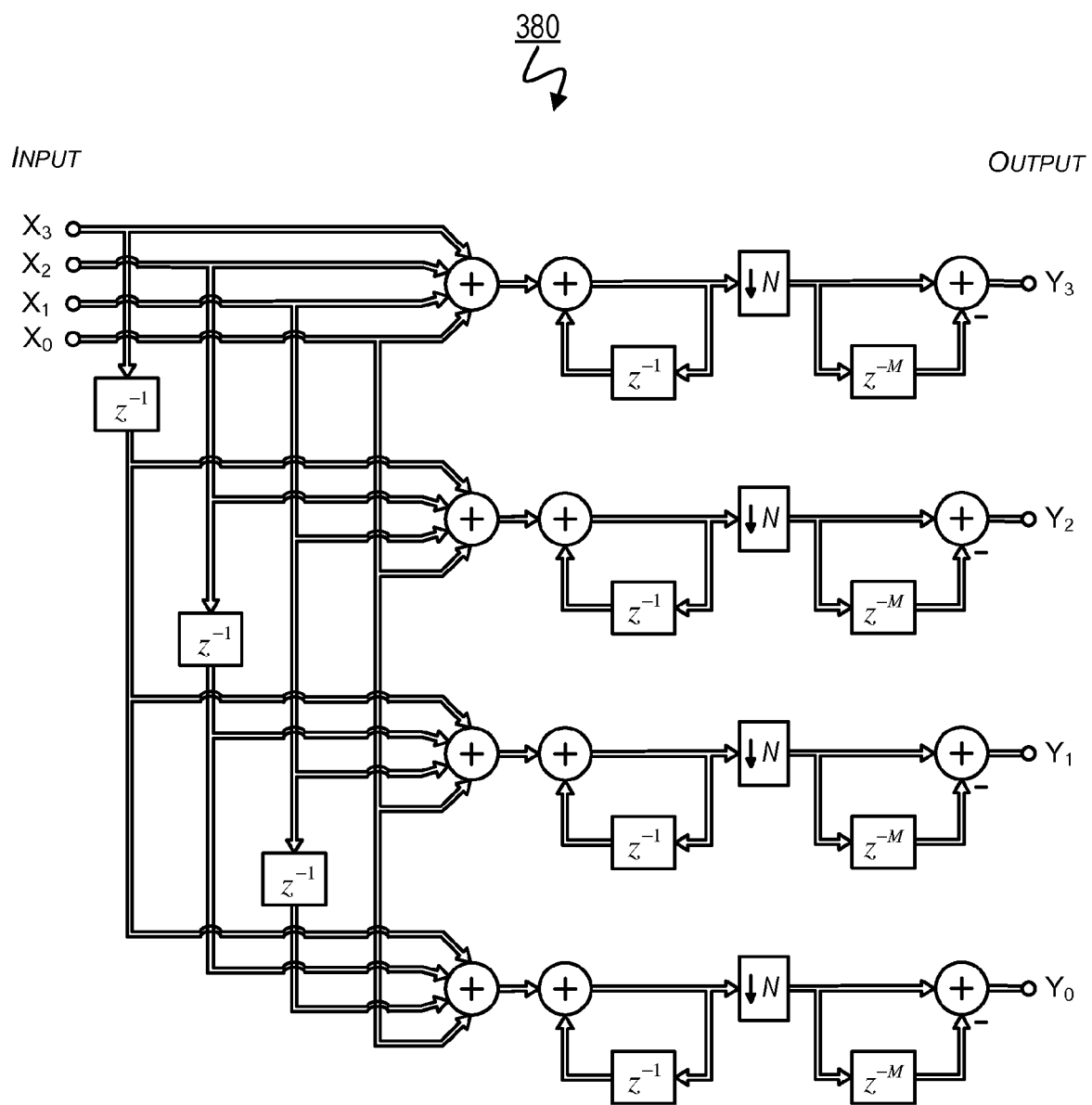
FIG. 14F is a simplified block diagram of a multirate, recursive moving-average filter having a polyphase decomposition factor of m=4.

The above technique can be extended to reduce clock rates further by using additional hardware to increase the number of polyphase processing paths. For example, FIG. 14F shows a block diagram for a moving-average filter 380 implemented using four polyphase processing paths (i.e., polyphase decomposition factor of m=4). As illustrated in FIG. 14C-E, the basic recursive form of the moving-average filter requires two adders and M registers. Also, as shown in FIG. 14F for a polyphase decomposition factor of m=4, a multirate implementation of the filter requires 24 adders and 4·M+7 registers for integer ratios of M/n. In general, for a polyphase decomposition factor of m and for M processing branches, the multirate moving-average filter requires m·(m+1) adders and m·(M+2)−1 registers for integer ratios of M/n. Thus, ignoring registers, the complexity of the multirate, moving-average filter increases as O($m^2$) relative to the basic form of the filter.

Compared to conventional $sinc^{P+1}$ filters, the results in Table 2 indicate that cascaded moving-average prototype filters provide comparable quantization noise attenuation with superior signal-to-distortion ratio performance. An additional benefit to the cascaded moving-average filter can be lower processing latency. Processing latency is determined by the filter length (L) such that latency ≈L/(2·$f_S$), where $f_S$ is the effective filter clock rate. Specifically, compared to conventional $sinc^{P+1}$ filters for fourth-order noise shaping where L=5·N·M−4, the exemplary cascaded moving-average filter response given in the fifth row of Table 2 has a significant latency advantage for large M since L=4·N·M−2. This advantage can be significant in applications involving control systems and servo mechanisms.

Converter Sample Rate Considerations

Figure 16A:
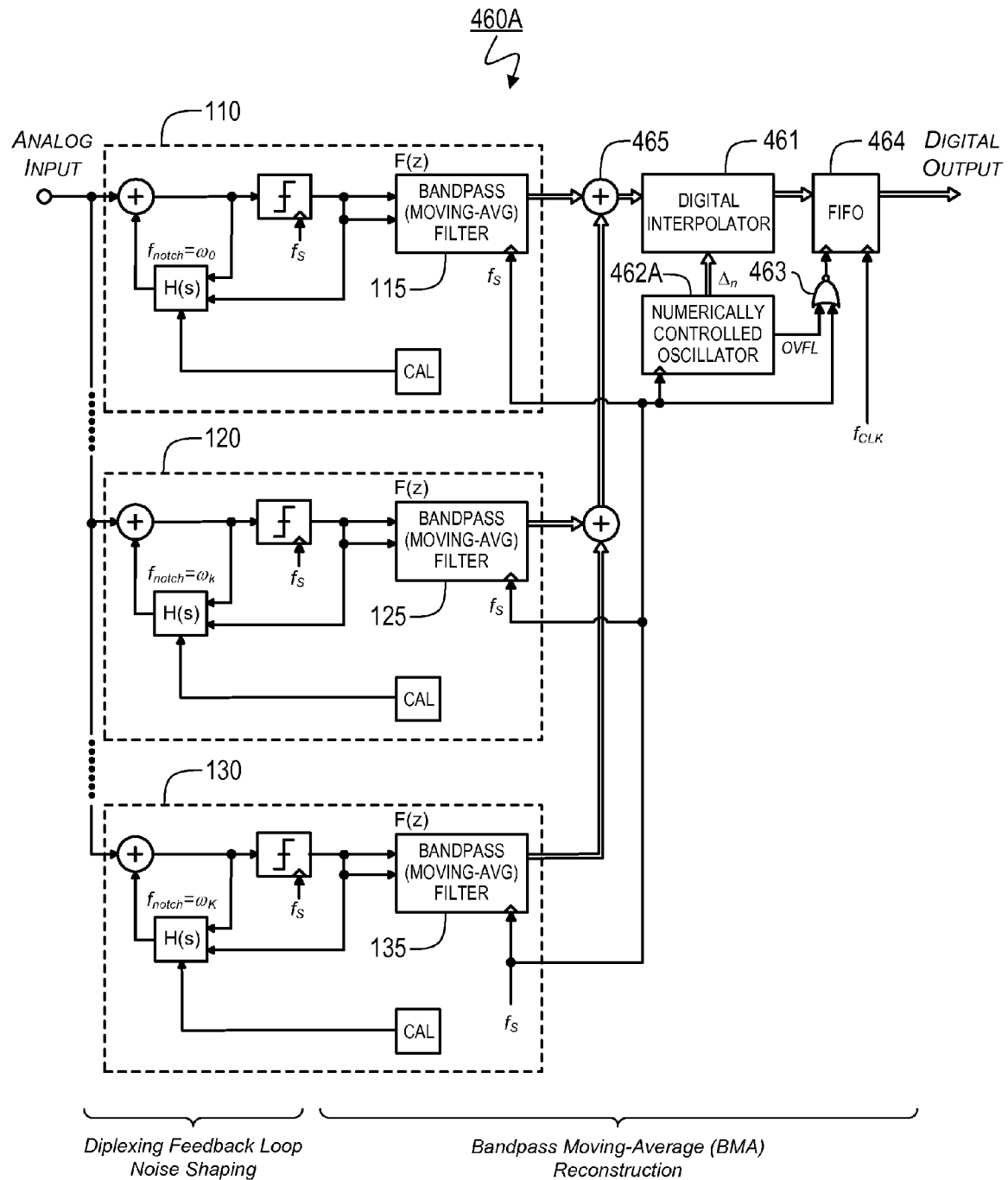
FIGS. 16A&B are block diagrams of complete MBO converters according to representative embodiments of the present invention, which incorporate: 1) multiple Diplexing Feedback Loops (DFLs) for quantization noise shaping, 2) a Bandpass Moving Average (BMA) filter bank for signal reconstruction, and 3) multiple polynomial interpolators for digital resampling.

The present inventor has discovered that in some applications, such as those where it is desirable for the output converter data rate to be synchronized with transitions in the analog input data (e.g., applications requiring timing recovery of modulated transmissions, etc.), it is preferable for the sample rate $f_S$ of the sampler/quantizer associated with a particular MBO processing branch to be different from the conversion rate $f_{CLK}$ of the MBO output data. In the preferred embodiments of the invention, and as illustrated in FIGS. 16A&B, offsets between the sample rate $f_S$ and the MBO conversion rate $f_{CLK}$ are realized using circuit configurations 460A&B, which incorporate digital interpolators 461 and numerically-controlled oscillators 462A&B (NCOs). In conjunction, the digital interpolator and numerically-controlled oscillator form a resampling interpolator that converts sampled data from a rate of $f_S$ to a potentially different rate of $f_{CLK}$ (i.e., data originally sampled at rate $f_S$ is resampled at rate $f_{CLK}$). Generally speaking, the outputs of processing branches that share a common resampling interpolator (i.e., digital interpolator 461 and NCO 462A) are first combined (i.e., via adder 465) and then provided to the common resampling interpolator. The outputs from any number of processing branches may be processed by a single resampling interpolator, and in the case where each resampling interpolator processes fewer than all of the M total processing branches, the sample rates can be the same or can be different in different branches that use different resampling interpolators.

In addition to providing a frequency-decomposition function, the Bandpass Moving-Average filters (e.g., filter 115, 125 or 135) in the preferred embodiments perform a band-limiting function that is integral to the resampling operation. For sufficient bandlimiting, the relationship between a sampled output value at one sample-time instant and a sampled value at an offset sample-time instant (i.e., offset between sample-time interval $1/f_S$ and conversion-time interval $1/f_{CLK}$) is well approximated, over a sample-time interval, by a linear or parabolic function. Specifically, the accuracy of the parabolic approximation depends on: 1) the bandwidth of the Bandpass Moving-Average filters $B_N$; 2) the number of processing branches $K_j$ associated with the $j^{th}$ resampling interpolator (i.e., the $j^{th}$ resampling interpolator is coupled to the combined output of processing branches); and 3) the clock frequency $f_{CLK}$ at the output of the $j^{th}$ resampling interpolator. More specifically, for a combined digital filter output (i.e., produced by summing $K_j$ branches in adder 465) with a noise bandwidth of approximately $B_N \cdot K_j$, the accuracy of the parabolic approximation improves logarithmically according to the ratio $B_N \cdot K_j / f_{CLK}$, such that for every factor of two decrease in the ratio $B_N \cdot K_j / f_{CLK}$, the accuracy ($\epsilon$) of the approximation improves by a factor of about 4, or $$\varepsilon \approx -\frac{k}{4 \cdot \log_2\left(\frac{B_N \cdot K_j}{f_{CLK}}\right)}.$$

In the preferred embodiments, digital resampling is based on a parabolic interpolation with a ratio $$B_N \cdot K_j / f_{CLK} \le \frac{1}{6}$$

to ensure a resampling accuracy of at least 0.5% (i.e., 7.5 effective bits). In alternate embodiments, however, digital resampling can be based on linear or nonlinear (e.g., sinusoidal or cubic spline) interpolation between sampled output values, and a different $B_N \cdot K_j / f_{CLK}$ ratio.

In the preferred embodiments, digital interpolation is based on fitting sampled data values to a second-order, polynomial (i.e., parabolic) curve, that in a least-squares sense, minimizes the error between the sampled data values and the fitted polynomial. Such second-order interpolation can be realized using digital interpolator circuit 461 that performs the function $$y_n = x_n \cdot \left(\frac{1}{2}\Delta_n^2 + \frac{1}{2}\Delta_n\right) + x_{n-1} \cdot (1 - \Delta_n^2) + x_{n-2} \cdot \left(\frac{1}{2}\Delta_n^2 - \frac{1}{2}\Delta_n\right),$$

where $\Delta_n$ is the curve-fit interpolant (i.e., an independent, control variable that specifies the offset between a given sample-time instant and an offset sample-time instant). With respect to the above equation, negative interpolant values advance the sample time (i.e., shift sampling to an earlier point in time) and positive interpolant values retard the sample time (i.e., shift sampling to a later point in time). In alternate embodiments, however, the relationship between interpolant polarity and sample-time shift could be the opposite. It should be noted that since $$y_n = \begin{cases} x_n, & \Delta = +1 \\ x_{n-1}, & \Delta = 0 \\ x_{n-2}, & \Delta = -1 \end{cases},$$

the fitted curve error is zero (i.e., $y_i = x_i$) for an interpolant that specifies a sample-time offset that coincides with an actual sample-time instant (e.g., $\Delta=0$ and $\Delta=+1$). In alternative embodiments of the invention, particularly those where high converter resolution performance is not critical (i.e., <<10-bit resolution), interpolation can be first-order using circuit 465 in FIG. 16C. The first-order interpolator performs the function defined by $$y_n = x_n \cdot (1 + \Delta_n) - x_{n-1} \cdot \Delta_n.$$

For either first-order or second-order interpolation, the curve-fit interpolant $\Delta_n$ is time-varying, and preferably is generated using a numerically-controlled oscillator 462 (NCO) that accounts for differences in sample rate $f_S$ and conversion rate $f_{CLK}$ (i.e., via manual frequency control signal 480). Similar to the BMA filters, interpolator 461 and NCO 462 can be implemented using polyphase decomposition techniques to reduce the clock/processing rates of digital multipliers and adders.

Figure 16B:
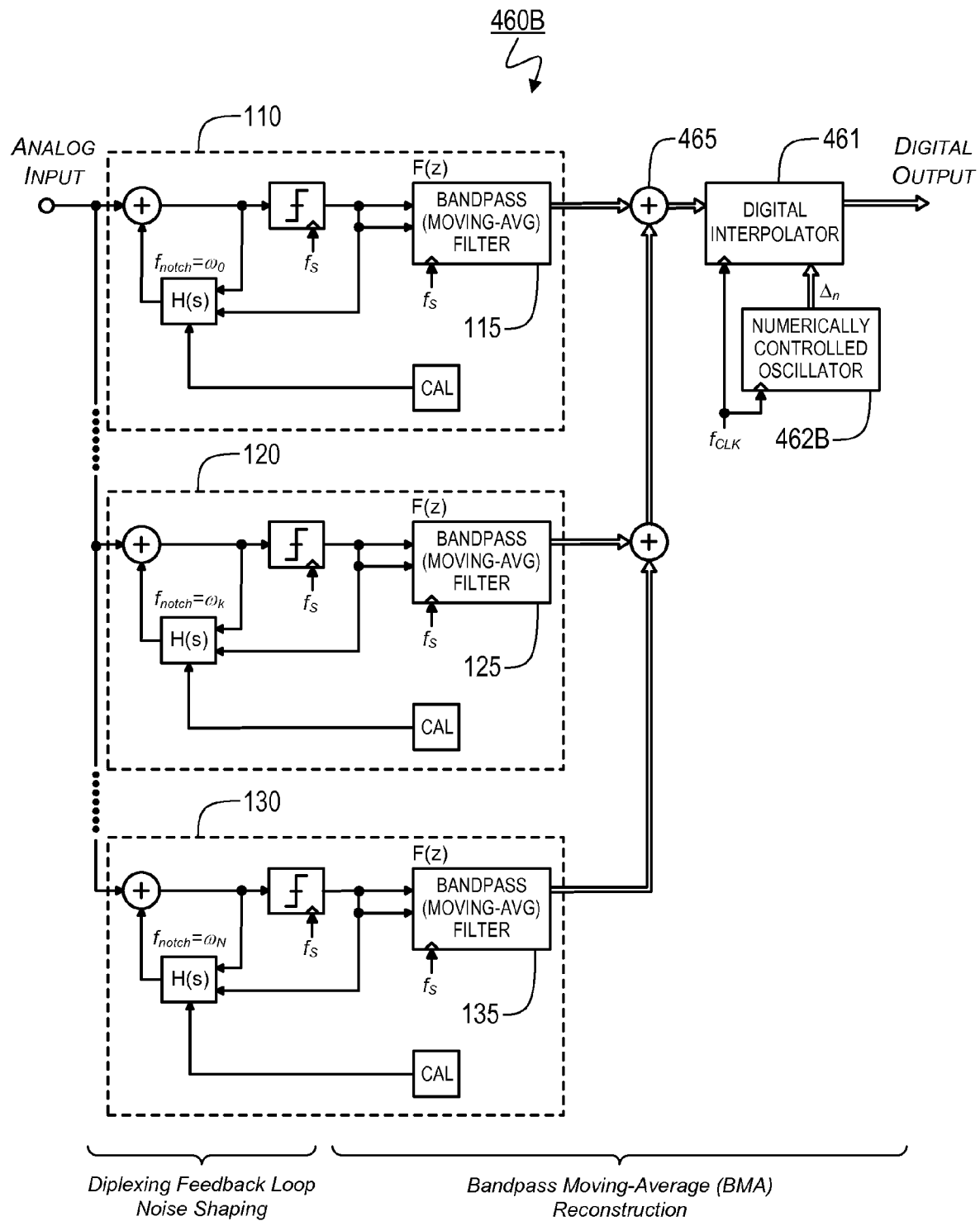
FIG. 16C is a block diagram illustrating an exemplary implementation of a digital resampling circuit that compensates for the difference between a higher sample rate and a lower conversion rate, where the ratio of the sample rate to conversion rate is a rational number.
FIG. 16D is a block diagram illustrating an exemplary implementation of a digital resampling circuit that compensates for the difference between a sample rate and a conversion rate, where the ratio of the sample rate to conversion rate is an irrational number.
Figure 16C:
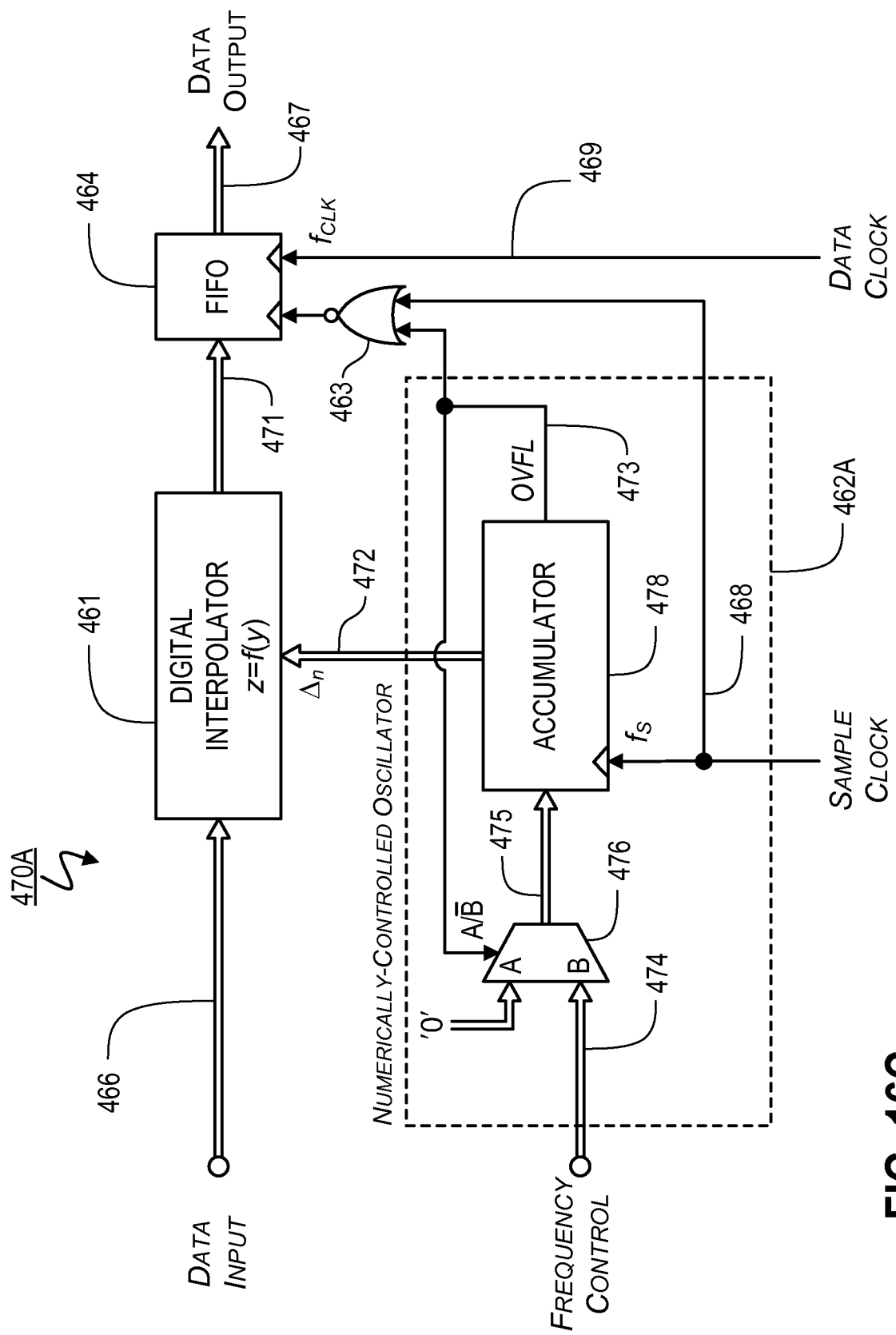

An exemplary resampling interpolator, according to the preferred embodiments of the present invention is illustrated in FIG. 16A, and is shown in more detail as circuit 470A of FIG. 16C. Circuit 470A is comprised of: 1) digital interpolator 461; 2) numerically-controlled oscillator (NCO) 462A; and 3) first-in, first-out (FIFO) memory 464. Digital interpolator 461 operates at the sample rate $f_S$ of the converter (i.e., the Bandpass Moving-Average filter output rate), which preferably is greater than or equal to the conversion rate $f_{CLK}$ (i.e., $f_S \ge f_{CLK}$). Resampling interpolator circuit 470A performs a resampling operation, wherein input data 466 that has been sampled originally at the higher sample rate $f_S$, is resampled at the lower conversion rate $f_{CLK}$ according to data clock 469. In such an application, FIFO 464 is sometimes referred to in the prior art as a rate buffer, because the higher-rate input (i.e., rate $f_S$) of FIFO 464 is buffered to a lower-rate output (i.e., rate $f_{CLK}$). The purpose of NCO 462A is to track the difference between sample-rate clock 468 and conversion-rate clock 469, to prevent FIFO 464 from underflowing or overflowing. When NCO overflow output 473 is in an inactive state (i.e., a low logic level), the operation of circuit 470A is as follows: 1) the input 475 of accumulator 478 is equal to frequency control input 474 based on the configuration of multiplexer 476; 2) the value of interpolant 472 ($\Delta_n$) is updated on the rising edge of sample-rate clock 468 ($f_S$); and 3) resampled data 471 are clocked into FIFO 464 on the falling edge of sample-rate clock 468 due to inversion in logical NOR gate 463. Conversely, when NCO overflow output 473 is in an active state (i.e., a high logic level), the operation of circuit 470A is as follows: 1) the input 475 of accumulator 478 is equal to zero based on the configuration of multiplexer 476; 2) interpolant 472 ($\Delta_n$) is not updated on the rising edge of sample-rate clock 468 ($f_S$) due to a value of zero at the input 475 of accumulator 478; and 3) resampled data 471 are not clocked into FIFO 464 on the falling edge of sample-rate clock 468 because of logical NOR gate 463. How often overflow output 473 becomes active depends on the value of NCO input 474, and preferably, the value of NCO input 474 is such that the amount of data clocked into FIFO 464 is the same as the amount of data clocked out of FIFO 464 (i.e., no memory underflow or overflow).

In general, the operation of preferred numerically-controlled oscillator 462A (NCO) is somewhat similar to that of a conventional NCO. Referring to circuit 470A, NCO output 472 (i.e., interpolant $\Delta_n$) is the modulo-accumulation of input 475, such that NCO output 472 increments (or decrements) by an amount equal to the value of input 475, until a terminal value is reached. When a terminal value is reached, NCO output 472 overflows (i.e., wraps) to a value equal to the difference between the resultant accumulated output value and the terminal value. Preferably, the terminal value of NCO 462A is unity (i.e., terminal value equals 1), and the value (df) at NCO input 474 is determined by the ratio of sample rate $f_S$ to desired conversion rate $f_{CLK}$, according to the equation:

$$df = \frac{f_S}{f_{CLK}} - 1.$$

In the preferred embodiments, the ratio $f_S/f_{CLK}$ is rational, a condition that occurs when $f_S$ and $f_{CLK}$ are multiples of a common reference frequency $f_{REF}$, such that for integers a, b, c, and d:

$$f_S = \frac{b}{a} \cdot f_{REF},$$

$$f_{CLK} = \frac{d}{c} \cdot f_{REF},$$

and $$\frac{f_S}{f_{CLK}} = \frac{b}{a} \cdot \frac{c}{d} \geq 1.$$

In general, the above condition is not difficult to achieve using conventional frequency synthesis methods (e.g., direct-digital synthesis or factional-N PLL synthesis) and ensures that there is a finite-precision value df for which FIFO 464 does not overflow (or underflow). For the specific case where $f_S/f_{CLK}=5/4$, and therefore df=¼, the first seven values at output 472 (i.e., interpolant $\Delta_n$) of NCO 462A are 0, ¼, ½, ¾, 0, 0, and ¼. In this particular example, NCO output 472 transitions from a value of ¾ to a value of 0 when the accumulated result reaches the terminal value of 1, and the duplicate value of 0 results from NCO overflow signal 473 that disables accumulation for a single cycle (i.e., via multiplexer 476).

In the preferred embodiments, the ratio of sample rate to conversion rate (i.e., the ratio $f_S/f_{CLK}$) is rational. In alternate embodiments, however, the ratio $f_S/f_{CLK}$ is irrational and resampling interpolator circuit 470B, illustrated in FIGS. 16B&D, preferably is used. The operation of circuit 470B is similar to that of circuit 470A, except that the interpolant value ($\Delta_n$) at the output 472 of NCO 462B, updates on the rising edge of the conversion-rate clock 469, instead of on the rising edge of sample-rate clock 468. As before, the value (df) at NCO input 474 is determined by the ratio of sample rate $f_S$ to desired conversion rate $f_{CLK}$, according to the equation:

$$df = \frac{f_S}{f_{CLK}} - 1.$$

Figure 16D:
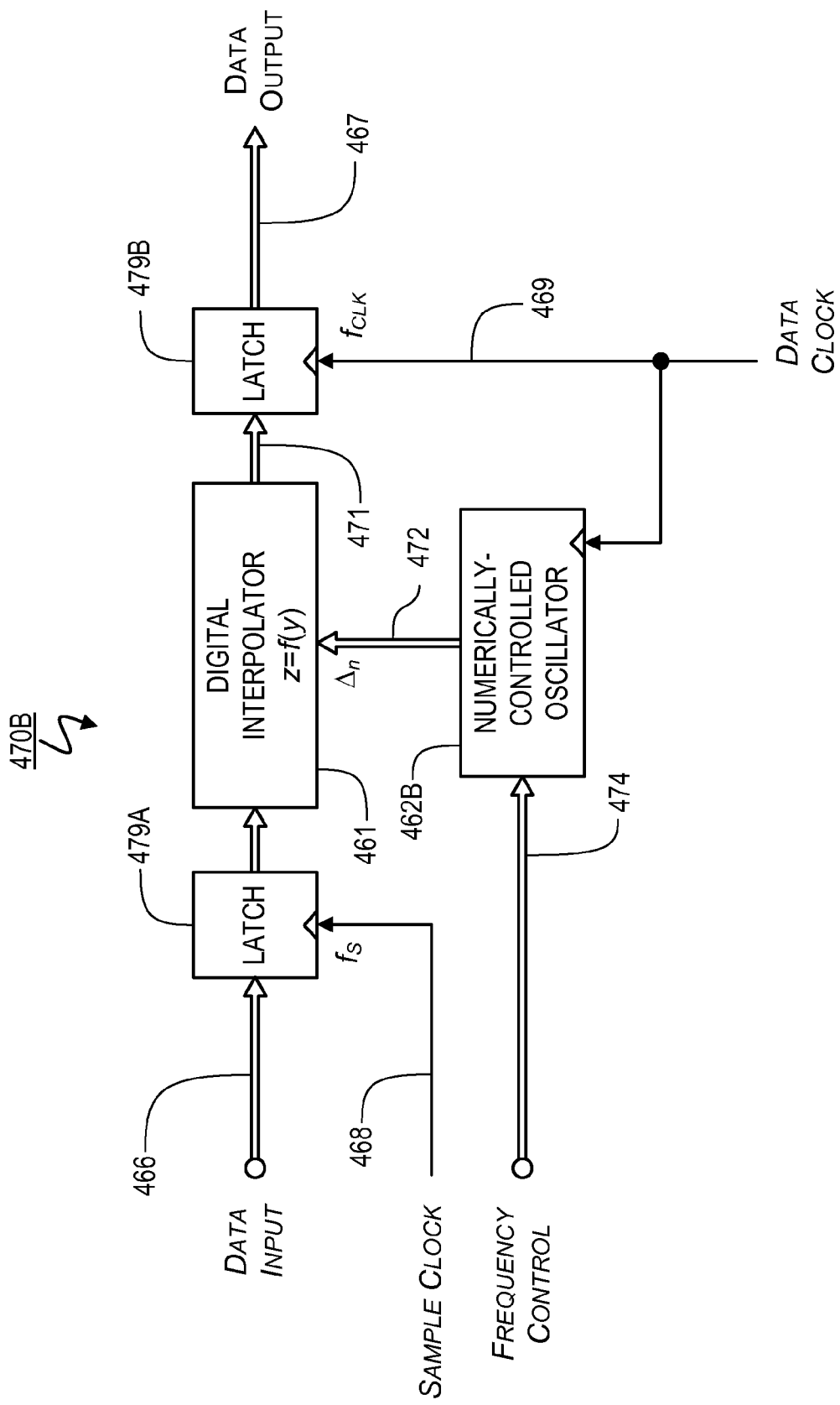

Since data samples (i.e., input signal 466) are clocked into digital interpolator 461 at rate $f_S$ (i.e., via optional latch 479A in FIG. 16D) and interpolated at a different rate $f_{CLK}$, circuit 470B operates in an asynchronous manner, creating the potential for logic metastability conditions at the output 471 of digital interpolator 461. Therefore, data samples at output 471 are reclocked in latch 479B, using conversion-rate clock 469. Latch 479B acts as a conventional metastability buffer to allow logic levels to reach a stable equilibrium state, before being coupled onto data output line 467.

Input Frequency Range Considerations

Although the MBO converter has up to 10 GHz of instantaneous bandwidth at sampling rates $f_S$ of 20 GHz (i.e., 0 Hz to 10 GHz in the preferred embodiments), inclusion of conventional downconversion techniques should be considered within the scope of the invention as a means for extending the usable frequency range of the converter. Conventional radio frequency (RF) and/or analog downconversion can be used to shift the converter input signal from a band that lies outside the instantaneous bandwidth of the converter, to a band that falls within the instantaneous bandwidth of the converter. For example, an input signal can be shifted from a band centered at 15 GHz to a band centered at 5 GHz, using a conventional downconverter with a 10 GHz local oscillator (LO), such that the original 15 GHz signal can be converted with an MBO processing branch configured for 5 GHz operation (i.e., the quantization noise response is configured for a spectral null at 5 GHz). Therefore, conventional RF and/or analog downconverter techniques can be used to shift the intended processing (center) frequency of all, or a portion, of the MBO branches to frequencies higher than half the sampling frequency (½·$f_S$) of the quantizer.

Figure 17A:
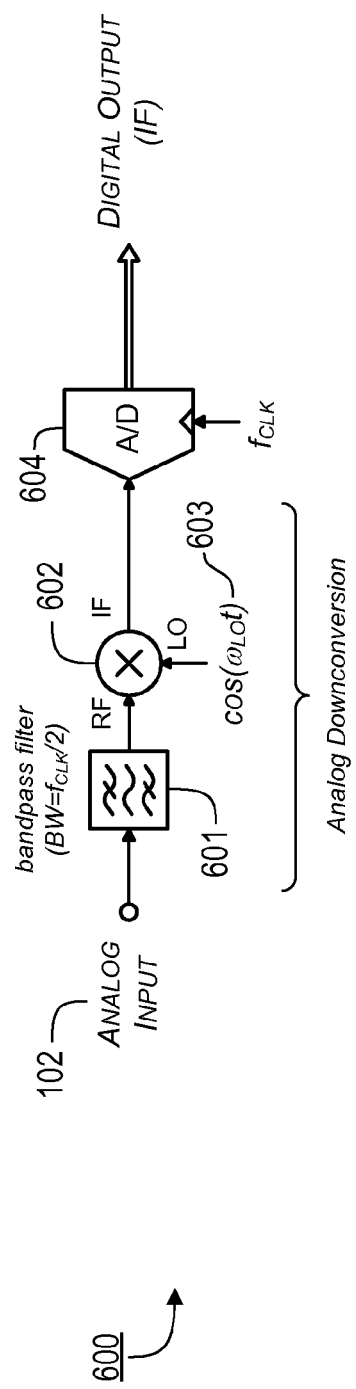
FIG. 17A is a block diagram of a conventional ADC that employs a simple downconverter to extend the frequency range of the ADC.

Conventional analog-to-digital converter (ADC) circuits that employ RF and/or analog downconversion are illustrated in FIGS. 17A&B. Circuit 600 in FIG. 17A incorporates simple downconversion using mixer 602 and local oscillator 603. The mixer produces upper and lower images of input signal 102, with the upper image centered at $\omega_k+\omega_{LO}$ (i.e., sum frequency) and the lower image centered at $\omega_k-\omega_{LO}$ (i.e., difference frequency), where $\omega_k$ is the band center of analog input signal 102. Simple downconversion does not provide a means for differentiating negative frequencies from positive frequencies, however. With simple downconversion, negative frequencies flip across DC (i.e., frequency-folding) and destructively combine with positive frequencies when a portion of the input signal band is shifted to negative frequencies. The inability to differentiate negative frequencies from positive frequencies generally requires that, with simple downconversion, the center frequency of the lower image (i.e., centered at $\omega_k-\omega_{LO}$) be a non-zero, intermediate frequency (IF). In circuit 600, input bandpass filter 601 serves a similar purpose by preventing signal corruption from occurring when unwanted signals fold across DC (i.e., zero frequency) into the IF signal bandwidth.

Figure 17B:
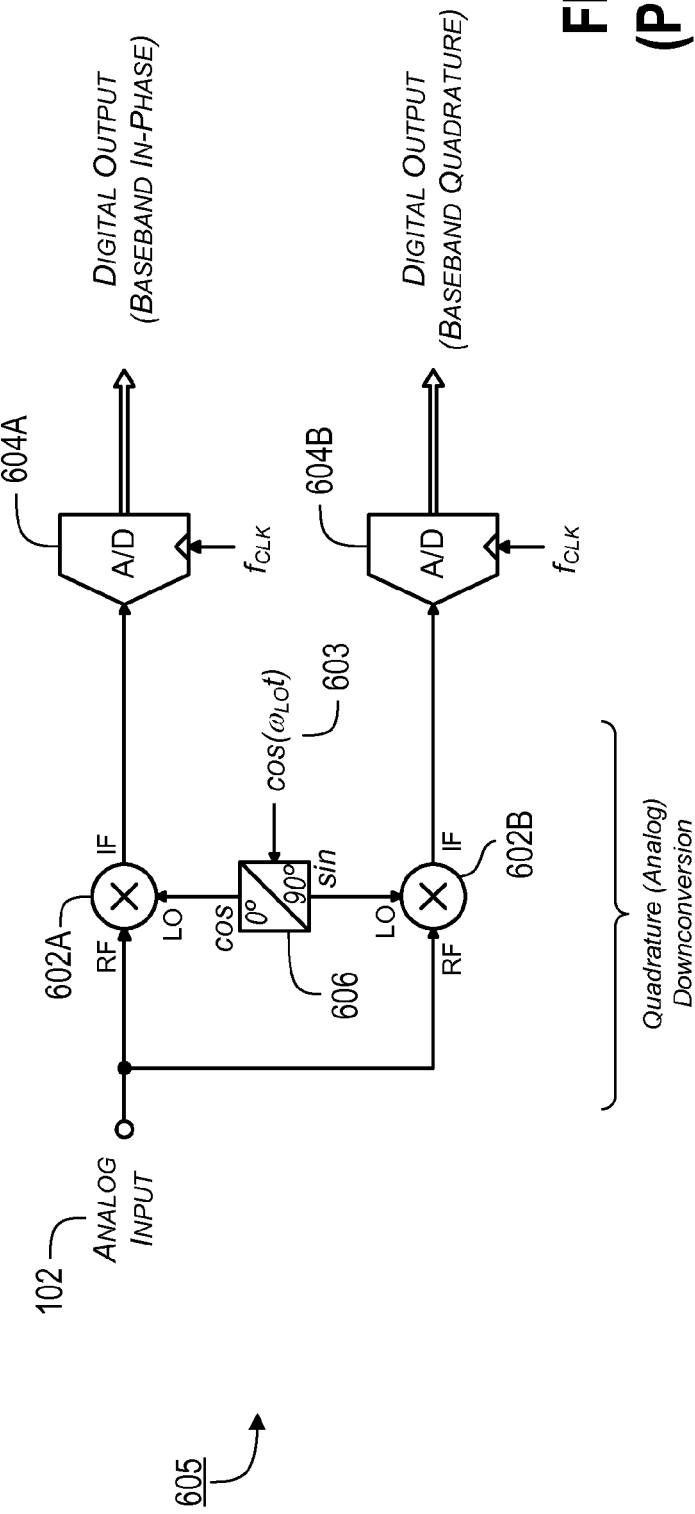
FIG. 17B is a block diagram of a conventional ADC that uses quadrature downconversion and multiple converters to extend the frequency range of the ADC(s).

Alternatively, circuit 605 in FIG. 17B incorporates quadrature downconversion (i.e., IQ demodulation) using mixers 602A&B, local oscillator (LO) 603, and quadrature hybrid 606. Quadrature hybrid 606 generates in-phase (i.e., cosine) and quadrature (i.e., sine) versions of the LO, resulting in signal images at the mixer output that are in-phase and in quadrature with respect to each other. With in-phase and quadrature components it is possible to differentiate negative frequencies from positive frequencies, such that the center of the input signal band can be shifted to zero frequency without corruption from frequency-folding effects. Despite requiring two ADCs (i.e., ADCs 604A&B) instead of one ADC, quadrature downconversion generally is employed because band shifting to zero frequency is more efficient with respect to ADC bandwidth (i.e., quadrature downconversion requires ½ the bandwidth of simple downconversion) and eliminates signal corruption due to frequency-folding effects.

The present inventor has discovered that in addition to extending usable frequency range, RF and/or analog downconversion has the more significant advantage of mitigating the degradation in converter resolution caused by low-frequency sampling jitter. The converter output noise ($\eta_j$) that is introduced by low-frequency sampling jitter ($\sigma_j$) increases with frequency ($\omega_k$) according to $\eta_j = \omega_k \cdot \sigma_j$, where $\omega_k$ is the intended processing (center) frequency of the $k^{th}$ MBO branch. By decreasing the center frequencies ($\omega_k$) of the MBO processing branches, therefore, downconversion reduces the output noise caused by sampling jitter and improves overall converter resolution. Exemplary MBO converters that employ quadrature downconversion are illustrated in FIGS. 18A-C.

Figure 18A:
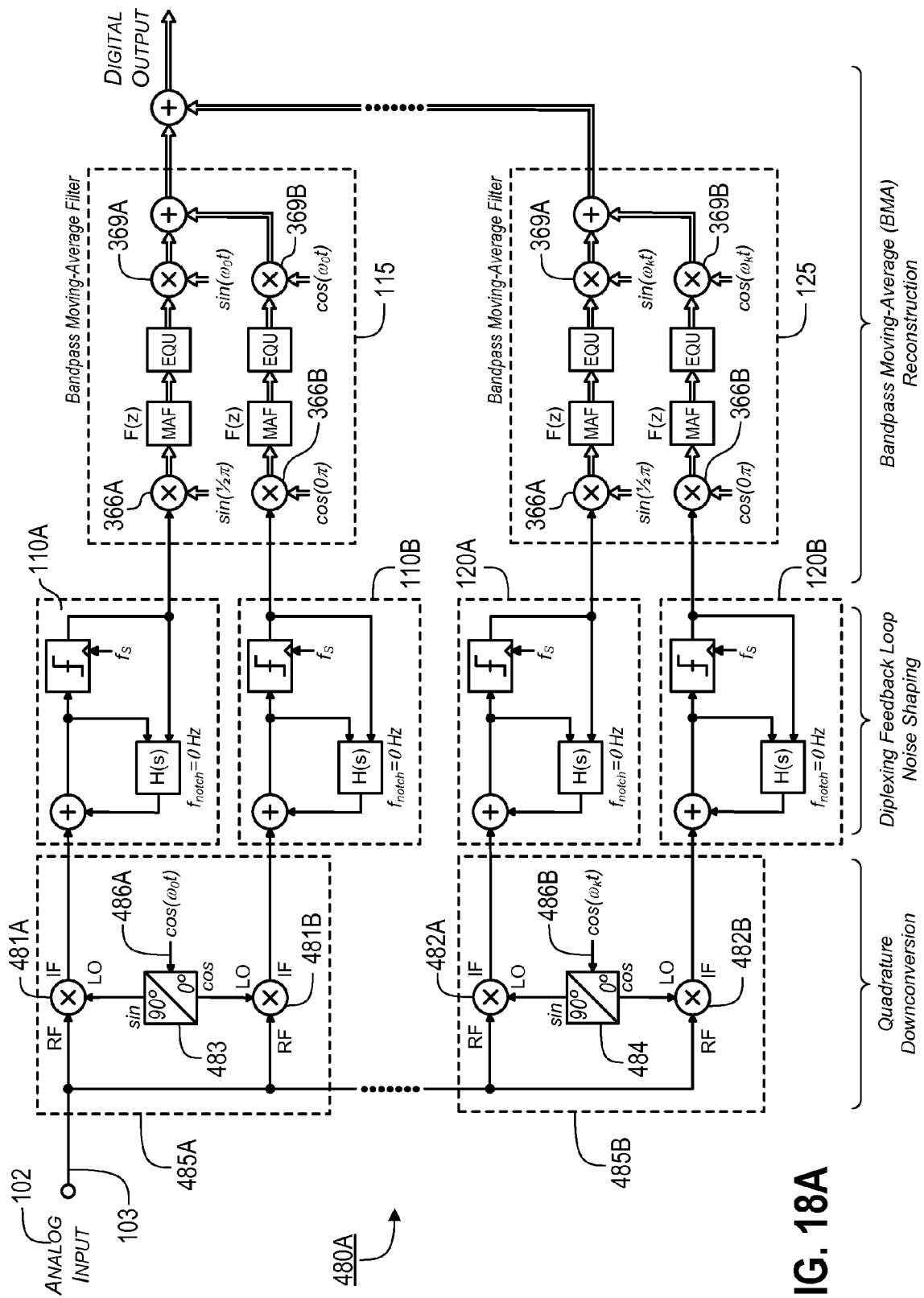
FIG. 18A is a block diagram of a complete MBO converter according to a representative embodiment of the present invention, which incorporates multiple Diplexing Feedback Loops (DFLs) with dedicated quadrature downconversion to zero hertz at each DFL input.

The exemplary MBO converter 480A shown in FIG. 18A uses one quadrature downconverter (e.g., circuits 485A&B) per MBO processing branch, to shift a portion of the input frequency band (i.e., the portion of the band processed in the respective MBO branch) from a center frequency of $\omega$ to a center frequency of zero. Each quadrature downconverter consists of: 1) a local oscillator source (e.g., generating each of signals 486A&B) with frequencies $\omega_0$ and $\omega_k$, respectively; 2) a quadrature hybrid (e.g., each of circuits 483 and 484) that divides the local oscillator signal into quadrature (i.e., sine) and in-phase (i.e., cosine) components; and 3) dual mixers (e.g., circuits 481A&B and 482A&B) that produce frequency-shifted, lower and upper images of the input signal. More specifically, quadrature downconverter 485A shifts a portion of input signal 102 from a band centered at frequency $\omega_0$ to a band centered at zero hertz. This band shift enables noise shaping circuits 110A&B to process the input signal, originally centered at a frequency of $\omega_0$, when configured to produce a quantization-noise transfer function (NTF) with a spectral minimum (i.e., $f_{notch}$) at zero hertz (i.e., DC). Similarly, quadrature downconverter 485B shifts a portion of input signal 102 from a band centered at frequency $\omega_k$ to a band centered at zero hertz. As before, this band shift enables noise shaping circuits 120A&B to process the input signal, originally centered at a frequency of $\omega_k$, when configured for an $f_{notch}$ of zero hertz. After noise shaping and subsequent filtering (e.g., filtering performed by Bandpass Moving-Average filters 115 and 125, or other bandlimiting filter), the input signals are restored (i.e., upconverted) to their respective center frequencies of $\omega_0$ and $\omega_k$ using multipliers 369A&B.

Figure 18B:
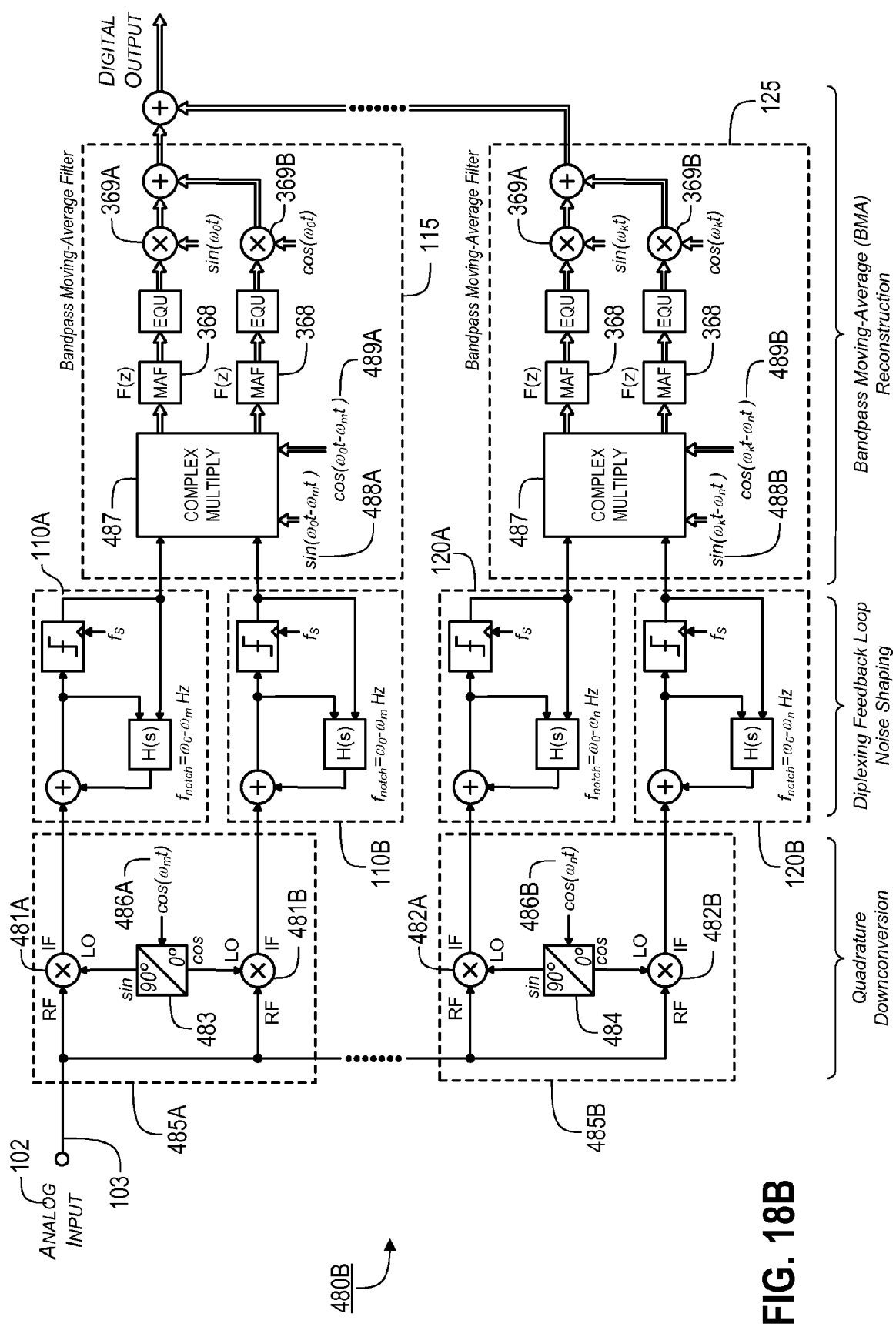
FIG. 18B is a block diagram of a complete MBO converter according to a representative embodiment of the present invention, which incorporates multiple Diplexing Feedback Loops (DFLs) and dedicated quadrature downconversion to a non-zero, intermediate frequency at each DFL input.

Alternate processing is illustrated in FIGS. 18B&C. FIG. 18B shows an alternate MBO converter 480B in which one quadrature downconverter (e.g., each of downconverters 485A&B) in each of the MBO processing branches, shifts the input frequency band to an intermediate frequency (IF), instead of directly to a frequency of zero hertz. More specifically, quadrature downconverter 485A shifts a portion of input signal 102 from a band centered at frequency $\omega_0$ to a band centered at an intermediate frequency (IF) of $\omega_0 - \omega_m$, using local oscillator signal 486A with frequency $\omega_m$. Similarly, using local oscillator signal 486B with frequency $\omega_n$, quadrature downconverter 485B shifts a portion of input signal 102 from a band centered at frequency $\omega_k$ to a band centered at an IF frequency of $\omega_k - \omega_n$. Noise shaping circuits 110A&B are configured for a corresponding quantization noise null (i.e., $f_{notch}$) of $\omega_0 - \omega_m$, while noise shaping circuits 120A&B are configured for a corresponding quantization noise null (i.e., $f_{notch}$) of $\omega_k - \omega_n$. Prior to lowpass filtering (e.g., within MAF block 368) and upconversion (e.g., with multipliers 369A&B), the output of each noise shaping filter is shifted to a band centered at zero hertz (e.g., from intermediate frequencies of $\omega_0 - \omega_m$ and $\omega_k - \omega_n$), using complex multiplier 487, sine sequences 488A&B, and cosine sequences 489A&B. Complex multiplier 487 is preferred in the embodiments having a non-zero IF because, compared to quadrature multipliers (e.g., dual multipliers 366A&B of circuit 480A), the complex multiplier produces only a lower signal image (i.e., difference frequency) that is centered at zero hertz (i.e., the upper signal images at the sum frequencies of $2 \cdot \omega_0 - 2 \cdot \omega_m$ and $2 \cdot \omega_k - 2 \cdot \omega_n$ are suppressed).

Figure 18C:
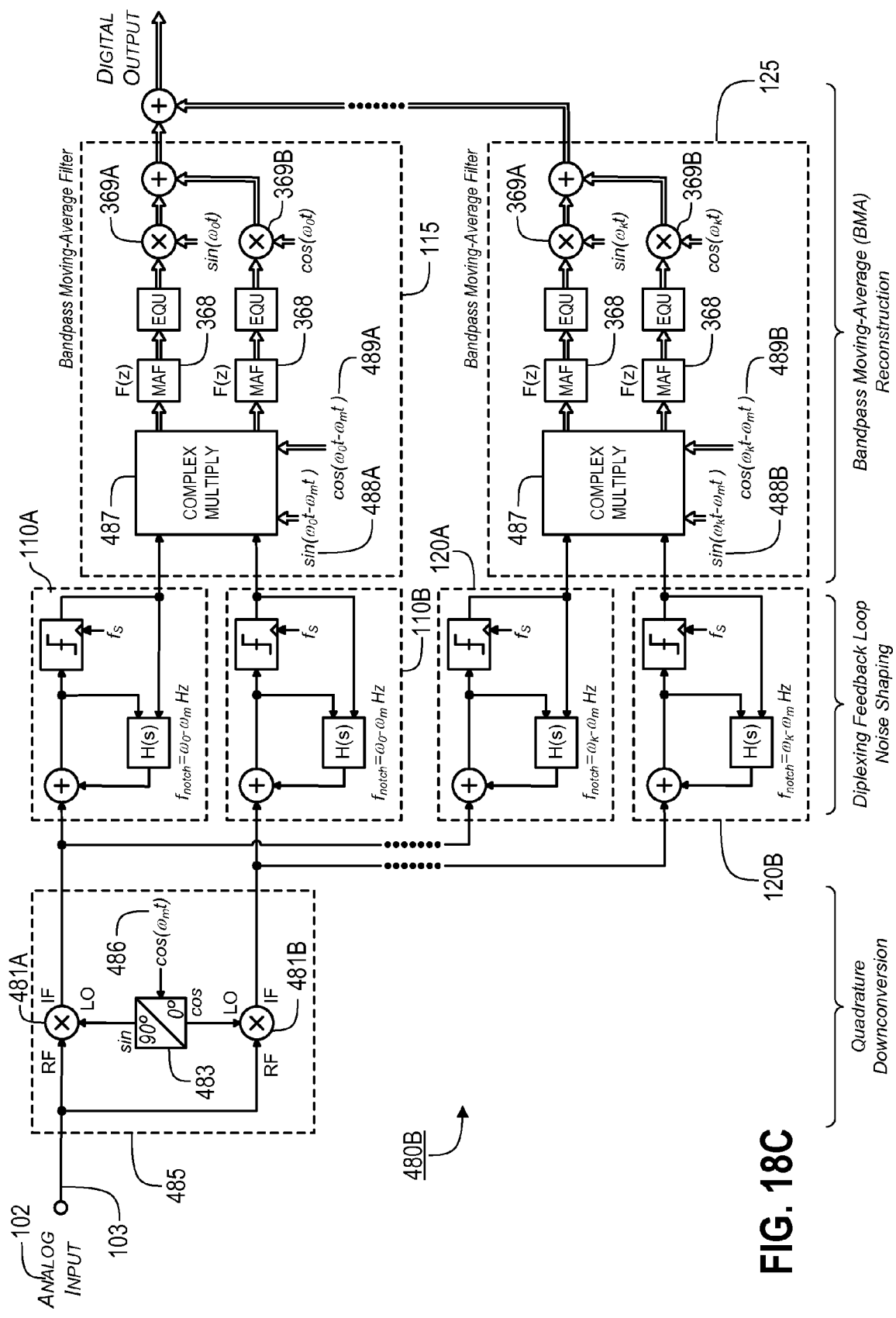
FIG. 18C is a block diagram of a complete MBO converter according to a representative embodiment of the present invention, which incorporates multiple Diplexing Feedback Loops (DFLs) and shared quadrature downconversion to a non-zero, intermediate frequency at each DFL input.

Similar processing is provided by the alternate MBO converter 480C shown in FIG. 18C. In this embodiment, however, a single quadrature downconverter (i.e., downconverter 485) is associated with multiple processing branches. Using a single local oscillator signal 486 with frequency $\omega_m$, quadrature downconverter 485 shifts the portion of input signal 102 centered at frequency $\omega_0$ to a band centered at an intermediate frequency of $\omega_0 - \omega_m$, and shifts the portion of input signal 102 centered at $\omega_k$ to a band centered at an intermediate frequency of $\omega_k - \omega_m$. Noise shaping circuits 110A&B are configured for a quantization noise null (i.e., $f_{notch}$) of $\omega_0 - \omega_m$, while noise shaping circuits 120A&B are configured for a quantization noise null (i.e., $f_{notch}$) of $\omega_k - \omega_m$. After downconversion (i.e., complex multiplication) to zero hertz and lowpass filtering, processing within Bandpass Moving-Average filters 115 and 125 restores the input signal to bands centered at the original frequencies of $\omega_0$ and $\omega_k$. The embodiment illustrated in FIG. 18C provides lower hardware complexity (i.e., fewer RF/analog downconverters), than the embodiment illustrated in FIG. 18B, at the expense of higher output noise from sampling jitter.

Figure 18D:
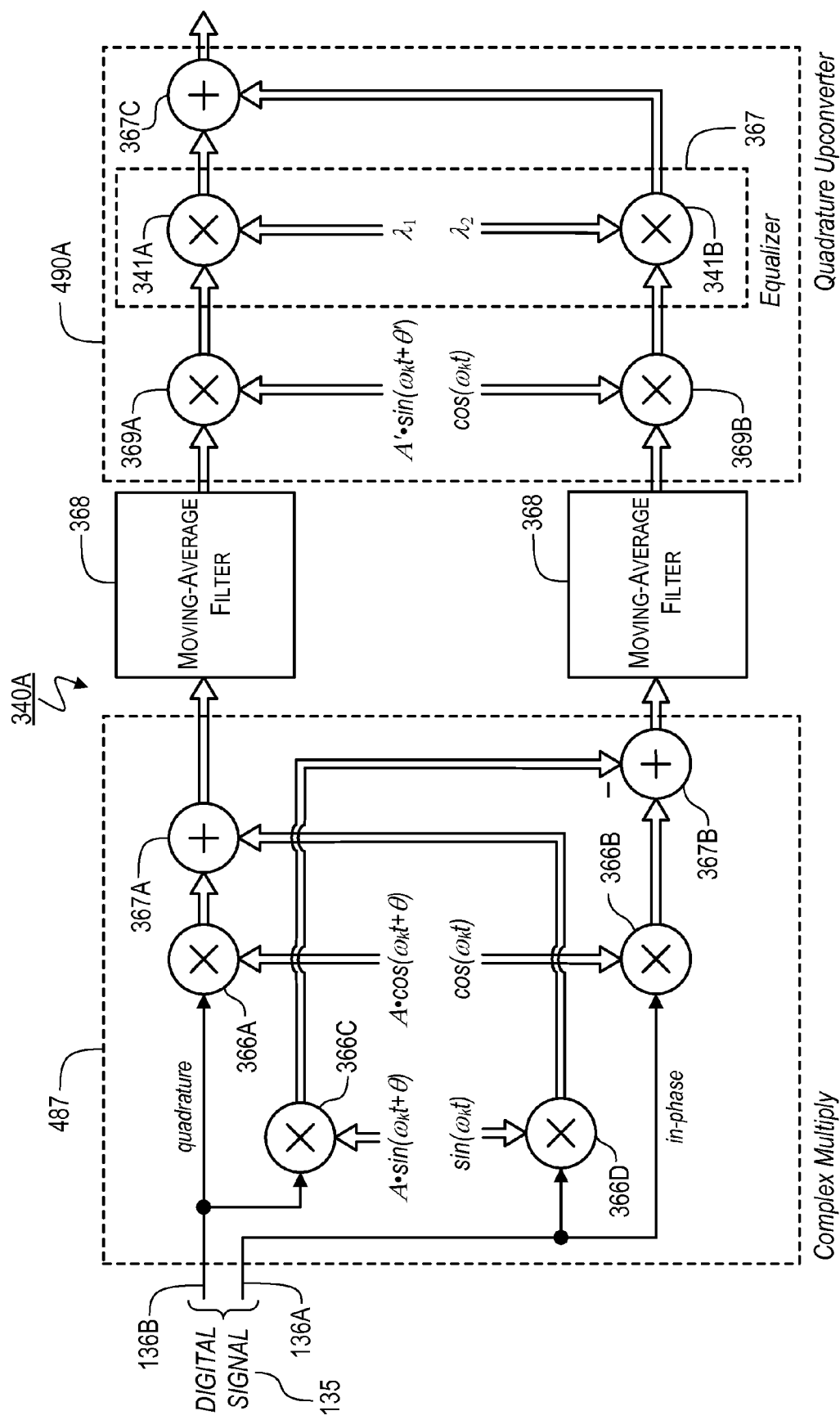
FIG. 18D is a block diagram of a Bandpass Moving Average (BMA) signal-reconstruction filter according to a representative embodiment of the invention that incorporates: 1) complex frequency downconversion with compensation for quadrature imbalance, 2) recursive moving-average filtering, 3) single, complex tap equalization, and 4) quadrature frequency upconversion with preferred compensation for quadrature imbalance.
Figure 18E:
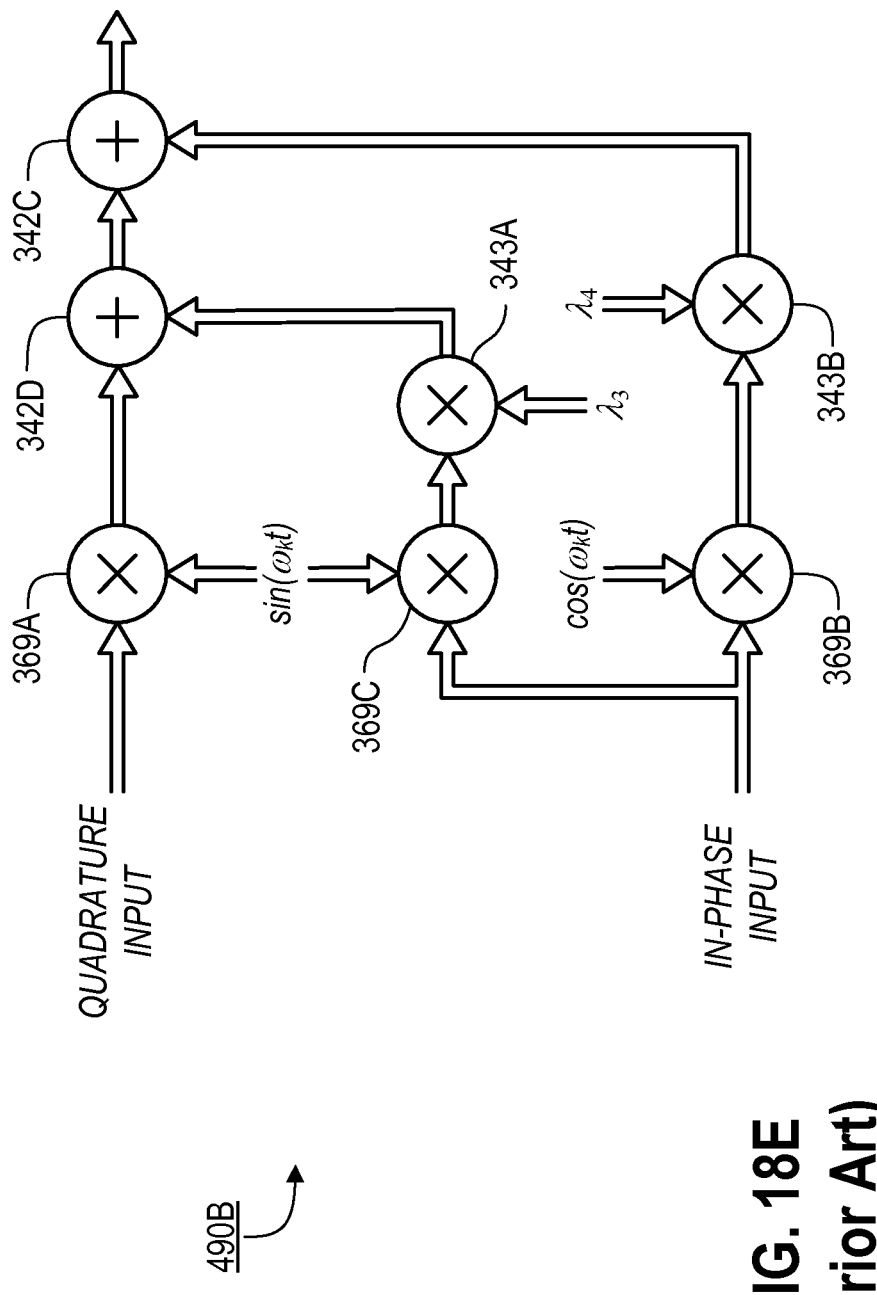
FIG. 18E is a block diagram of a quadrature frequency upconverter that incorporates conventional compensation for quadrature imbalance.

An exemplary Bandpass Moving-Average filter that incorporates a complex multiplier for IF downconversion (i.e., from a frequency of $\omega_0$ to a frequency of zero hertz) and a quadrature multiplier for upconversion (i.e., to a frequency of zero hertz to a frequency of $\omega_k$) is illustrated in FIG. 18D. Complex multiplier 487 produces an in-phase output ($y_{inphase}$) and a quadrature output ($y_{quadrature}$) by processing an in-phase input signal 136A ($x_{inphase}$) and quadrature input signal 136B ($x_{quadrature}$) according to:

$$y_{inphase} = x_{inphase} \cdot \cos(\omega t) - x_{quadrature} \cdot A \cdot \sin(\omega t + \theta)$$

$$y_{quadrature} = x_{inphase} \cdot \sin(\omega t) + x_{quadrature} \cdot A \cdot \cos(\omega t + \theta),$$

using multipliers 366A-D and adders 367A&B. The frequency ($\omega$) of the sine and cosine sequences used to shift the in-phase and quadrature inputs from an IF to zero hertz, is approximately equal, or more preferably exactly equal, to the center of the frequency band intended to be processed by its respective MBO branch (i.e., the frequency of the spectral null in the NTF). At the output of the BMA filter, quadrature upconverter 490A uses dual multipliers 369A&B and 341A&B, together with adder 367C, to combine and shift the baseband (i.e., zero hertz), quadrature signals to a band centered at $\omega_k$, as follows:

$$z = y'_{inphase} \cdot \cos(\omega_k t) \cdot \lambda_2 + y'_{quadrature} \cdot A \cdot \sin(\omega_k t + \theta') \cdot \lambda_1,$$

where $y'_{inphase}$ and $y'_{quadrature}$ are filtered versions of $y_{inphase}$ and $y_{quadrature}$ (i.e., the signals having been filtered by moving-average filters 368). Parameters A and θ preferably are set, or dynamically adjusted, to compensate for amplitude and phase imbalances (i.e., quadrature imbalances), respectively, in the RF/analog downconverter (e.g., circuit 485 in FIGS. 18A-C) in embodiments where the IF frequency is non-zero. It should be noted that when ω=0, A=1, and θ=0, the in-phase output is equal to the in-phase input (i.e., $y_{inphase}=x_{inphase}$) and the quadrature output is equal to the quadrature input (i.e., $y_{quadrature}=x_{quadrature}$), such that the complex multiplier performs no frequency shifting of the input signal (i.e., no downconversion). Therefore, the complex multiplier can be configured for use in embodiments where an RF/analog downconverter directly shifts the center of the input signal band to zero hertz. In alternative embodiments where the complex multiplier is configured for no downconversion, parameters A' and θ' preferably are set, or dynamically adjusted, to compensate for amplitude and phase imbalances, respectively, in the RF/analog downconverter (e.g., circuit 485 in FIGS. 18A-C). Quadrature upconverter circuits, such as circuit 479B illustrated in FIG. 18E, that use a conventional means for offsetting the quadrature imbalance of the analog/RF downconverter should also be considered within the scope of the invention. In circuit 490B, additional multipliers 343A&B and additional adder 342D, use coefficients $\lambda_3$ (i.e., to adjust phase) and $\lambda_4$ (i.e., to adjust amplitude) to compensate for the quadrature imbalance of the analog/RF downconverter.

Overall Converter Considerations

The instantaneous bandwidth of the MBO converter technology (e.g., as shown in FIGS. 6A-D) is limited only by the maximum sample rate ($f_S$) of the sampling/quantization circuits 114. This sample rate, in turn, can be maximized by implementing circuits 114 as high-speed comparators (i.e., 1-bit quantizers), which currently can have instantaneous bandwidths greater than 20 GHz (i.e., $f_S$=40 GHz). Comparison circuits having such bandwidths are commercially available in SiGe and InP™ integrated circuit process technology.

As noted previously, the resolution performance of the MBO converter can be increased without increasing the converter sample rate by increasing the interleaving factor (i.e., the number of processing branches, M), the order of the DFL noise-shaped response P, and/or the stopband attenuation of the Bandpass Moving-Average (BMA) signal reconstruction filters. In addition, the MBO converter technology is relatively insensitive to impairments such as thermal noise that degrade the performance of other high-speed converter architectures. This is because impairments such as hard limiter (comparator) noise are subject to the DFL noise-shaped response in a similar manner to quantization noise, exhibiting a frequency response that enables significant attenuation by the BMA filters (e.g., filters 115 and 125).

Simulated resolution performance results for the MBO converter are given in Table 3 for various interleave factors and DFL noise shaping orders.

TABLE 3

Simulated Performance Results for MBO Converter
(N = 1.25, 2-bit Quantization)

| Interleave Factor (M) | Noise Shaping Order (P) | Effective Bits of Resolution (B) |
|---|---|---|
| 128 | 2 | 7.6 |
| 64 | 2 | 6.9 |
| 32 | 2 | 6.1 |
| 16 | 2 | 5.0 |
| 128 | 4 | 10.6 |
| 64 | 4 | 9.6 |
| 32 | 4 | 8.0 |
| 16 | 4 | 6.1 |

Summarizing, as compared to the conventional methods, the Multi-Channel Bandpass Oversampling (MBO) converter generally can provide high-resolution, linear-to-discrete signal transformation (ADC conversion):

- with instantaneous bandwidth limited only by the maximum clock frequency of a one-bit comparator (e.g., greater than 20 GHz instantaneous bandwidth with commercially available SiGe or InP™ process technology);
- with conversion resolution and accuracy that are independent of instantaneous bandwidth or sample rate;
- with scalable conversion resolution that is a function of the number of processing branches (interleave factor), the order of the noise-shaped response in the DFL array, and the quality of the Bandpass Moving-Average filters (i.e., with conversion accuracy that increases with increasing interleave factor, noise-shaped response order and/or bandpass-filter quality);
- with conversion resolution that, due to noise shaping and bandlimiting, is relatively insensitive to traditional analog-to-digital conversion impairments, such as clock jitter, thermal noise, quantizer errors, and component tolerances that affect settling-time, bandwidth and gain;
- with continuous-time noise shaping based on Diplexing Feedback Loops that can be implemented using distributed-element, microwave design principles and can be actively calibrated using relatively simple control loops and error metrics;
- with digital-signal-processing operations that can be implemented using low-complexity moving-average filters and using polyphase decomposition to reduce required clock rates; and
- with a novel method that combines interleaving in frequency with bandpass oversampling to eliminate the need for complex analog signal reconstruction filters (i.e., analysis/synthesis filter banks).

Figure 19:
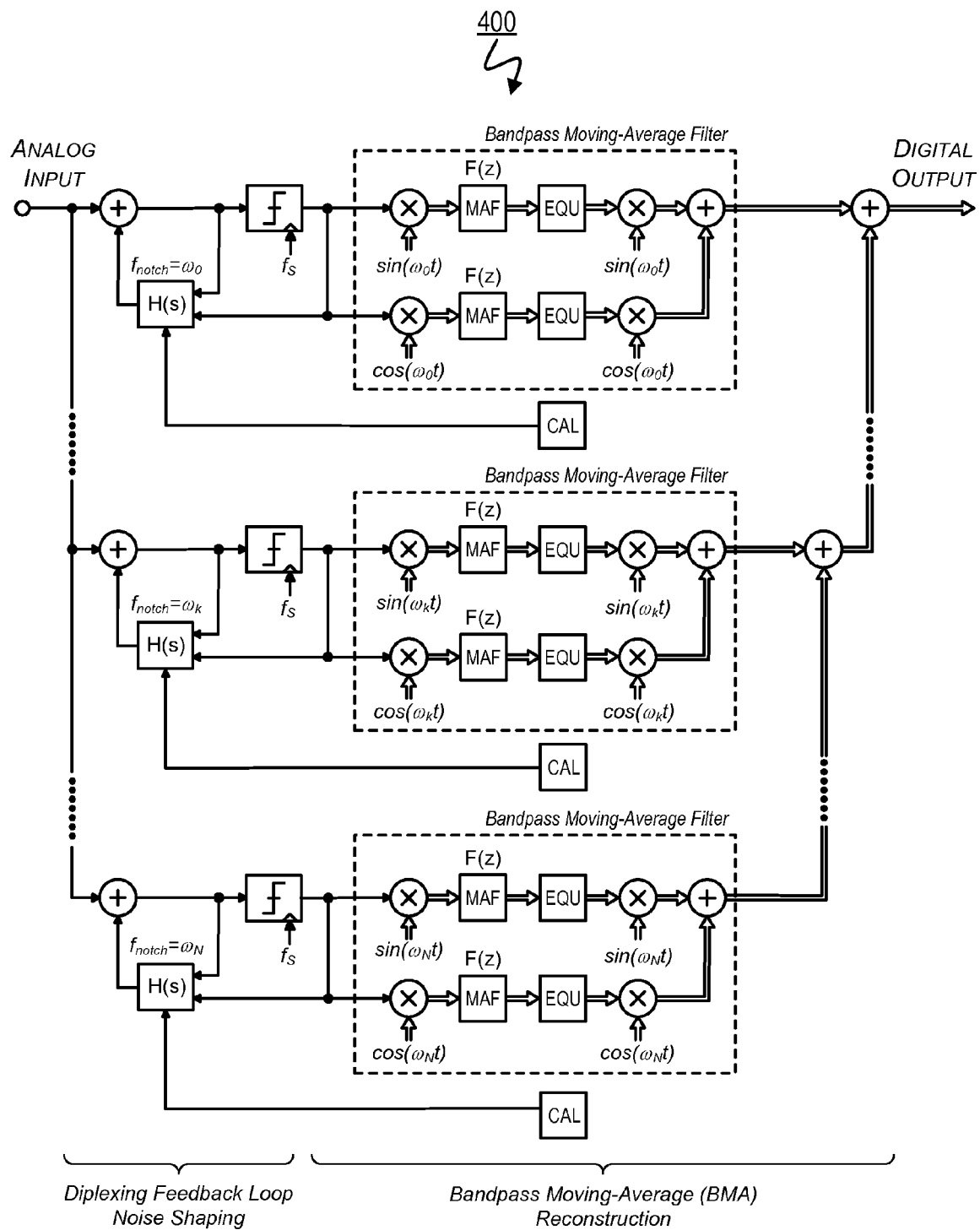
FIG. 19 is a block diagram of a complete MBO converter according to a representative embodiment of the present invention, which incorporates multiple Diplexing Feedback Loop (DFL) noise shaping circuits in conjunction with a Bandpass Moving Average (BMA) filter bank for signal reconstruction.
Figure 20:
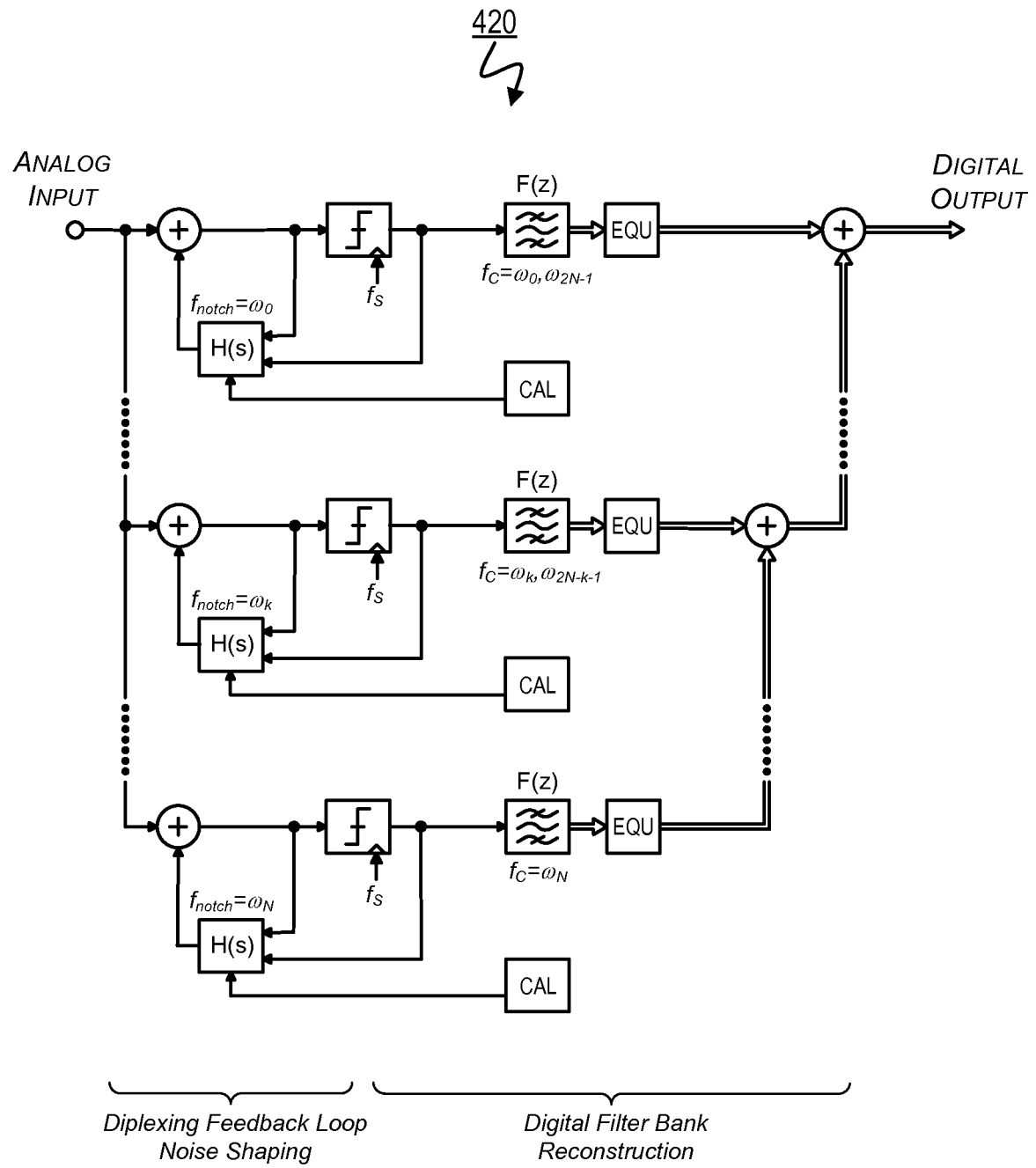
FIG. 20 is a block diagram of a complete MBO converter according to a first alternate representative embodiment of the present invention, which incorporates multiple Diplexing Feedback Loop (DFL) noise shaping circuits in conjunction with a conventional FIR filter bank for signal reconstruction.
Figure 21:
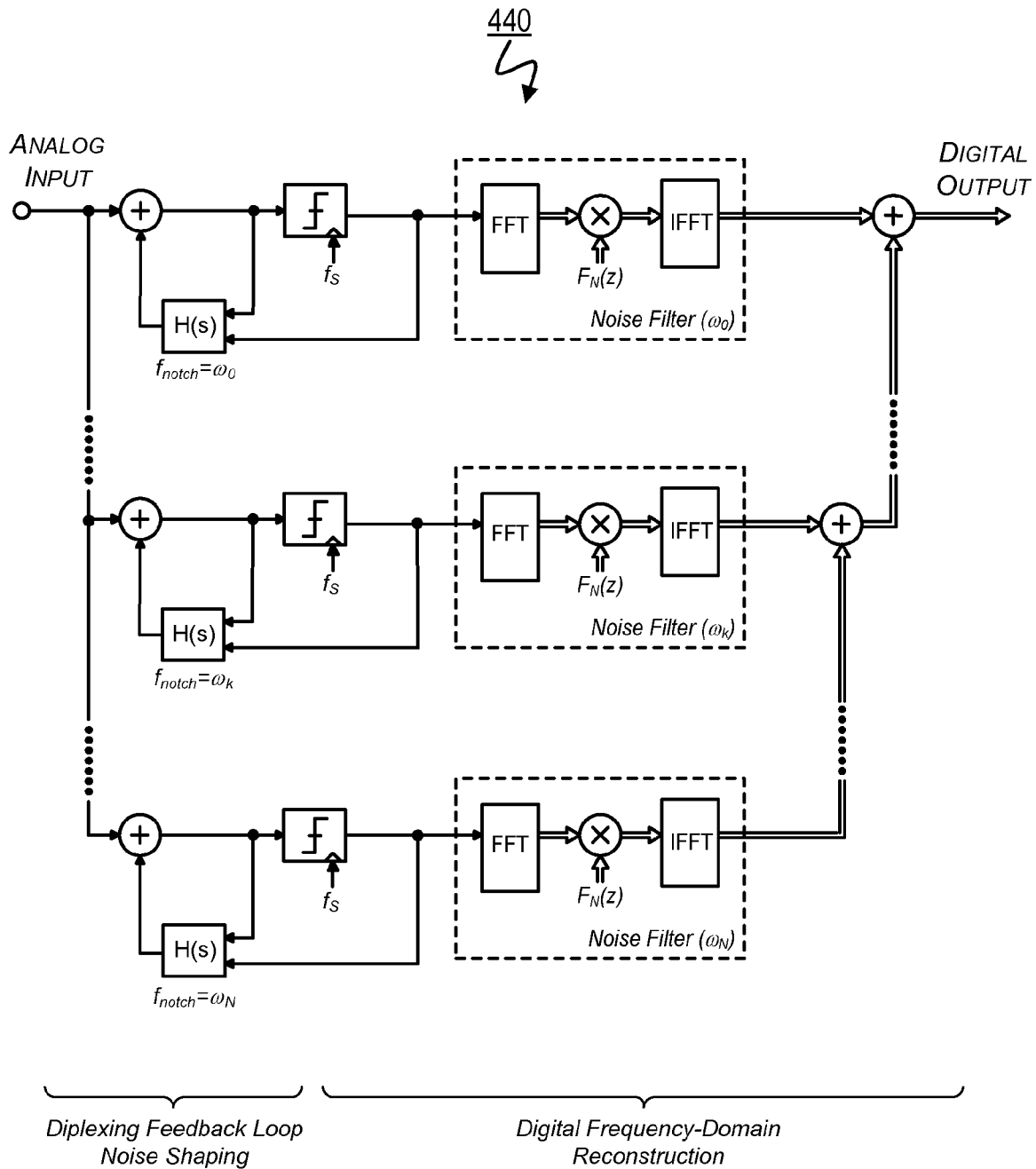
FIG. 21 is a block diagram of a complete MBO converter according to a second alternate embodiment of the present invention, which incorporates multiple Diplexing Feedback Loop (DFL) noise shaping circuits in conjunction with a frequency-domain filter bank for signal reconstruction.

FIG. 19 illustrates a complete MBO converter 400 having single-stage (i.e., second-order), DFL noise shaping of the type illustrated in FIG. 7 and signal reconstruction via the preferred method of BMA reconstruction (i.e., with filter center frequencies corresponding to the centers for the frequency bands that are being processed in the respective branches). FIG. 20 illustrates a complete MBO converter 420 having single-stage, DFL noise shaping of the type illustrated in FIG. 7 and signal reconstruction via the alternative method of a conventional filter bank. FIG. 21 illustrates a complete MBO converter 440 having single-stage, DFL noise shaping of the type illustrated in FIG. 7 and bandpass filters implemented through the use of linear convolution by discrete Fourier transform.

Figure 22:
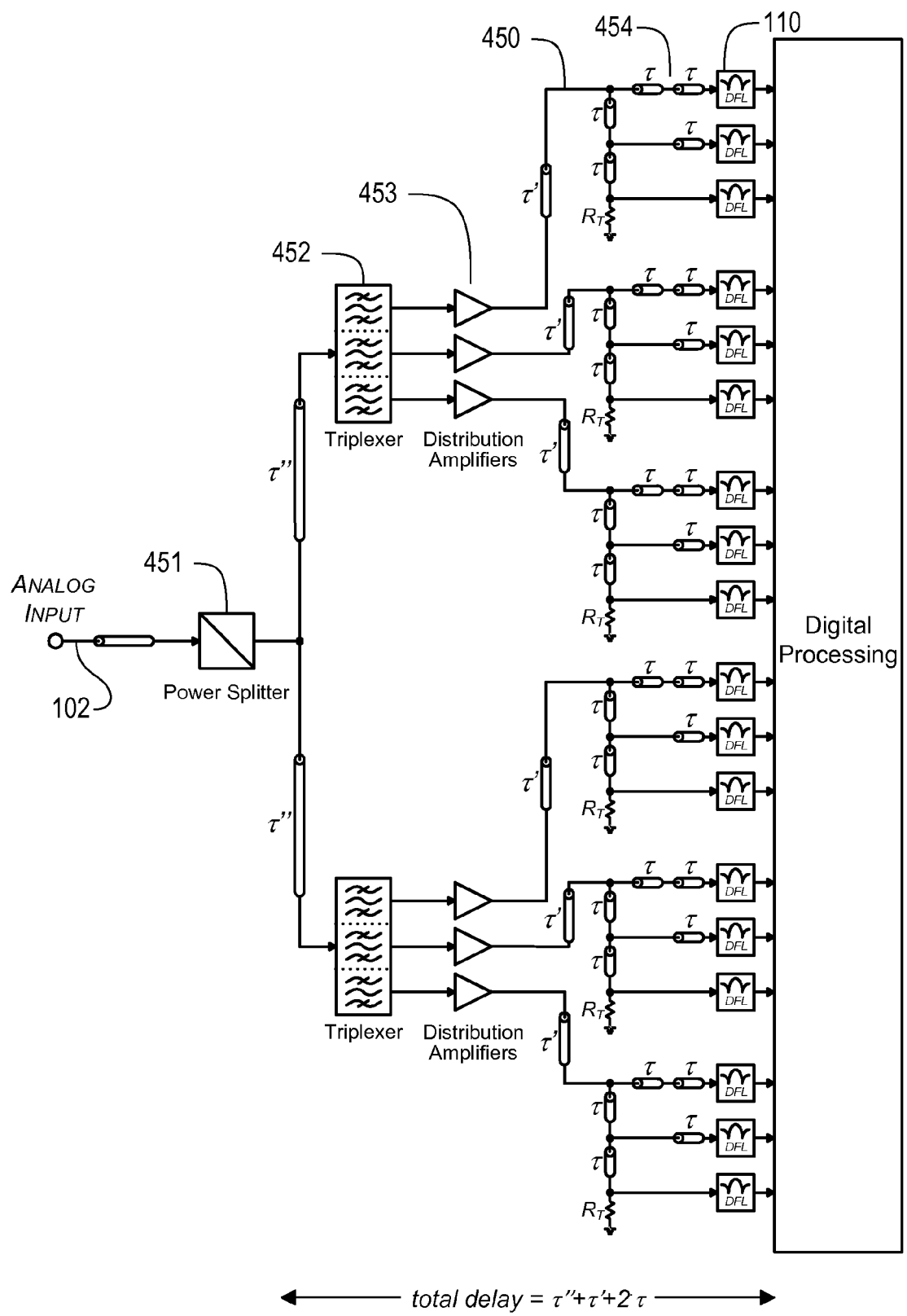
FIG. 22 is a block diagram of a complete MBO converter illustrating an exemplary method for signal distribution across multiple converter processing branches.

Because the input to each DFL noise shaping circuit can be designed for high impedance (>200 ohms), it is possible to "tap off" multiple noise shaping circuits 113 from a single, controlled-impedance transmission (i.e., signal distribution) line 450 as shown in FIG. 22. For a 50-ohm system with noise shaping circuits 113 having greater than 200 ohm input impedances, preferably fewer than 8 noise shapers 113 are tapped off the same transmission (i.e., signal distribution) line 450 to prevent appreciable loss of signal integrity. The tapped transmission line arrangement simplifies the distribution of the data converter's single analog input to the multiple noise shapers of the various processing branches. As shown in FIG. 22, this tapped transmission line technique can be combined with conventional signal-distribution approaches, such as those employing power splitters 451, m-ary diplexers 452 and distribution amplifiers 453, to achieve an optimal trade-off between signal integrity, additive noise, and circuit complexity. Specifically, FIG. 22 shows an exemplary embodiment that combines splitters 451, triplexers 452, distribution amplifiers 453, and the tapped transmission line 450 methods for signal distribution in a system comprising twelve noise shapers 113 (i.e., M=12).

Severe propagation skew (i.e., delay offsets) between the DFLs in the converter array can introduce significant group delay distortion at the converter output (i.e., propagation skew degrades preservation of input signal phase at the converter output). Therefore, to ensure that the analog input signal propagates with equal (or approximately equal) delay to the output of each noise shaper in the various processing branches, transmission delay introduced by the tapped transmission line preferably is compensated with added delay 454 at the DFL inputs, as shown in FIG. 22. In the exemplary embodiment shown in FIG. 22, the delay between the analog input and each of the twelve DFL outputs is $\tau''+\tau'+2\tau$.

Because the MBO converter is composed of multiple, independent parallel-processing branches, by isolating or combining MBO processing branches it is possible for the MBO converter to be configured for operation in multiple modes (i.e., multi-mode operation). Exemplary operating modes include, but are not limited to: 1) a converter with M distinct channels (i.e., channel being defined by the center frequency $\omega_k$ at which data conversion takes place) where each channel has a conversion bandwidth of $\frac{1}{2} \cdot f_S/M$ (i.e., $f_S$ being the MBO converter sample rate and M being the MBO converter interleave factor, with decimation by N having already occurred in the BMA filter bank); 2) a converter with two channels where the first channel has a conversion bandwidth of $\frac{1}{2} \cdot f_S \cdot (M-2)/M$ and the second channel has a conversion bandwidth of $f_S/M$ (i.e., one wide-bandwidth channel and one narrow-bandwidth channel, with decimation by N having already occurred in the BMA filter bank); 3) a converter with one channel having a processing bandwidth equal to $\frac{1}{2} \cdot f_S$; and 4) a converter with n<M channels where each channel has a conversion bandwidth $\geq \frac{1}{2} \cdot f_S/M$ (i.e., an arbitrary mix of wide-bandwidth and narrow-bandwidth channels, with decimation by N having already occurred in the BMA filter bank). In general, the number MBO operating modes is restricted only by the constraints that: 1) the total number of output channels does not exceed the number of MBO processing branches M; and 2) the sum total of all channel processing bandwidths does not exceed the MBO converter Nyquist bandwidth of $\frac{1}{2} \cdot f_S$.

Figure 23:
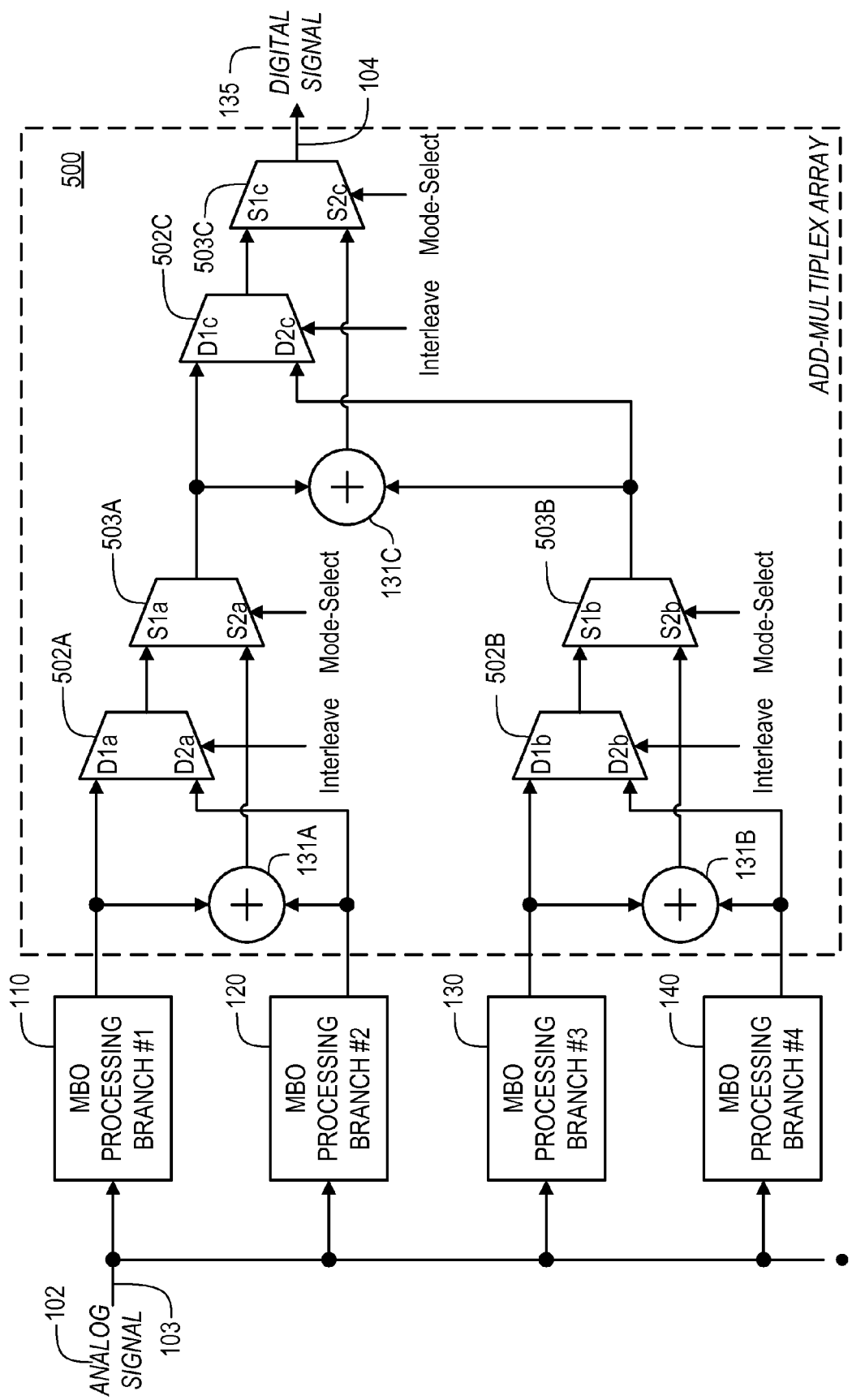
FIG. 23 is a block diagram of a Multi-Mode MBO converter that employs an output Add-Multiplex Array (AMA) network to enable: (a) isolation of individual MBO processing branches for operation as multiple narrowband output channels, or (b) combination of individual MBO processing branches for operation as fewer wideband output channels.

In the preferred embodiments, the multi-mode operation of the MBO converter is made programmable with the addition of an innovation referred to herein as an Add-Multiplex Array (AMA), which is illustrated by the exemplary, simplified block diagram in FIG. 23. As shown in FIG. 23, the AMA 500 is placed between the MBO processing branches 110-140 and the MBO converter output 104. The exemplary AMA 500 consists of: 1) adders 131A-C with two inputs and one output; 2) interleaving multiplexers 502A-C with two inputs and one output; and 3) mode-select multiplexers 503A-C with two-inputs and one output. However, in alternate embodiments these two-input/one-output functions can be replaced by multiple-input/multiple-output equivalents, such as, for example, by replacing two two-input/one-output functions with one four-input/two-output function. As illustrated in FIG. 23, the output of each MBO processing branch (e.g., 110-140) is coupled to one input of an adder 131A&B and one input (i.e., inputs D1a&b and D2a&b) of an interleaving multiplexer 502A&B. The output of each interleaving multiplexer 502A-C is coupled to one input (i.e., inputs S1a-c) of a mode-select multiplexer 503A-C, the other input (i.e., inputs S2a-c) of each mode-select multiplexer 503A-C being coupled to the output of an adder 131A-C. The output of each mode-select multiplexer 503A&B in turn is coupled to one input of an adder 131C and one input (i.e., inputs D1c&D2c) of an interleaving multiplexer 502C. The arrangement described above and shown in FIG. 23 for M=4 processing branches, can likewise be extended to an arbitrary number of processing branches. Once again, as used herein, the term "coupled", or any other form of the word, is intended to mean either directly connected or connected through one or more other processing blocks, e.g., for the purpose of preprocessing.

Referring to the simplified AMA block diagram in FIG. 23, each of the mode-select multiplexers 503A-C is used to choose between a first data stream S1a-c, consisting of alternating samples from two distinct data sources (e.g., processing branch 110 output and processing branch 120 output), and a second data stream S2a-c, which is the sum of the samples from the same two distinct data sources. It should be noted that the samples in the first data stream (i.e., S1a-c) are alternated between the two distinct sources in a manner that effectively reduces the data rate of each data source by a factor of two. A reduction in data rate by a factor of two is conventionally referred to as decimation-by-two, or downsample-by-two. It should further be noted that samples in the second data stream (i.e., S2a-c) are generated by a summation operation between two distinct data sources (e.g., processing branch 110 output and processing branch 120 output) that involves no data rate decimation. Therefore, the data rates at both inputs (e.g., S1a and S2a) of the mode-select multiplexer 503A-C inputs are equal. Furthermore, each of the alternating samples in the first data stream represents a signal that has half the bandwidth of the signal represented by the sum of samples in the second data stream. Thus, moving through the AMA chain, as data sources pass through interleaving (i.e., alternating samples) paths, channel bandwidth and data rate are reduced (i.e., decimated), whereas as data sources pass through summation (i.e., adder) paths, bandwidth and data rate are preserved (i.e., no decimation). At one extreme is the case where the interleave path is routed through all the mode-select multiplexers 503A-C, resulting in a multi-channel mode of operation with M distinct channels, each having a data rate of $f_S/M$ (i.e., each of the distinct channels has a bandwidth of $\frac{1}{2} \cdot f_S/M$). At the other extreme is the case where the summation path is routed through all the mode-select multiplexers 503A-C, resulting in a single-channel mode of operation with an output data rate of $f_S$ (i.e., the output bandwidth is $\frac{1}{2} \cdot f_S$).

At the output 104 of AMA 500, distinct converter channels can be recovered as necessary (i.e., this step is unnecessary in the single-channel mode of operation) using a demultiplexing operation that extracts and collects samples from the MBO converter output data stream 104 at regular intervals, as determined by the mode-select multiplexer configuration. For example, when the MBO converter is configured for multi-channel operation with M distinct channels, each of the M distinct channels can be recovered by extracting and collecting samples from the MBO output, y(n), at M-sample intervals. More specifically, for M distinct channels, the first channel, $y_1(n)$, consists of samples $$y_1(n)=\{y(1),y(M+1),y(2M+1),y(3M+1),\ldots\},$$

the second channel, $y_2(n)$, consists of samples $$y_2(n)=\{y(2),y(M+2),y(2M+2),y(3M+2),\ldots\},$$

and accordingly, the last channel, $y_M(n)$, consists of samples $$y_M(n)=\{y(M),y(2M),y(4M),y(4M),\ldots\}.$$

Demultiplexing techniques, such as that described above, are conventionally well understood. Also, since the AMA operation is most efficiently implemented when the number of MBO processing branches is a power of two, an interleave factor of $M=2^n$, for integer n, is preferable for a multi-mode converter based on the MBO method.

Finally, it should be noted that the frequency bands processed by the branches (e.g., 110 or 120) may be of equal or unequal widths. That is, rather than frequencies that are spaced uniformly across the converter output bandwidth, such frequencies instead can be non-uniformly spaced.

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a FireWire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive or a solid-state drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., a hard disk or solid-state drive), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal (e.g., desktop, laptop, tablet or slate) computers and/or even smaller computers, such as PDAs, wireless telephones or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as PCMCIA cards, various types of memory cards, USB memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations

The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the more recently filed disclosure shall take precedence.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
    an input line for accepting an input signal that is continuous in time and continuously variable;
    a continuous-time quantization-noise-shaping circuit;
    a sampling/quantization circuit coupled to an output of the continuous-time quantization-noise-shaping circuit; and
    a line coupling the output of the sampling/quantization circuit back into the continuous-time quantization-noise-shaping circuit,
    wherein the continuous-time quantization-noise-shaping circuit comprises an adder that includes a plurality of inputs and an output, with the input signal being coupled to one of the inputs of the adder, the output of the adder being coupled to one of the inputs of the adder through a first filter, the output of the sampling/quantization circuit being coupled to one of the inputs of the adder through a second filter,
    wherein the overall responses of the first filter and the second filter include a lowpass component, and
    wherein the continuous-time quantization-noise-shaping circuit has a noise transfer function with a minimum at a particular frequency.

2. An apparatus according to claim 1, wherein the continuous-time quantization-noise-shaping circuit has a noise transfer function that shapes quantization noise with an equivalent of a second-order response.

3. An apparatus according to claim 1, wherein the continuous-time quantization-noise-shaping circuit has a noise transfer function that shapes quantization noise with an equivalent of a fourth-order response.

4. An apparatus according to claim 1, wherein the sampling/quantization circuit is a single-bit quantizer.

5. An apparatus according to claim 1, wherein the sampling/quantization circuit is a multi-bit quantizer.

6. An apparatus according to claim 5, wherein the continuous-time quantization-noise-shaping circuit includes a nonlinear bit-mapping component that converts a binary-weighted, digital input to a higher-precision digital output having other than perfect binary weighting.

7. An apparatus according to claim 6, wherein the nonlinear bit-mapping component applies input-bit weighting factors to the digital input and at least one of the input-bit weighting factors applied by the nonlinear bit-mapping circuit is programmable.

8. An apparatus according to claim 7, wherein the input-bit weighting factors are independently adjusted to minimize at least one of a mean absolute value or a variance of a residual quantization noise of the continuous-time quantization-noise-shaping circuit.

9. An apparatus according to claim 1, further comprising an active calibration component that adjusts a parameter of at least one component of the continuous-time quantization-noise-shaping circuit.

10. An apparatus according to claim 9, wherein parameter adjustments are made to minimize at least one of a mean absolute value or a variance of a residual quantization noise of the continuous-time quantization-noise-shaping circuit.

11. An apparatus for converting a continuous-time, continuously variable signal into a sampled and quantized signal, comprising:
    an input line for accepting an input signal that is continuous in time and continuously variable;
    a plurality of processing branches coupled to the input line, each of said processing branches including: (a) a bandpass noise-shaping circuit, (b) a sampling/quantization circuit coupled to an output of the bandpass noise-shaping circuit, (c) a digital bandpass filter coupled to an output of the sampling/quantization circuit, and (d) a line coupling the output of the sampling/quantization circuit back into the bandpass noise-shaping circuit; and
    an adder coupled to outputs of the plurality of processing branches,
    wherein a center frequency of the digital bandpass filter in each said processing branch corresponds to a stopband region in a quantization noise transfer function for the bandpass noise-shaping circuit in the same processing branch, and
    wherein each of said digital bandpass filters includes: (a) a quadrature frequency downconverter that has in-phase and quadrature outputs, (b) a first moving-average filter coupled to the in-phase output of the quadrature frequency downconverter, (c) a second moving-average filter coupled to the quadrature output of the quadrature frequency downconverter, and (d) a quadrature frequency upconverter coupled to outputs of the first and second moving-average filters.

12. An apparatus according to claim 11, wherein at least one of the moving-average filters is implemented as a recursive structure.

13. An apparatus according to claim 12, wherein said at least one moving-average filter recursive structure incorporates a differentiator transfer function with a difference delay greater than one sample period.

14. An apparatus according to claim 11, wherein at least one of the moving-average filters is comprised of at least three cascaded moving-average components.

15. An apparatus according to claim 14, wherein a number of samples averaged by each of the cascaded moving-average components is independently programmable to vary a bandwidth of the corresponding digital bandpass filter.

16. An apparatus according to claim 11, wherein at least one of the digital bandpass filters is implemented as a polyphase decomposition structure.

17. An apparatus according to claim 16, wherein a polyphase decomposition factor, m, of the polyphase decomposition structure is a submultiple of the total number of processing branches, M.

18. An apparatus according to claim 11, wherein the moving-average filter is comprised of a number of cascaded moving-average filter stages, wherein each of the stages averages the same number of samples, and wherein the number of stages is greater than one and other than one plus an effective noise-shaping order of the bandpass noise-shaping circuit response.

19. An apparatus according to claim 18, wherein the moving-average filter is comprised of cascaded moving-average filter stages that collectively provide spectral minima at frequencies other than multiples of a conversion rate of said apparatus.

20. An apparatus according to claim 18, wherein the number of moving-average stages is zero, two, three, or four plus an effective noise-shaping order of a response of the bandpass noise-shaping circuit.

21. An apparatus according to claim 11, wherein the moving-average filter is comprised of cascaded moving-average filter stages, and wherein at least one of the stages averages a number of samples that is different by more than one from a number of samples averaged by at least one of the other stages.

22. An apparatus according to claim 21, wherein the number of samples averaged by one of the stages is different from at least one of the other stages by more than ¼·M·N and less than 2·M·N, where N is an excess-rate oversampling ratio of said apparatus and M is the number of processing branches.

23. An apparatus according to claim 11, wherein the moving-average filter is comprised of cascaded moving-average filter stages having an impulse response length that is at least 2·N·M−5, where N is an excess-rate oversampling ratio of said apparatus and M is the number of processing branches.

24. An apparatus according to claim 11, wherein the moving-average filter is comprised of cascaded moving-average filter stages having an impulse response length that is at least 4·N·M−5, where N is an excess-rate oversampling ratio of said apparatus and M is the number of processing branches.

25. An apparatus according to claim 11, wherein the digital bandpass filter further includes an equalizer.

26. An apparatus according to claim 25, wherein the equalizer has a single complex tap.

27. An apparatus according to claim 25, wherein the equalizer has a single real tap.

28. An apparatus according to claim 25, wherein the equalizer has plural complex taps.

29. An apparatus according to claim 25, wherein the equalizer has plural real taps.

30. An apparatus according to claim 11, wherein sine and cosine sequences are used by the quadrature frequency downconverter and the quadrature frequency upconverter for quadrature downconversion and upconversion, respectively, and are generated through direct digital synthesis using digital accumulators and sinusoid lookup.

31. An apparatus according to claim 11, wherein sine and cosine sequences are used by the quadrature frequency downconverter and the quadrature frequency upconverter for quadrature downconversion and upconversion, respectively, and are generated using recursive structures.

32. An apparatus according to claim 11, wherein sine and cosine sequences are used by the frequency downconverter and the frequency upconverter for quadrature downconversion and upconversion, respectively, and wherein at least one of an amplitude or phase of the sine and cosine sequences is adjustable.

33. An apparatus according to claim 11, wherein sine and cosine sequences are used by the frequency downconverter and the frequency upconverter for quadrature downconversion and upconversion, respectively, and wherein the period of the sine and cosine sequences is adjustable.

34. An apparatus according to claim 11, further comprising a configuration means for converting a first signal sample rate generated by the sampling/quantization circuit in at least one of the various processing branches to a second signal sample rate that is different than the first signal sample rate.

35. An apparatus according to claim 34, wherein the configuration means includes at least one digital interpolator.

36. An apparatus according to claim 35, wherein interpolation used by the at least one digital interpolator is at least second-order.

37. An apparatus according to claim 35, wherein interpolation used by the at least one digital interpolator is first-order.

38. An apparatus according to claim 35, wherein the at least one digital interpolator is implemented as a polyphase decomposition structure.

39. An apparatus according to claim 35, wherein an interpolant used by the at least one digital interpolator is generated using a numerically-controlled oscillator.

40. An apparatus according to claim 11, wherein a configuration means is provided to enable plural modes of operation, including: (i) a mode for operation as a single, wideband converter with high output data rate, and (ii) a mode for operation as plural, independent converters having an arbitrary mix of narrowband and wideband outputs at various sample rates.

41. An apparatus according to claim 40, wherein the configuration means comprises an add-multiplex array.

42. An apparatus according to claim 40, wherein the number of processing branches M is a power of two.

43. An apparatus according to claim 11, wherein the plurality of processing branches includes at least 4 said processing branches, and in each of a plurality of said processing branches: the bandpass noise-shaping circuit includes at least a second-order feedback filter, the sampling/quantization circuit samples at a frequency of at least 1 gigahertz (GHz), and the digital bandpass filter attenuates shaped quantization noise by at least 40 dB and introduces total aliasing distortion power limited to less than 40 dB below data converter signal level.

44. An apparatus according to claim 11, wherein each of a plurality of the processing branches includes at least one quadrature downconverter that decreases, by a factor of at least two, a center frequency of the frequency band selected for said processing branch.

45. An apparatus according to claim 44, wherein the digital bandpass filter includes at least one of a downconverter and an upconverter having at least one parameter that can be adjusted to compensate for at least one of amplitude or phase imbalance of the quadrature frequency downconverter.

* * * * *